US009098106B2

(12) United States Patent
Danielsson et al.

(10) Patent No.: US 9,098,106 B2
(45) Date of Patent: Aug. 4, 2015

(54) SYSTEMS AND METHODS FOR CREATING APPLICATION INTERFACES FOR FORMING AND SOLVING PROBLEMS IN A MODELING SYSTEM

(71) Applicant: Comsol AB, Stockholm (SE)

(72) Inventors: Erik Danielsson, Vaellingby (SE); Eduardo Fontes, Vallentuna (SE); Lars Langemyr, Stockholm (SE); Victor Littmarck, Solna (SE); Svante Littmarck, Dedham, MA (US); Nils Malm, Lidingö (SE); Björn Sjödin, Lexington, MA (US); Daniel Smith, Cambridge, MA (US); Tomas Normark, Bromma (SE)

(73) Assignee: Comsol AB, Stockholm (SE)

( * ) Notice: Subject to any disclaimer, the term of this patent is extended or adjusted under 35 U.S.C. 154(b) by 0 days.

(21) Appl. No.: 13/835,091

(22) Filed: Mar. 15, 2013

(65) Prior Publication Data
US 2014/0047407 A1 Feb. 13, 2014

Related U.S. Application Data

(60) Provisional application No. 61/681,613, filed on Aug. 10, 2012, provisional application No. 61/740,149, filed on Dec. 20, 2012.

(51) Int. Cl.
*G06F 9/44* (2006.01)
*G06F 17/50* (2006.01)
(52) U.S. Cl.
CPC .............. *G06F 8/00* (2013.01); *G06F 17/5018* (2013.01)
(58) Field of Classification Search
None
See application file for complete search history.

(56) References Cited

U.S. PATENT DOCUMENTS

| | | | | |
|---|---|---|---|---|
| 5,654,903 | A | * | 8/1997 | Reitman et al. ................. 702/81 |
| 6,108,670 | A | * | 8/2000 | Weida et al. ........................... 1/1 |
| 6,542,930 | B1 | * | 4/2003 | Auvenshine .................. 709/224 |
| 7,076,332 | B2 | * | 7/2006 | Cifra et al. .................... 700/245 |
| 7,519,518 | B2 | * | 4/2009 | Langemyr et al. ................ 703/2 |
| 7,596,474 | B2 | | 9/2009 | Langemyr et al. |

(Continued)

OTHER PUBLICATIONS

Fontes et al., U.S. Appl. No. 13/184,207, filed Jul. 15, 2011, entitled "System and Method for Accessing Settings in a Multiphysics Modeling System Using a Model Tree," 117 pages.

(Continued)

*Primary Examiner* — Chameli Das
(74) *Attorney, Agent, or Firm* — Nixon Peabody LLP

(57) ABSTRACT

An apparatus for generating an application data structure includes a physical computing system comprising processor(s), input device(s), display(s), and memor(ies). The memory includes executable instructions that cause a processor to perform the acts of embedding a multiphysics model data structure for a physical system in an application data structure. Application features are determined to add to the application data structure. First data is added representing a form feature for the application features for the model of the physical system. Second data is added representing at an action feature for the application features. The second data is associated with at least one modeling operation to define a sequence of operations for modeling the physical system. The application data structure is updated including the added first and second data and the associating defining the sequence of operations. The updated application data structure is stored on the memory device(s).

26 Claims, 43 Drawing Sheets

(56) References Cited

U.S. PATENT DOCUMENTS

| | | | |
|---|---|---|---|
| 7,623,991 | B1 | 11/2009 | Langemyr et al. |
| 8,219,373 | B2 | 7/2012 | Fontes et al. |
| 8,457,932 | B2 | 6/2013 | Langemyr et al. |
| 8,626,475 | B1 | 1/2014 | Fontes et al. |
| 8,954,302 | B2 | 2/2015 | Langemyr et al. |
| 2003/0105614 | A1* | 6/2003 | Langemyr et al. ........ 703/2 |
| 2003/0172368 | A1* | 9/2003 | Alumbaugh et al. ...... 717/106 |
| 2004/0034514 | A1* | 2/2004 | Langemyr et al. ........ 703/2 |
| 2004/0153992 | A1* | 8/2004 | Molina-Moreno et al. ... 717/105 |
| 2006/0075382 | A1* | 4/2006 | Shaburov ............ 717/106 |
| 2007/0219929 | A1* | 9/2007 | Steinbach ........... 705/80 |
| 2008/0313282 | A1* | 12/2008 | Warila et al. ........ 709/206 |
| 2009/0044003 | A1* | 2/2009 | Berthiaume et al. ..... 713/100 |
| 2011/0107246 | A1* | 5/2011 | Vik ................ 715/771 |
| 2012/0036503 | A1* | 2/2012 | Reeves ............. 717/168 |
| 2012/0179426 | A1 | 7/2012 | Fontes et al. ......... 703/1 |
| 2013/0007698 | A1* | 1/2013 | Warila et al. ......... 717/106 |
| 2013/0066823 | A1* | 3/2013 | Sweeney et al. ....... 706/50 |

OTHER PUBLICATIONS

Fontes et al., U.S. Appl. No. 13/184,293, filed Jul. 15, 2011, entitled "System and Method for Accessing a Multiphysics Modeling System Via a Design System User Interface," 115 pages.

International Search Report for International Application No. PCT/US2013/054436 dated Jan. 31, 2014, 3 pages.

Written Opinion for International Application No. PCT/US2013/054436 dated Jan. 31, 2014, 7 pages.

Fontes et al., U.S. Appl. No. 13/599,619, filed Aug. 30, 2012, entitled "System and Method for Creating User Interfaces in a Multiphysics Modeling System," claiming priority to U.S. Appl. No. 61/529,645, filed Aug. 31, 2011, 98 pages.

* cited by examiner

Fig 31

⊿ 🄰 actuator.mphapp *(root)*
▷ 🌐 Global Definitions
▷ 🔲 Thermal Actuator *(mod 1)*
▷ 🔬 Study 1                      3121
▷ 📘 Results                      ⟋
⊿ ⚙ Application Feature 1 *(Simulation)*
§ Developer Comments
▷ ▭ Section panel 1 *(/ApplicationNo*
▷ ▭ Section panel 2 *(/ApplicationNo*
▷ ▶ Action 1 *(Geometry)*
▷ ▶ Action 2 *(Run)*
⟍▷ [MENU] Menu item 1 *(item1)*
⟋ ▷ [MENU] Menu item 2 *(item2)*
3122

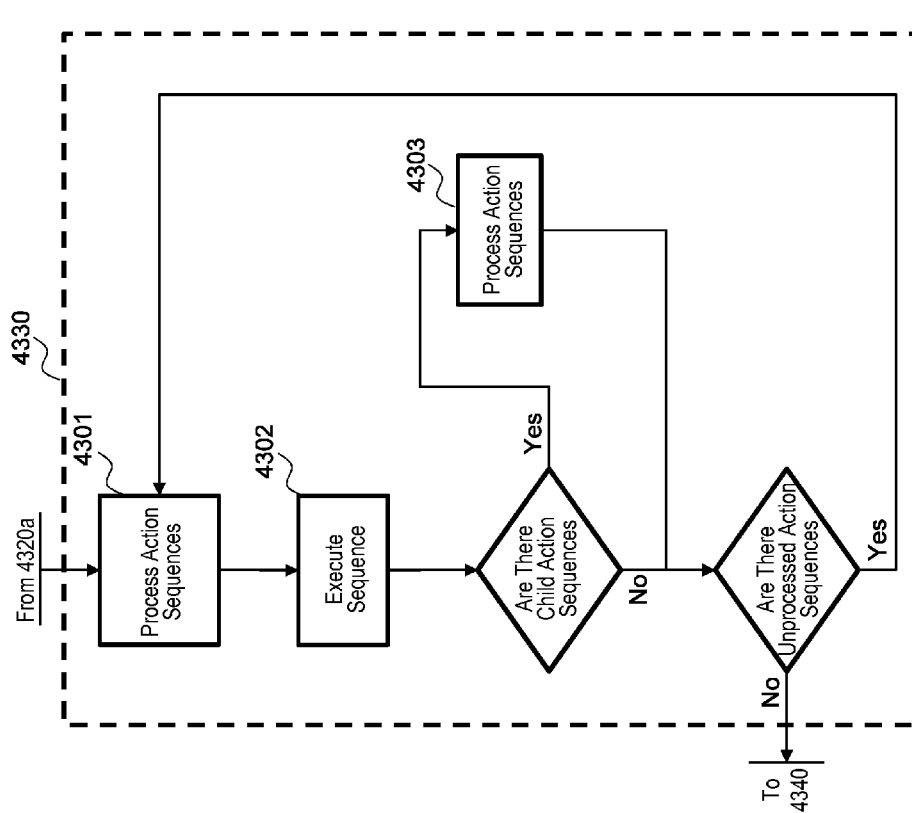
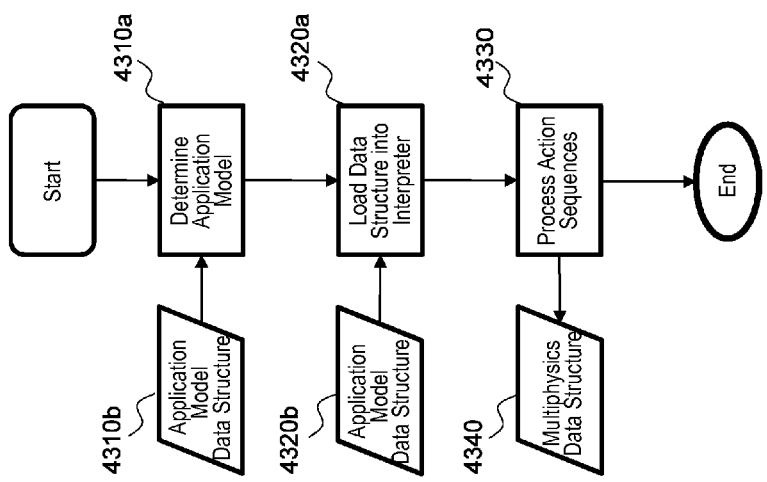
Fig 43

SYSTEMS AND METHODS FOR CREATING APPLICATION INTERFACES FOR FORMING AND SOLVING PROBLEMS IN A MODELING SYSTEM

CROSS-REFERENCE TO RELATED APPLICATIONS

This application claims priority to and the benefits of U.S. Provisional Application No. 61/681,613, filed on Aug. 10, 2012, and U.S. Provisional Application No. 61/740,149, filed Dec. 20, 2012, the disclosures of which are each hereby incorporated by reference herein in their entireties.

FIELD OF THE INVENTION

The present invention relates generally to systems and methods for modeling and simulation, and more particularly, to creating application interfaces for forming and solving problems in a modeling system.

BACKGROUND

Computer design systems are used to develop product designs and may include graphical user interfaces. Computer design systems can be complemented with packages analyzing a single aspect of a design, such as, structural analysis in conjunction with computer-aided design systems. It would be desirable to have design systems that can operate in more complex environments.

SUMMARY OF THE INVENTION

According to one aspect of the present disclosure, an apparatus for generating an application data structure includes a physical computing system comprising one or more processors, one or more user input devices, a display device, and one or more memory devices. At least one of the one or more memory devices includes executable instructions for generating an application data structure. The executable instructions cause at least one of the one or more processors to perform, upon execution, the acts of embedding a multiphysics model data structure for a physical system in an application data structure. The embedded multiphysics model data structure includes at least one modeling operation for the physical system. One or more application features are determined, via at least one of said one or more processors, to add to the application data structure. The one or more application features are associated with a model of the physical system. First data is added, via at least one of the one or more input devices, representing at least one form feature for at least one of the one or more application features for the model of the physical system. Second data is added, via at least one of the one or more input devices, representing at least one action feature for at least one of the one or more application features for the model of the physical system. The second data representing the at least one action feature is associated with the least one modeling operation for the physical system to define a sequence of operations for modeling the physical system. The application data structure is updated. The updated application data structure includes the added first data, the added second data, and the associating defining the sequence of operations. The updated application data structure is stored on at least one of the one or more memory devices.

According to another aspect of the present disclosure, a method executed in a computer system with one or more physical computing devices is configured to generate a modified application data structure to model a physical system. The method comprises the acts of embedding, via one or more physical computing devices, a multiphysics model data structure in an application data structure stored in one or more memory devices. The embedded multiphysics model data structure includes at least one multiphysics modeling operation for the physical system being modeled. One or more application features are determined, via at least one of the one or more physical computing devices, to add to the application data structure. The one or more application features are associated with the physical system. Application data is acquired, via at least one of the one or more physical computing devices, representing the one or more determined application features. The application data include form data representing at least one form feature and action data representing at least one action feature for modeling the physical system. A modified application data structure is formed including the acquired application data. The modified application data structure is stored on at least one of the one or more memory devices. The action data representing the at least one action feature is associated with the least one modeling operation for the physical system defined in the embedded multiphysics model data structure. The association between the action data and the at least one modeling operation defines a sequence of operations for modeling said physical system.

According to yet another aspect of the present disclosure, a system generates a modified application data structure. The system comprises one or more physical memory devices, one or more display devices, one or more user input devices, and one or more processors configured to execute instructions stored on at least one of the one or more physical memory devices. The instructions cause at least one of the one or more processors to perform the acts comprising embedding, via one or more physical computing devices, a multiphysics model data structure in an application data structure stored in one or more memory devices. The embedded multiphysics model data structure includes at least one multiphysics modeling operation for the physical system being modeled. One or more application features are determined, via at least one of the one or more physical computing devices, to add to the application data structure. The one or more application features are associated with the physical system. Application data representing the one or more determined application features is acquired, via at least one of the one or more physical computing devices. The application data includes form data representing at least one form feature and action data representing at least one action feature for modeling the physical system. A modified application data structure is formed including the acquired application data. The modified application data structure is stored on at least one of the one or more memory devices. The action data representing the at least one action feature is associated with the least one modeling operation for the physical system defined in the embedded multiphysics model data structure. The association between the action data and the at least one modeling operation defines a sequence of operations for modeling the physical system.

According to another aspect of the present disclosure, a method executed in a computer system includes one or more processors configured to generate an application model data structure to model a physical system. The method comprises the acts of determining, via one or more processors, a plurality of applications for modeling one or more physical systems. The plurality of applications are defined by application data stored in one or more application data structures. A list of the plurality of applications is displayed in one or more graphical user interfaces. A first input indicative of a selection of at least one of the plurality of applications is received. One or more application features are determined, via at least one of the one or more processors, for the selection of at least one of the plurality of applications. The one or more application features are represented as application data defined in and retrieved from at least one of the one or more application data structures. The determined application feature are displayed in at least one of the one or more graphical user interfaces. A second input indicative of a selection of at least one of the application features is received. One or more settings for the selection of at least one of the application features is determined via at least one of the one or more processors. The one or more settings are associated with parameters for the modeling of the one or more physical systems. Edit fields including at least one of the one or more settings are displayed via at least one of the one or more graphical user interfaces. At least one of the edit fields is selected. Edits to said one or more setting included in the selected at least one edit field are receiving via one or more user input devices. An application model data structure is generated, via at least one of said one or more processors, that includes the received edits to the at least one or more settings to the at least one or more application features retrieved from the one or more application data structures.

According to further aspects of the present disclosure, one or more non-transitory computer readable media are encoded with instructions, which when executed by one or more processors associated with a design system, a simulation system, or a modeling system, causes at least one of the one or more processors to perform the above methods.

Additional aspects of the present disclosure will be apparent to those of ordinary skill in the art in view of the detailed description of various embodiments, which is made with reference to the drawings, a brief description of which is provided below.

BRIEF DESCRIPTION OF THE DRAWINGS

Features and advantages of the present disclosure will become more apparent from the following detailed description of exemplary embodiments thereof taken in conjunction with the accompanying drawings in which:

FIG. 31 illustrates an exemplary aspect of an application tree for adding a menu input form to an application data structure.

FIG. 43 illustrates an exemplary flowchart of method steps for interpreting an application model data structure.

Figure 1:
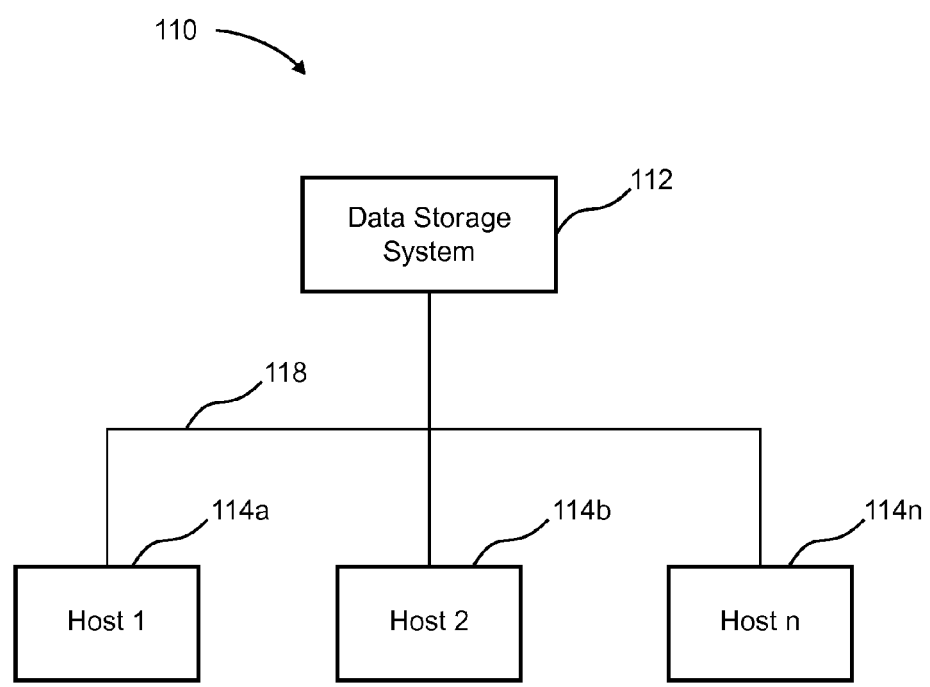
FIG. 1 illustrates an exemplary aspect of a computer system.

While the present disclosure is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

While this invention is susceptible of embodiment in many different forms, there is shown in the drawings and will herein be described in detail preferred aspects of the invention with the understanding that the present disclosure is to be considered as an exemplification of the principles of the invention and is not intended to limit the broad aspect of the invention to the aspects illustrated. For purposes of the present detailed description, the singular includes the plural and vice versa (unless specifically disclaimed); the words "and" and "or" shall be both conjunctive and disjunctive; the word "all" means "any and all"; the word "any" means "any and all"; and the word "including" means "including without limitation."

Exemplary methods and systems for creating or forming an application data structure is described. It is contemplated that the method may be executed as part of an application interface builder module that may be a standalone system that interfaces or connects with an engineering analysis system, such as a multiphysics modeling system. It is also contemplated that the application interface builder module may be a one of a plurality of modules or routines that comprise an engineering analysis system. The application interface builder module can include or be connected with a user interface, such as a graphical user interface, that seeks inputs and displays instructions to a user of the application interface builder. The application interface builder module for creating an application data structure is executed on one or more processors associated with various computer systems described elsewhere herein including, among other things, the computer systems and apparatus described for the multiphysics modeling system.

It is contemplated to be desirable for the application interface to be available in, or accessible to, an engineering analysis system, such as a multiphysics modeling system, to generate a model described in a model object (e.g., a model data structure including data fields and methods along with their interactions) in accordance with an object-orient programming language (e.g., C++, C#, Java®).

In some aspects, an application interface for creating or forming an application data structure may be represented as a branch containing nodes describing a multiphysics model's setting, such as describes elsewhere herein for aspects of multiphysics modeling systems using model tree features. The branch and nodes may be included in a graphical user interface and the described settings may include, among other things, domain settings and boundary conditions.

It is further contemplated that an application interface builder may allow a user to name the application interface. For example, the name of an application interface may be descriptive of the application it defines and it may also be displayed in the user interface (e.g., the model tree) in the engineering analysis system, such as a system implementing multiphysics simulations. The name may be changed by a user of the system or by the multiphysics system itself in the situation where several application interfaces of the same type are added to or available to a multiphysics model.

Systems for computer aided engineering, such as finite elements analysis systems, finite volume systems, computational fluid dynamics (CFD) systems, and multiphysics modeling systems are often equipped with a graphical user interface where a user may set up and run a simulation. Such processes or systems may contain a number of different user interfaces for different types of simulations, such as CFD, heat transfer, electromagnetics, or structural mechanics simulations.

Methods for setting up and solving multiphysics problems and other modeling systems are described herein, for example, in FIGS. 3-15, and are also described in U.S. Pat. No. 8,219,373, issued Jul. 10, 2012; U.S. Pat. No. 7,623,991, issued Nov. 24, 2009; U.S. Pat. No. 7,519,518, issued Apr. 14, 2009; U.S. Pat. No. 7,596,474, issued Sep. 29, 2009; and U.S. Patent Application Publication No. 2012/0179426, published Jul. 12, 2012. Ser. No. 13/184,207, filed Jul. 15, 2011, each of which are hereby incorporated by reference herein in their entireties. These published patent documents describe, for example, method for setting up and executing multiphysics simulations, including several coupled physical phenomena, by receiving inputs in the form of physical properties that may be expressed in terms of physical quantities. In addition, the above-referenced U.S. patents and patent application disclose methods for setting up problems using physical properties, physical quantities, and physical phenomena described using partial differential equations (PDEs). These published patent documents provide for methods and systems for setting up and solve multiphysics problems using predefined application modes that are referred to herein as physics interfaces. Components of the physics interfaces can include parameters, variables, physical properties, physical quantities, boundary and initial conditions, and solvers with settings and menus. These settings and menus may be tailored for the specific physics instead of using the generic mathematical settings. In addition, these published patent disclosures also describe methods for PDE modes, also referred to as PDE interfaces, in the cases where predefined physics interfaces are not available. The use of the generic PDE modes and PDE interfaces for setting up multiphysics problems requires knowledge about the description of physical properties, physical quantities, and physical phenomena in terms of PDEs.

It is contemplated that systems and methods operable to or adapted to generate an application data structure, based on a multiphysics model, would be desirable and provide various computational advantages for engineering design systems, including modeling and simulation systems. The methods and systems for generating the application data structure can be implemented on dedicated graphical user interface(s) in an application builder module configured or adapted for accessing features and feature settings for the multiphysics model. Such a graphical user interface can also give access to methods for generating a data structure representing an application using the existing settings for the multiphysics model. The application data structure can further be interpreted via another system or method that makes the application data structure accessible from the graphical user interface in a multiphysics modeling system for generating an application model data structure and a multiphysics model data structure to allowing the execution of simulations.

Throughout this disclosure, various non-limiting exemplary aspects of systems are described herein that include methods, executed on processing unit(s), which are accessible via a graphical user interface. The methods include instructions for generating application data structures, application model data structures, and other type of data structures for modeling physical systems. It is contemplated that the generated data structures can be applied or associated with an engineering analysis system (e.g., multiphysics modeling system), where the data structure(s) may be built and applied by a system user.

In the exemplary aspect of a multiphysics modeling system, a first interpreter module can be provided that receives inputs in the form of physical properties in term of physical quantities, and then, generates a model object. A model object may include the algorithms and data structures for the model and may be further used to represent the model. The model object can further include methods for setting up and executing sequences of operations to create geometry, meshes, and solutions for the model.

Physical computing devices embodying engineering analysis systems may be configured with one or more graphical user interfaces that allow a system user to input and execute simulations and build application data structures. The computer systems may include some of the non-limiting exemplary routines or methods described above and can further include different interfaces for different types of simulations. Different user interfaces may, for example, be provided for fluid flow, heat transfer, electromagnetic, and/or structural mechanics simulations. Simulations and associated interfaces for other engineering or physics phenomena are also contemplated for computer-aided engineering analysis systems.

A system having a dedicated graphical user interface for generating or building an application data structure and an application model data structure are contemplated in some aspects of the present disclosure. For example, a computer system may include a graphical user interface for defining the parameters, forms, features, actions, variables, physical properties, physical quantities, and/or physics interface features for a desired physics phenomena associated with a desired analysis or simulation. The graphical user interface can allow access to routines or methods that then generate the application data structure. The generated data structure may then be interpreted or processed by a routine or method configured to create the application model data structure and to make the application interface accessible from other graphical user interface(s) associated with, for example, an engineering analysis system such as a multiphysics modeling system. It is contemplated that the routines or methods for these operations can be executed locally on, and/or remotely through network connection(s) to, one or more processing unit(s) executing the engineering analysis systems.

Computer systems may be used for performing the different tasks described in the present disclosure. One aspect for using a computer system includes executing one or more computer programs, including engineering analysis systems and methods, stored on computer readable media (e.g., temporary or fixed memory, magnetic storage, optical storage, electronic storage, flash memory, other storage media). A computer program may include instructions which, when executed by a processor, perform one or more tasks. In certain embodiments, a computer system executes machine instructions, as may be generated, for example, in connection with translation of source code to machine executable code, to perform modeling and simulation, and/or problem solving tasks. One technique, which may be used to model and simulate physical phenomena or physical processes, is to represent various physical properties and quantities, of the physical phenomena or physical processes being modeled and simulated, in terms of variables and equations or in other quantifiable forms that may be processed by a computer system. In turn, these equations or other quantifiable forms may be solved by a computer system configured to solve for one or more variables associated with the equation, or the computer may be configured to solve a problem using other received input parameters.

It is contemplated that computer programs for modeling and simulating physical phenomena or physical processes may provide many advantages particularly as the complexity of the physical phenomena or physical processes being modeled and simulated increases. For example, in certain embodiments a user can combine one or more physical phenomena into a multiphysics model, as part of, for example, an engineering analysis. To further illustrate this example, a user may combine phenomena described by chemical kinetics and fluid mechanics, electromagnetic phenomena and heat transfer, structural mechanics and fluid flow, or other physics phenomena. Such multiphysics models may also involve multiple physical processes. For example, a process may be combined that includes an amplifier powering an actuator, where both the amplifier and the actuator are a part of one multiphysics model. Multiphysics modeling can also include solving coupled systems of partial differential equations (PDEs).

It is contemplated that computer systems on which modeling systems operate, such as the modeling systems described herein, can include networked computers or processors. In certain embodiments, processors may be operating directly on the modeling system user's computer, and in other embodiments, a processor may be operating remotely. For example, a user may provide various input parameters at one computer or terminal located at a certain location. Those parameters may be processed locally on the one computer or they may be transferred over a local area network or a wide area network, to another processor, located elsewhere on the network that is configured to process the input parameters. The second processor may be associated with a server connected to the Internet (or other network) or the second processor can be several processors connected to the Internet (or other network), each handling select function(s) for developing and solving a problem on the modeling system. It is further contemplated that the results of the processing by the one or more processors can then be assembled at yet another server or processor. It is also contemplated that the results may be assembled back at the terminal or computer where the user is situated. The terminal or computer where the user is situated can then display the solution of the multiphysics modeling system to the user via a display (e.g., a transient display) or in hard copy form (e.g., via a printer). Alternatively or in addition, the solution may be stored in a memory associated with the terminal or computer, or the solution may be stored on another server that the user may access to obtain the solution from the modeling system.

It is contemplated that in certain embodiments a product or process may be in the development or feasibility stage where it is being designed or analyzed. The product or process being developed or analyzed may need to be assessed for use in complex environment(s) involving several physical properties and quantities. It can be desirable to solve complex multiphysics problems by systematically varying parametric and geometric features in a computer-based design system. Other desirable features may include, for example, having a computer-based system for solving complex multiphysics problems in which the settings for the physical properties and boundary conditions, located in a memory and used to form multiphysics models and/or solve multiphysics problems, can be accessed directly from the design system.

Referring now to FIG. 1, an exemplary aspect of a computer system is illustrated that may be used with the methods described elsewhere herein including modeling systems and systems for generating application data structures. The computer system 110 includes a data storage system 112 connected to host systems 114a-114n through communication medium 118. In this embodiment of the computer system 110, the "n" hosts 114a-114n may access the data storage system 112, for example, in performing input/output (I/O) operations. The communication medium 118 may be any one of a variety of networks or other type of communication connections as known in the modeling and computer simulation field. For example, the communication medium 118 may be the Internet, an intranet, or other network connection by which the host systems 114a-114n may access and communicate with the data storage system 112, and may also communicate with others included in the computer system 110, including without limitation systems based on various forms of network communications (e.g., fiber optic, wireless, Ethernet).

Each of the host systems 114a-114n and the data storage system 112 included in the computer system 110 may be connected to the communication medium 118 by any one of a variety of connections as may be provided and supported in accordance with the type of communication medium 118. The processors included in the host computer systems 114a-114n or a data manager system may be any one of a variety of commercially available single or multi-processor system, such as an Intel-based processor, IBM mainframe, server, or other type of commercially available processor able to support incoming traffic in accordance with each particular embodiment and application.

It should be noted that the particulars of the hardware and systems included in each of the host systems 114a-114n, as well as those components that may be included in the data storage system 112 are described herein in more detail, and may vary with each particular embodiment. Each of the host computers 114a-114n, as well as the data storage system 112, may all be located at the same physical site, or, alternatively, may also be located in different physical locations. Examples of the communication medium that may be used to provide the different types of connections between the host computer systems, the data manager system, and the data storage system of the computer system 110 may use a variety of different communication protocols such as SCSI, ESCON, Fiber Channel, or functional equivalents that are known to those skilled in the computer modeling and simulation field. Some or all of the connections by which the hosts and data storage system 112 may be connected to the communication medium 118 may pass through other communication devices, such as a Connectrix or other switching equipment that may exist, both physical and virtual, such as a phone line, a repeater, a multiplexer or even a satellite.

Each of the host computer systems may perform different types of data operations, such as storing and retrieving data files used in connection with an application executing on one or more of the host computer systems. For example, a computer program may be executing on the host computer 114a and store and retrieve data from the data storage system 112. The data storage system 112 may include any number of a variety of different data storage devices, such as disks, tapes, and the like in accordance with each implementation. As will be described in following paragraphs, methods may reside and be executing on any one of the host computer systems 114a-114n. Data may be stored locally on the host system executing the methods, as well as remotely in the data storage system 112 or on another host computer system. Similarly, depending on the configuration of each computer system 110, method as described herein may be stored and executed on one of the host computer systems and accessed remotely by a user on another computer system using local data. A variety of different system configurations and variations are possible then as will be described in connection with the embodiment of the computer system 110 of FIG. 1 and should not be construed as a limitation of the techniques described elsewhere herein.

Figure 2:
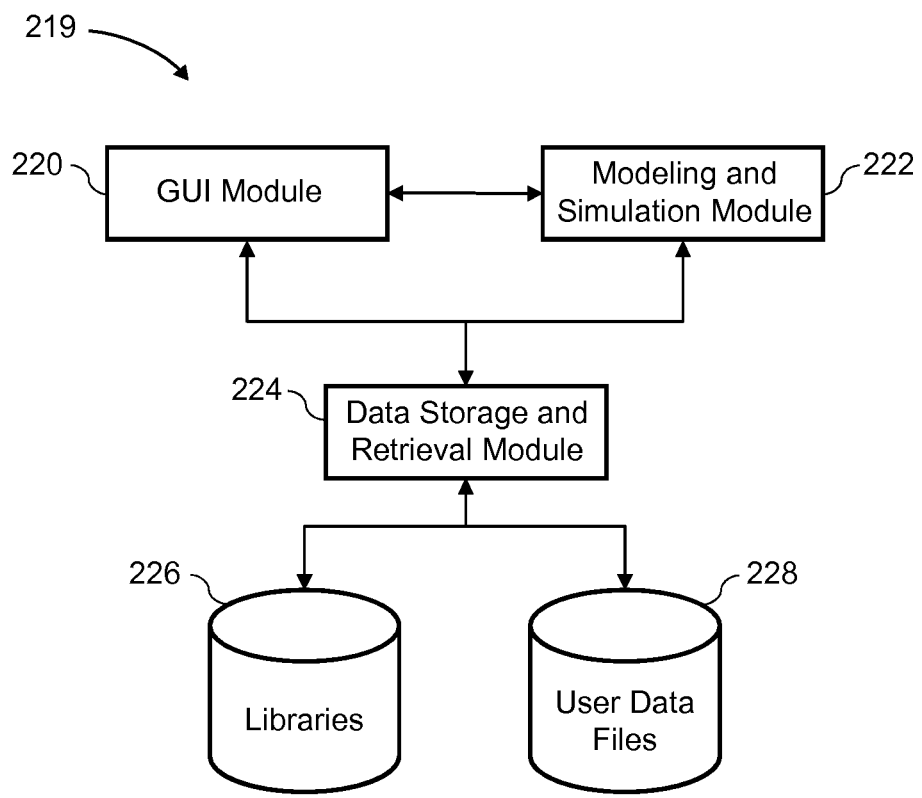
FIG. 2 illustrates an exemplary aspect of systems that may reside and be executed in one of the hosts of FIG. 1.

Referring now to FIG. 2, an exemplary aspect of a modeling system 219 is illustrated that may reside, for example, on a single computer or in one of a plurality of host computer systems (e.g., host computers 114a-114n). The modeling system may be divided into several components. One exemplary aspect of the system may include a GUI module 220, a Modeling and Simulation module 222, and a Data Storage and Retrieval module 224. The GUI module 220 can provide for interactions with system users. The Modeling and Simulation module 222 can provide an ability to manage and perform a multiphysics simulation. The Data Storage and Retrieval module 224 can provide an ability to load and save the model in a file, and to load and store other types of files which may be used during the simulation or may be used as input or output to the simulation.

The GUI module 220 may communicate with the Modeling and Simulation module 222 by sending and receiving commands. The act of sending and receiving commands may be performed through an application programming interface ("API") or other similar components. In one aspect of the system, the API may be object oriented and mix data and function calls within the same structure. In another aspect of the system, the API may use a data structure that is separate from function calls.

It is contemplated that in certain aspects of the present disclosure components of the multiphysics modeling system may reside on different host computer systems. For example, the GUI module 220 may reside on a personal computer host and the Modeling and Simulation module 222 may reside on a server computer host. It is further contemplated that the Data Storage and Retrieval module 224 may reside on either the personal computer host or the server computer host, or yet another separate computer host. If the computer hosts are not identical, the API can be configured to use a computer network to communicate between hosts. In one embodiment, an object oriented API may be configured to send data and method calls over the computer network or in another embodiment send data and function calls between the components over a computer network. The API may also be able to handle a Data Storage and Retrieval module 224 which may be located either on the host of the GUI module 220 or the Modeling and Simulation module 222, or on a separate host. In each of those cases, the Data Storage and Retrieval module 224 may be configured to load and store files on each of those hosts.

It is contemplated that in certain aspects, the system 219 may include, or be configured with, operating systems such as Windows 8, Mac OS, iOS, Android, Chrome OS, and the like, or system components other than what is described and represented in the modeling system 219 illustrated in FIG. 2. In the exemplary aspect illustrated in FIG. 2, Libraries 226 and the User Data Files 228 can be stored locally within the host computer system. It is further contemplated that in certain aspects, the Libraries 226 and/or User Data Files 228, as well as copies of these, may be stored in another host computer system and/or in the Data Storage System 112 of the computer system 110. However, for simplicity and explanation in paragraphs that follow, it may be assumed in a non-limiting manner that the system 219 may reside on a single host computer system such as 114a with additional backups, for example, of the User Data Files and Libraries, in the Data Storage System 112.

In certain aspects of the present disclosure, portions of the modeling system 219, such as the GUI module 220, the Modeling and Simulation module 222, the Data Storage and Retrieval module 224, and/or the Libraries 226 may be included or executed in combination with commercially available system package(s). These components may operate on one of the host systems 114a-114n, and may include one or more operating systems, such as, Windows XP®, Windows 7, Windows 8, Windows HPC Server 2008 R2, Unix®, Linux®, Mac OS®, iOS, Chrome® OS, Android®, and the like. It is further contemplated that the modules of the modeling system 219 may written in any one of a variety of computer programming languages, such as, C, C++, C#, Java®, or any combination(s) thereof, or other commercially available programming languages.

It is contemplated that the GUI module 220 may display GUI windows in connection with obtaining data for use in performing modeling, simulation, and/or other problem solving for one or more processes and/or physics phenomena under consideration by a system user. The one or more processes and/or phenomena may be assembled and solved by the Modeling and Simulation module 222. That is, user data may be gathered or received by the system using modules, such as the GUI module 220, and subsequently used by the Modeling and Simulation module 222. Thereafter, the data may be transferred or forwarded to the Data Storage and Retrieval module 224 where the user-entered data may be stored in a separate data structure (e.g., User Data Files 228). It is contemplated that other data and information may also be stored and retrieved from a separate data structure, such as Libraries 226, which may be used by the Modeling and Simulation module 222 or in connection with the GUI module 220.

The various data files that may be associated with a modeling system, such as User Data Files 228 and the Libraries 226, may be stored in any one of a variety of data file formats in connection with a file system used in the host computer system or in the Data Storage System 112. In certain aspects, the system 219 may use any one of a variety of database packages in connection with the storage and retrieval of data. The User Data files 228 may also be used in connection with other simulation and modeling systems. For example, the User Data files 228 may be stored in a format that may also be used directly or indirectly as an input to any one of a variety of other modeling systems. In certain aspects, data may be imported and/or exported between the multiphysics modeling system and another system. The format of the data may be varied or customized in accordance with each of the system(s) as well as in accordance with additional functionalities that each of the system(s) may include.

It is contemplated that the systems and methods described herein may be used for combining physics interfaces that model different physical phenomena or processes. The combination of a plurality of physics interfaces can be referred to as a multiphysics model. Properties of the physics interfaces can be represented by PDEs that may be automatically combined to form PDEs describing physical quantities in a coupled system or representation. The coupled PDEs may be displayed, for example, in an "Equation view" that allows for the coupled PDEs to be modified and used as input into a solver. It is also contemplated that the PDEs may be provided to the solver either independently as one PDE or a system of PDEs, describing a single phenomenon or process, or as one or several systems of PDEs describing several phenomena or processes.

In certain aspects of the present disclosure, a multiphysics modeling system can provide an ability to combine physics interfaces that model physical properties through one or more GUIs that allow a user to select one or more physics interfaces from a list. In addition to displaying physics interfaces names, it is further contemplated that variable names for physical quantities may be selected through a GUI. It is contemplated that the physics interfaces may have different formulations that depend on a "Study" settings feature, which is described in more detail elsewhere herein.

It is further contemplated that it may be desirable for a multiphysics modeling system to provide the ability to access predefined combinations of several physics phenomena for defining multiphysics model(s). The predefined combinations may be referred to as multiphysics interfaces, which similar to the physics interfaces, may also have different formulations that depend on a study settings feature.

It is contemplated that in certain aspects of the present disclosure physical properties can be used to model physical quantities for component(s) and/or process(es) being examined using the modeling system, and the physical properties can be defined using a GUI that allow the physical properties to be described as numerical values. In certain aspects, physical properties can also be defined as mathematical expressions that include one or more numerical values, space coordinates, time coordinates, and/or the actual physical quantities. In certain aspects, the physical properties may apply to some parts of a geometrical domain, and the physical quantity itself may be undefined in the other parts of the geometrical domain. A geometrical domain or "domain" may be partitioned into disjoint subdomains. The mathematical union of these subdomains forms the geometrical domain or "domain". The complete boundary of a domain may also be divided into sections referred to as "boundaries". Adjacent subdomains may have common boundaries referred to as "borders". The complete boundary is the mathematical union of all the boundaries including, for example, subdomain borders. For example, in certain aspects, a geometrical domain may be one-dimensional, two-dimensional, or three-dimensional in a GUI. However, as described in more detail elsewhere herein, the solvers may be able to handle any space dimension. It is contemplated that through the use of GUIs in one implementation, physical properties on a boundary of a domain may be specified and used to derive the boundary conditions of the PDEs.

Additional features of a modeling system, such as feature that may be found in the Modeling and Simulation module 222, may provide for automatically deriving a system of PDE's and boundary conditions for a multiphysics model. This technique can include merging the PDEs of the plurality of phenomena or processes, and may produce a single system of coupled PDEs, also using coupling variables or operators to couple processes in different coordinate systems, and may perform symbolic differentiation of the system of PDEs with respect to all the dependent variables for later use by the solver.

It is contemplated that in certain aspects, a coupled system of PDEs may be modified before being differentiated and sent to the solver. The modification may be performed using a settings window included in a GUI displaying the combined PDEs in an "Equation view". When the system of PDEs is modified in this way, the settings for the corresponding physical properties can become "locked". The properties may subsequently be unlocked by a user taking certain action(s).

It is contemplated that certain aspects of the present disclosure may include features for modeling one or more of a plurality of engineering and scientific disciplines, including, for example, acoustics, chemical reactions, diffusion, electromagnetism, fluid mechanics, geophysics, heat transfer, optics, plasma physics, quantum mechanics, semiconductor physics, structural mechanics, wave propagation, and the like. Certain aspects of a modeling system may involve more than one of the foregoing disciplines and can also include representing or modeling a combination of the foregoing disciplines. Furthermore, the techniques that are described herein may be used in connection with one or more systems of PDEs.

It is contemplated that in certain aspects of the present disclosure, system(s) of PDEs may be represented in general, coefficient, and/or weak form. The coefficient form may be more suitable in connection with linear or almost linear problems, while the general and weak forms may be better suited for use in connection with non-linear problems. The system(s) being modeled may have one or more associated studies, for example, such as stationary, time dependent, eigenvalue, or eigenfrequency. In the aspects described herein, a finite element method (FEM) may be used to solve for the PDEs together with, for example, adaptive meshing, adaptive time stepping, and/or a choice of a one or more different numerical solvers.

It is contemplated that in certain aspects of the present disclosure, a finite element mesh may include simplices forming a representation of a geometrical domain. Each simplex can belong to a unique subdomain, and a union of the simplices can form an approximation of the geometrical domain. The boundary of the domain may also be represented by simplices of the dimensions 0, 1, and 2, for geometrical dimensions 1, 2, and 3, respectively.

It is further contemplated that a mesh representing a geometry may also be created by an outside or external application and may subsequently be imported for use into the modeling system(s) described in the present disclosure.

The initial value of the solution process may be given as numerical values, or expressions that may include numerical values, space coordinates, time coordinates and the actual physical quantities. The initial value(s) may also include physical quantities previously determined.

The solution of the PDEs may be determined for any subset of the physical properties and their related quantities. Further, any subset not solved for may be treated as initial values to the system of PDEs.

It is contemplated that it may be desirable for a user to select a space dimension, combinations of physics, and a type of study in a multiphysics modeling system using a model wizard. The model wizard may take the user through these selection steps and it may also allow for the combination of several space dimensions, several physics, and several studies or study steps in a multiphysics model.

Figure 3:
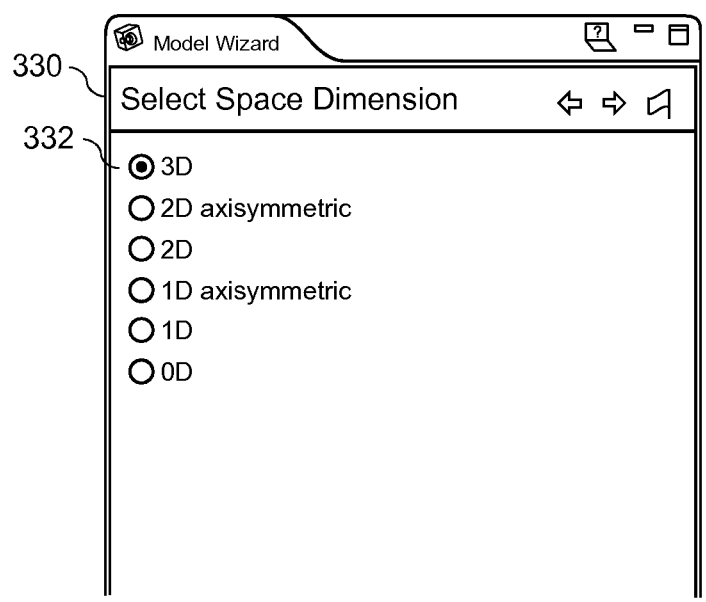
FIG. 3 illustrates an exemplary aspect of a graphical user interface for specifying space dimensions.

Referring now to FIG. 3, an exemplary aspect of a user interface or GUI 330 is illustrated that may be used to specify a space dimension 332 of a multiphysics model. The model may be specified in coordinate systems of the space dimensions including 0 dimensional (space independent, only time dependent), 1-dimensional, 1-dimensional axisymmetric, 2-dimensional, 2-dimensional axisymmetric, and 3-dimensional. It is further contemplated that a user may also combine models involving several of the above mentioned coordinate systems in order to describe phenomena or processes comprising multiple parts or scales.

Figure 4:
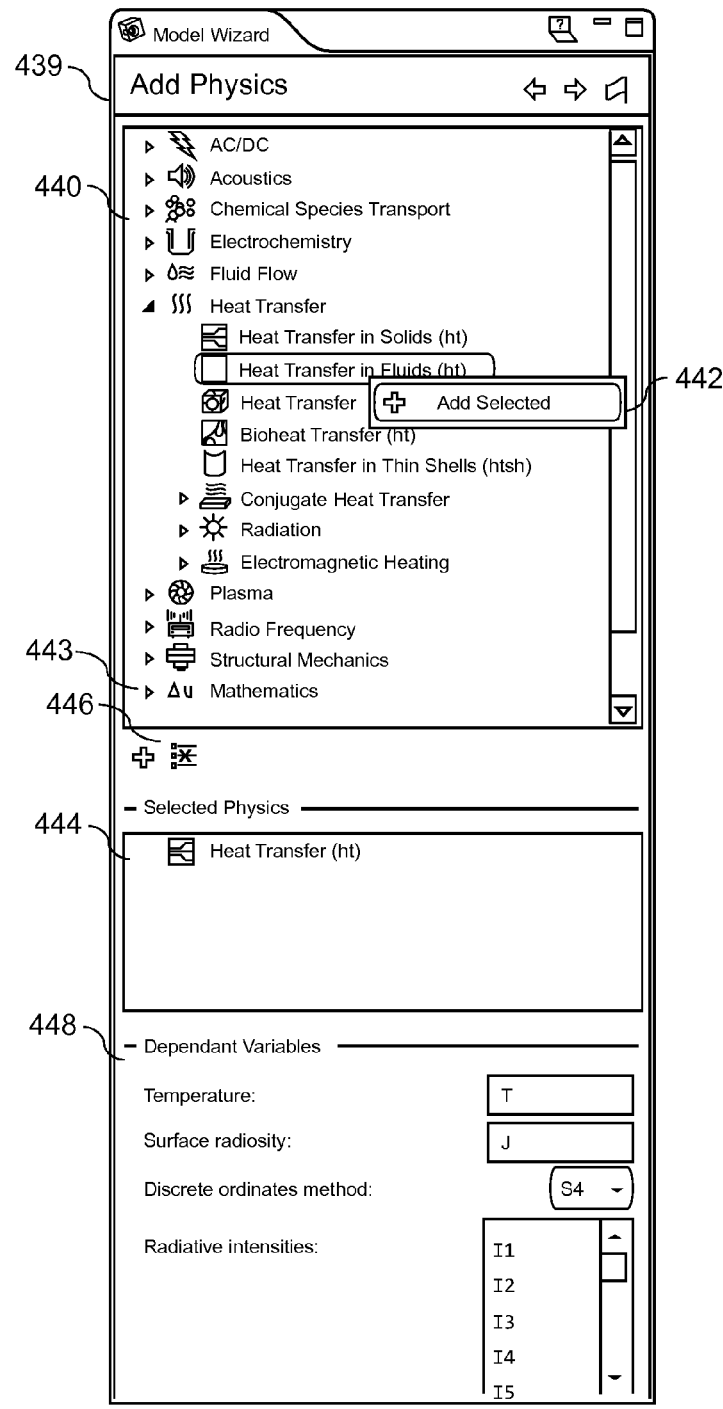
FIG. 4 illustrates an exemplary aspect of a graphical user interface for specifying physics interface(s).

Referring now to FIG. 4, an exemplary aspect of a user interface or GUI 439 is illustrated that may be used to specify a multiphysics model having a combination of more than one phenomena or process(es) (e.g., acoustics, heat transfer, structural mechanics). It is contemplated that each phenomenon or process to be combined may correspond to a physics interface. Through the use of the GUI 439, the physics interfaces that are to be used in this combined multiphysics model may be specified. Each physics interface can be configured to model physical quantities in terms of PDEs. The physical quantities may be represented either directly as dependent variable(s) in the PDE, or by a relation between the dependent variable and a variable representing the physical quantity. The PDEs in this exemplary aspect may be generally "hidden" (e.g., not made directly visible) from the user through the use of GUIs. As discussed previously, once several physics interfaces are combined into one single model or a system of models, the model or models may be referred to as a multiphysics model.

The GUI 439 also includes an exemplary list of physics interfaces 440 (e.g., AC/DC, Electrochemistry, Radio Frequency, Structural Mechanics) from which a user may select in accordance with a user's choice of space dimensions. To add physics interfaces to a multiphysics model, the user selects physics interfaces from the list and may specify that these physics interfaces are to be included in a multiphysics model. For example, the user may right-click and then select context menu item "Add selected" 442 to add a physics interface (e.g., Heat Transfer in Fluids) to a multiphysics model. After selection, this physics interface is added to the list of "Selected physics" 444 below the physics list in the GUI 439. Physics interfaces may also be removed from the list by selecting a "Remove selected" button 446.

Each physics interface in a multiphysics model is given a unique name that may be used to identify the origin of the variables in the multiphysics model. After adding a physics interface to the "Selected physics" list 446, a user may edit the names of the dependent variables representing the physical quantities being solved for. For example, edits by a user may result in a new name for a variable, such as, for "Temperature" in the "Dependent variables" section 448 of GUI 439.

It is contemplated that the selectable interfaces can also include a mathematics interface 443 that is configured to directly correspond to PDEs. In mathematics interface(s), quantities can be represented by the dependent variables for the multiphysics model. It is contemplated that in certain aspects each mathematics interface may have more than one dependent variable. It is further contemplated that the number of dependent variables and the dimension of the system of PDEs may be entered in the "Dependent variables" section 448 in the GUI 439.

Figure 5:
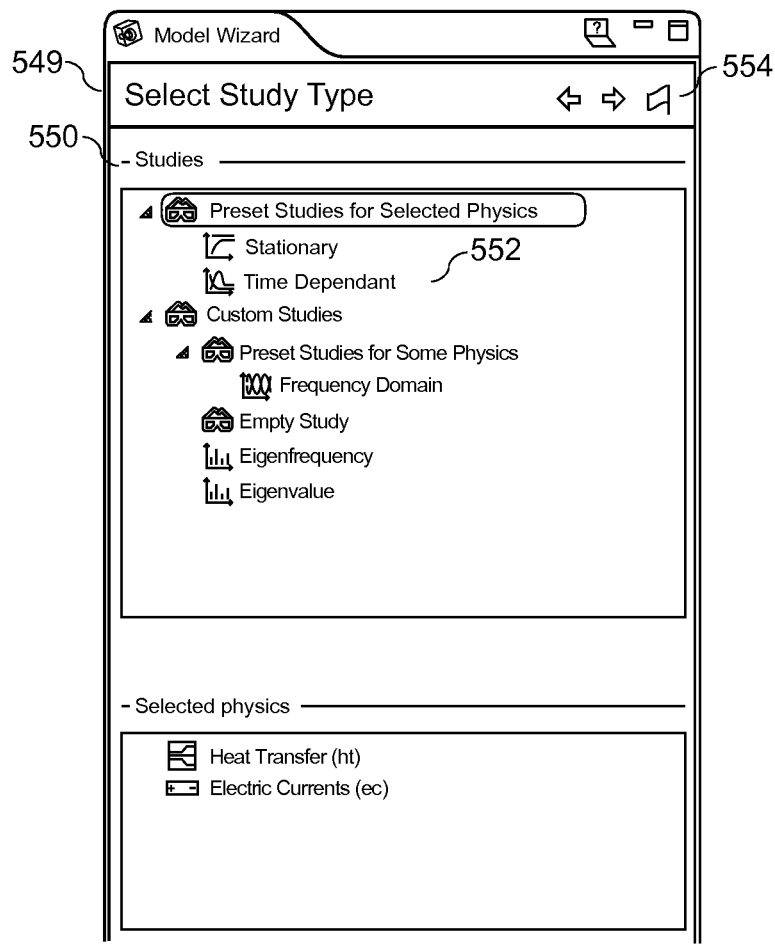
FIG. 5 illustrates an exemplary aspect of a graphical user interface for specifying study type(s).

Referring now to FIG. 5, an exemplary aspect of a user interface or GUI 549 is illustrated for specifying one or more study types for a multiphysics model. In certain aspects of the modeling system, an interface may include preset studies that are associated with selected physics interfaces. The interface may allow for customization of study steps where, for example, the studies for each of the physics interfaces are customized or some of the studies are preset (e.g., stationary, time dependent) and others are customized (e.g., eigenfrequency). It is further contemplated that a study may combine several study steps relevant for a simulation study of a multiphysics model.

It is contemplated that in certain aspect of the present disclosure, a study can determine the type of analysis that may be done on a multiphysics model, such as stationary, time-dependent, eigenvalue, and eigenfrequency. The study may control the type of equation formulation used in a multiphysics model, the type of mesh (e.g., selected from a list of possible meshes), and/or the type of solvers that may be used to solve the different studies or study steps in a multiphysics model. In one exemplary aspect, a study may comprise a stationary study step followed by a transient study step. The study then formulates the equations, meshes, and solvers for the stationary and time-dependent study steps. A user may select a study from the studies list 550 and then finish the model wizard steps by clicking the "Finish" button 554.

It is contemplated that in certain aspects of the present disclosure, multiphysics model data (e.g., selections made in GUIs 330, 439, 549) may be communicated from the GUI (e.g., 220) to the Data Storage and Retrieval Module (e.g., 224) for storage in the User Data Files (e.g., 228). For example, a multiphysics model, such as one generated via model wizard steps previously described in FIGS. 3-5, including geometry, materials, physics interfaces, mesh, studies, and results, may be represented as a model tree in a GUI. Selecting (e.g., left clicking on) a node in a model tree may give a user access to the settings for the corresponding operation represented by the node. Further selection (e.g., right-clicking) of a node may also give a user access to a menu where a user may add properties and operations to the corresponding node. These added properties and operations may be represented as child nodes to the selected node.

It is contemplated that in certain aspects of the present disclosure, the foregoing screen display(s) (e.g., GUI 330) may be displayed by and/or included as part of the component for the GUI module (e.g., 220) of a modeling system (e.g., 219). It is further contemplated that a modeling system is configured to include different types of physics interfaces, including some that may be predefined and/or some that may be user-defined. A predefined physics interface may be one for which the interface properties are included in Libraries (e.g., 226), and that may, for example, be available from a vendor (e.g., a vendor may supply libraries including defined systems of PDEs, analysis types, GUIs and the like for a particular type of system, such as heat transfer). A user-defined physics interface is configured to allow for user-defined models or physics interfaces for which a user may specify the PDEs, the quantities being modeled, and the like. The user-defined model may be saved in a user-defined library, such as a library included in the User Data files (e.g., 228). Definitions and other data files associated with a user-defined model may be stored in any one of a variety of data formats, for example, similar to those of the Libraries (e.g., 226). It is contemplated that the format and operation may vary for the stored models and model parameters.

Figure 6:
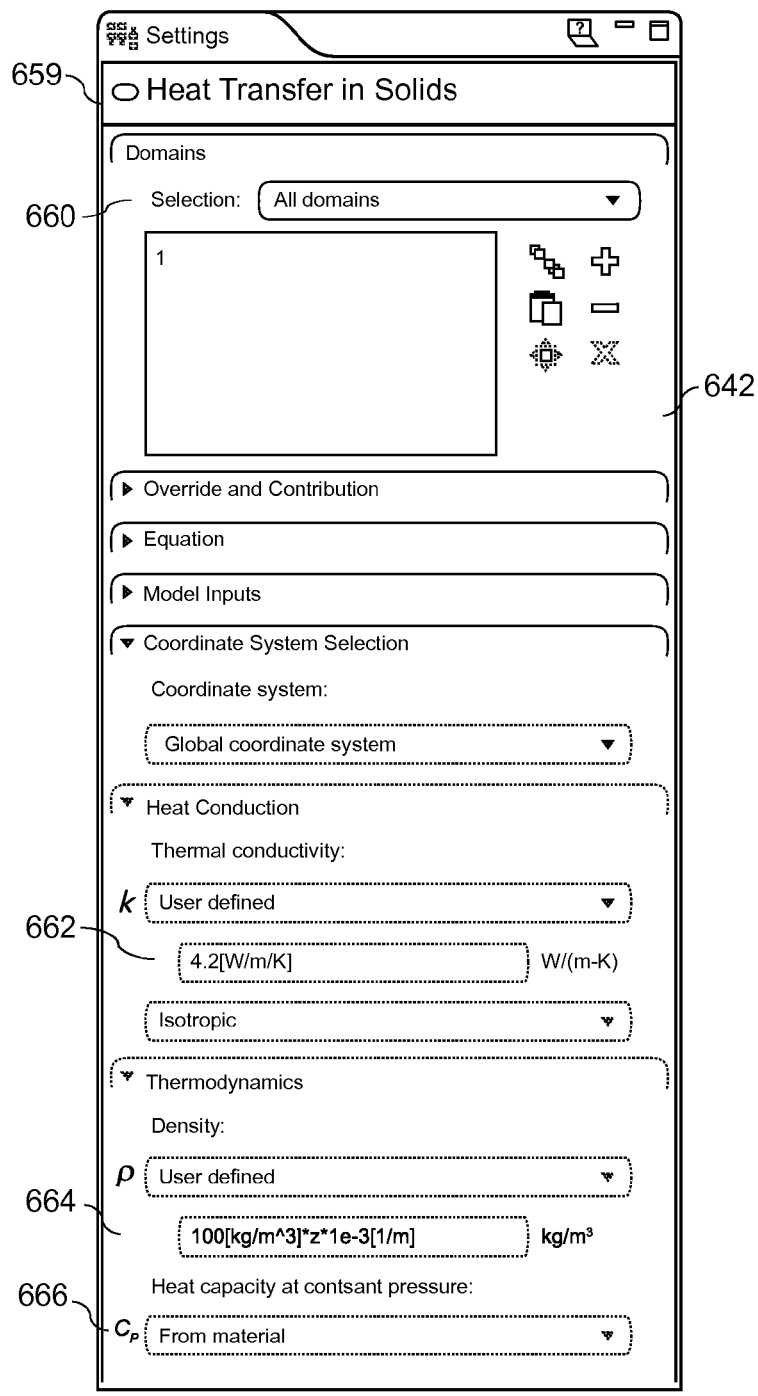
FIG. 6 illustrates an exemplary aspect of a graphical user interface for specifying physical properties for an exemplary physics interface.

Referring now to FIG. 6, an exemplary aspect of a settings window 659 is illustrated for physical property specification of an exemplary physics interface (e.g., heat transfer in solids). It is contemplated that each physics interface may have one or several GUI settings windows customized to the physics phenomena or process for which the physical properties associated with that physics interface may be specified. The physics interface and the settings for a physics interface may be represented as nodes in a model tree. For example, selecting (e.g., right-clicking on) a physics interface node can open a form where a user can do one or more tasks, such as adding domain properties to a physics interface or a setting, renaming the node, or displaying properties about the selected node.

Settings window 659 includes a domain list 660 that may have one or more geometrical domains to which the physical properties may apply. The domains may also be referred to as subdomains. It is contemplated that a user may select (e.g., via a mouse, keyboard, or other selection feature) one or several subdomains by selecting directly from a graphical representation of the geometrical domain in a graphics window. It is also contemplated that in certain aspects, the user may select domains from a predefined selection of domains that represent a specific part of a component being modeled in a multiphysics model.

The physical properties of the domains (or subdomains) are specified in the settings window. As previously described, the physical properties may be expressed in different forms including being specified as numerical values 662, as symbolic expressions in terms of space coordinate(s) 664, physical quantities and their space derivatives, and/or time. It is also contemplated that physical quantities may also be obtained from a materials setting 666 that may be defined elsewhere in the model and as described elsewhere herein. It is further contemplated that a physical property may be specified via a procedure or routine that computes a value of the property. The name or the procedure or routine may be entered in the setting window 659 along with parameters, if any, to be included. In one exemplary aspect, the procedure or routine may be written using C, Visual Basic®, Fortran, MATLAB®, or Microsoft Excel®. The particular programming language for an implementation may vary in accordance with each particular aspect and the calling standards and conventions included therein.

Figure 7:
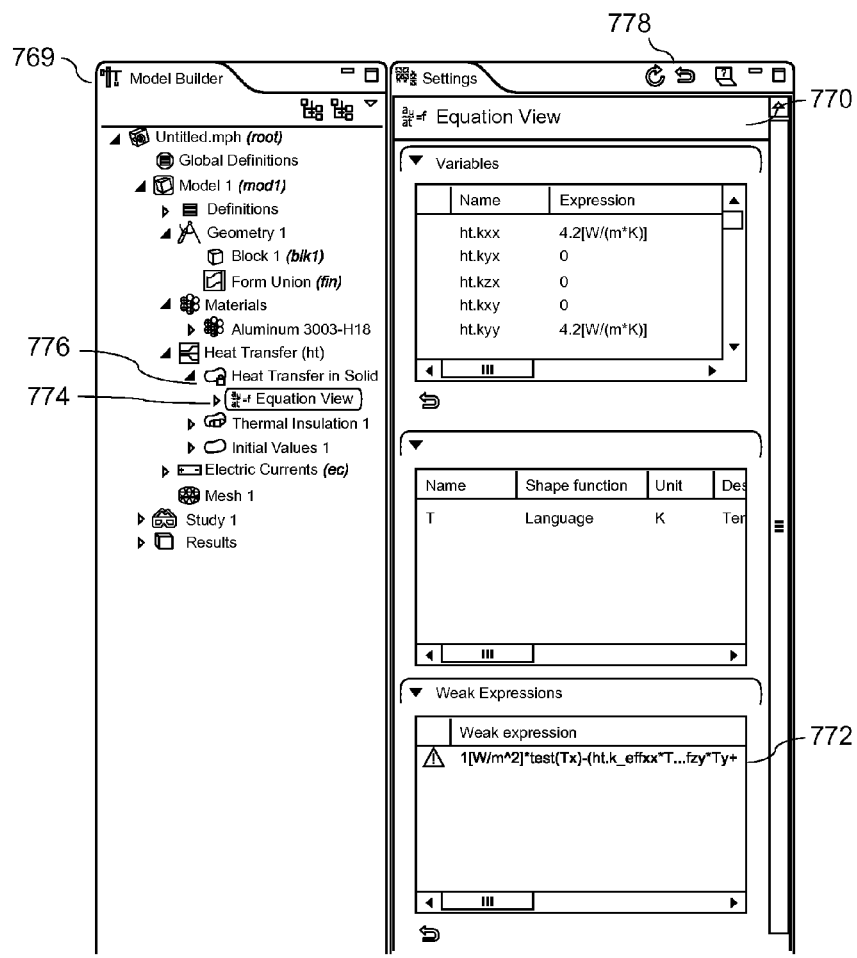
FIG. 7 illustrates an exemplary aspect of a graphical user interface for modifying partial differential equation(s).

Referring now to FIG. 7, an exemplary aspect of a GUI 769 is illustrated that may be used to modify the PDEs via an "Equation view" window. For example, PDEs, such as the exemplary equation 772, may be defined by a physics interface and further displayed and modified by a user in order to introduce description(s) that may not be defined in the settings windows for the corresponding property. In one exemplary aspect, the PDEs may be displayed in response to a user selecting a "Show equation view" element from a menu. It is contemplated that in certain aspects, each property of the model then displays a corresponding "Equation view" with a corresponding settings window 770 where changes to the equations may be made by a user. The "Equation view" may be represented as a child node (e.g., element 774) to a physics interface property node (e.g., element 776). It is contemplated that in certain aspects following a change to the settings window 770 for an "Equation view" node (e.g., element 774), the corresponding settings for the physics interface property may be locked. In one aspect, a lock indicia may be placed on the physics interface icon (e.g., element 776) to indicate that one or more properties for that interface of the model tree are locked. The property may also be unlocked by the user by, for example, selecting a "Reset all" feature 778, or other unlocking element, in the settings window for the corresponding a corresponding "Equation view" node 774.

Figure 8:
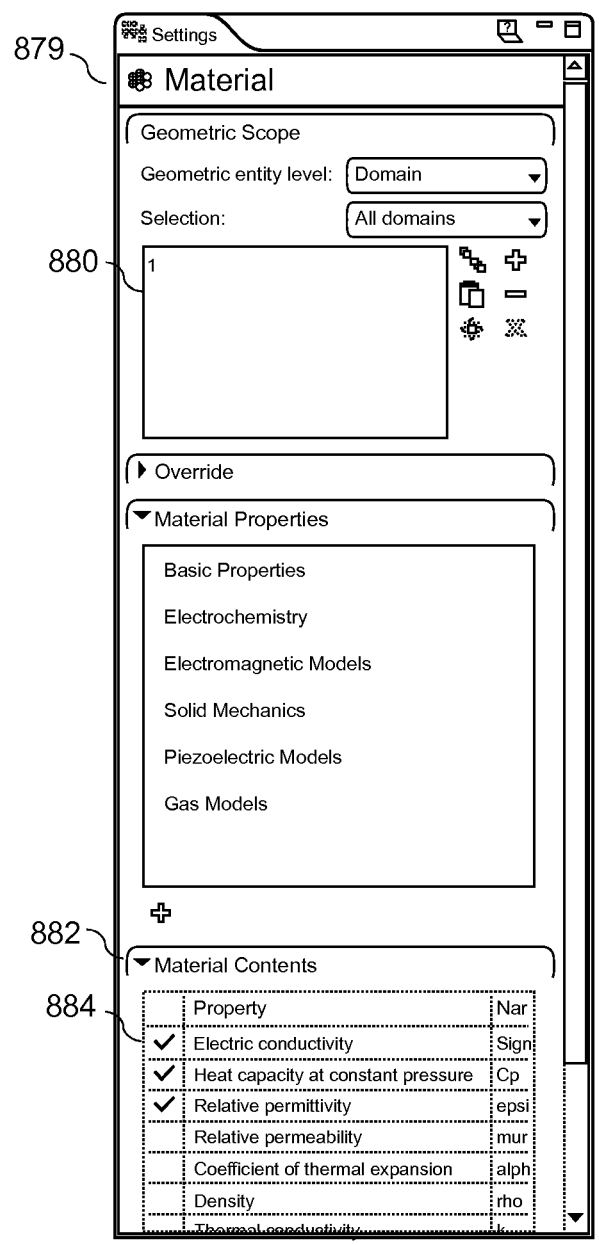
FIG. 8 illustrates an exemplary aspect of a graphical user interface for setting material propert(ies) for a domain in a multiphysics model.

Referring now to FIG. 8, an exemplary aspect a material settings window 879 is illustrated for setting material properties of a domain. Material settings can include material properties for some or all of the physics interfaces included in a multiphysics model. It is contemplated that a model can include different materials that are selected for the different domains identified in the domain list 880. The material properties may be defined by a user or they may be obtained from a predefined materials library. In one aspect of a material settings window, a material contents 882 list may display a status of the material properties for a selected material, in a selected domain, considering the physics interfaces in the multiphysics model. For example, in the context of an exemplary Joule heating process, the material contents list may label, using an icon, the properties associated with a multiphysics process involving Joule heating and the properties described in a multiphysics interface. The exemplary material properties may include, for example, heat capacity, thermal conductivity, electric conductivity, relative permittivity, and density. The material properties for describing Joule heating may be defined via the material settings window 879. Any required material properties may be labeled or otherwise identified with an icon 84 or other indicia (e.g., check mark). If a required material property is not defined, the material contents 882 list can identify the condition by highlighting the corresponding material property row (e.g., using a red stop sign icon).

It is contemplated that materials and material properties defined by a user can be saved and later accessed from user-defined material libraries for use in separate or different models. This aspect provides versatility by allowing users to create material libraries for specific applications and further can allow system developers to create material libraries for use with a multiphysics modeling system.

It is contemplated that materials and materials properties in a modeling system may be represented via nodes in a model tree. This can allow for materials and material properties to be displayed, renamed, and/or added to a node in a form accessible by a user (e.g., by right-clicking or otherwise selecting the corresponding node in the model tree).

Figure 9:
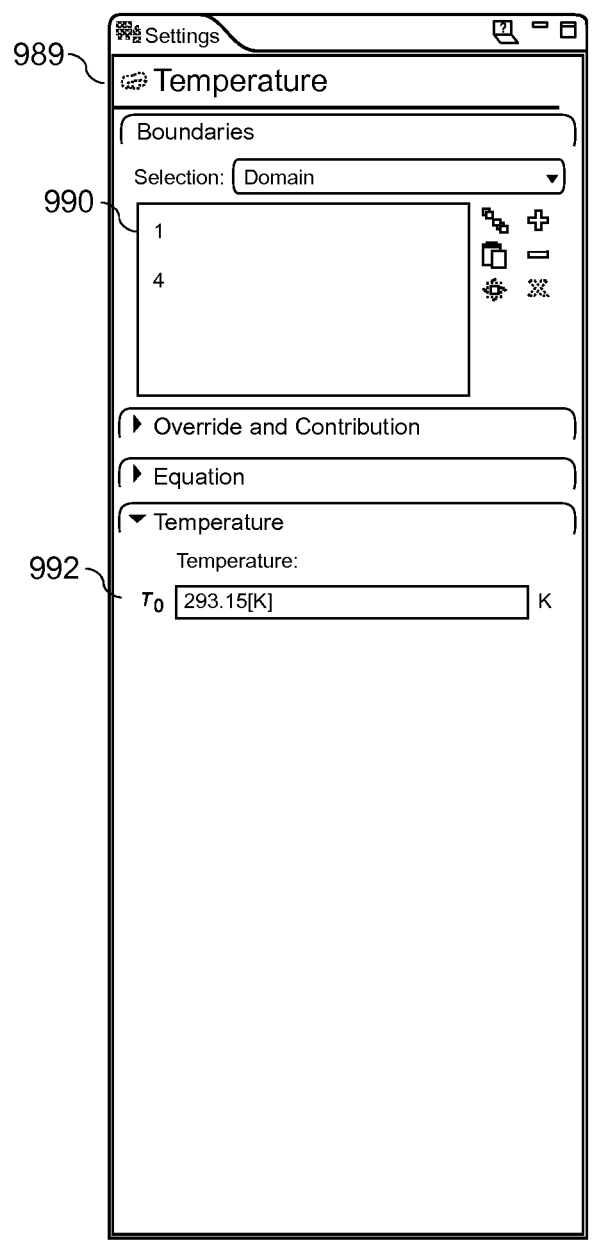
FIG. 9 illustrates an exemplary aspect of a graphical user interface for setting physical boundary condition(s) for an exemplary physics interface.

Referring now to FIG. 9, an exemplary aspect of a boundary condition settings window 989 is illustrated for a physical property boundary condition (e.g., temperature) for a physics interface (e.g. heat transfer interface). The settings window 989 may include a boundary list 990 to identify the geometric boundaries on which physical propert(ies) may apply. It is contemplated that a user can include one or more boundaries in the boundary list by selecting a boundary from graphical representations of the geometrical domain in one or more graphics windows. Selection of the boundary can occur via a selection-type device typically used for a computing system (e.g., mouse, keyboard, other selection device). It is further contemplated that a user may also select boundaries from a predefined selection of boundaries representing a specific portion of the boundary of a component being modeled in a multiphysics model. The specific portion may include the entire, or something less than the entire, boundary of the component.

The physical properties of geometrical boundaries can be specified in the boundary condition settings window 989 for a corresponding boundary. The properties can be expressed as values 992 specified in terms of numerical values, as symbolic expressions in terms of the space coordinates, or based on time. It is also contemplated that the properties can be expressed as the physical quantities and the corresponding space derivatives from a physics interface added using systems described elsewhere herein. It is further contemplated that a procedure or routine to determine the value of a property may also be specified and/or named in a manner similar to as described elsewhere herein.

It is contemplated that boundary condition settings in a modeling system may be represented via nodes in a model tree. This can allow a user to add boundary properties to a physics interface boundary condition, to rename a node, or to display properties about a node (e.g., by right-clicking or otherwise selecting the corresponding node in the model tree).

Figure 10:
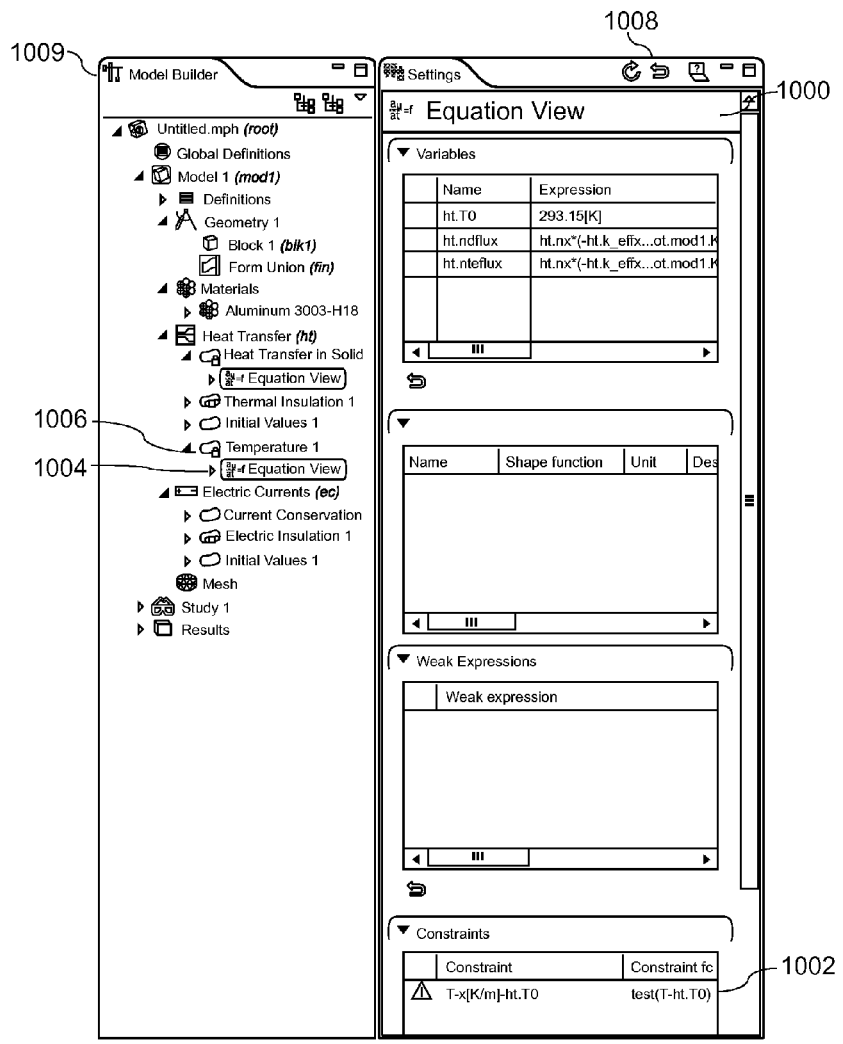
FIG. 10 illustrates an exemplary aspect of a graphical user interface for modifying partial differential equation boundary condition(s).

Referring now to FIG. 10, an exemplary aspect of a GUI 1009 is illustrated for modifying PDE boundary conditions via another "Equation view" feature 1000. Boundary conditions defined by a physics interface may be displayed 1002 and modified by a user in order to introduce description(s) that may not have been defined in the settings window(s) for the corresponding physics interface. In one embodiment, the boundary equations may be displayed by a user selecting, for example, a "Show equation view" item from a Preferences menu (not shown). It is contemplated that following a change to the PDE boundary equations using the "Equation view" feature (e.g., equation view node 1004), the corresponding settings for that boundary condition may be locked. To identify the locked nature of the boundary condition, the boundary condition node 1006 for the boundary condition property in a model tree may include an indicia that looks like a lock. The boundary condition may be unlocked by the user selecting "Reset all" 1008 in the settings window, or some other unlocking feature, for the corresponding property.

Figure 13:
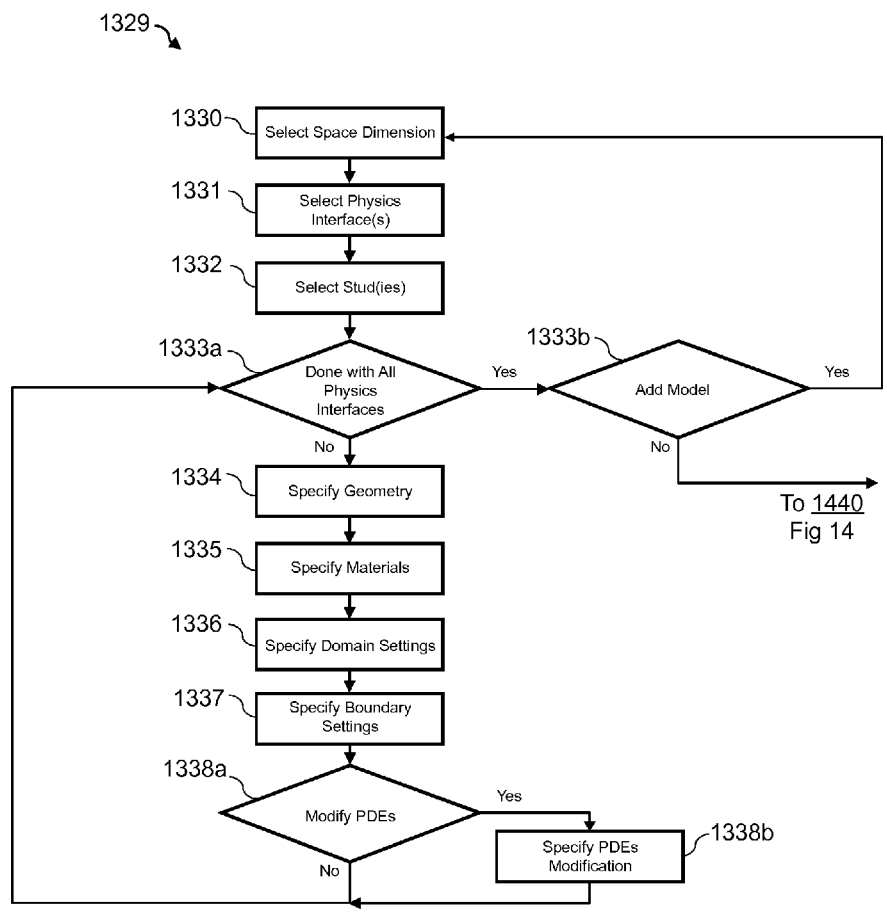
FIGS. 13-15 are flowcharts of steps for an exemplary aspect for specifying and solving systems of partial differential equations in a multiphysics modeling system.
Figure 14:
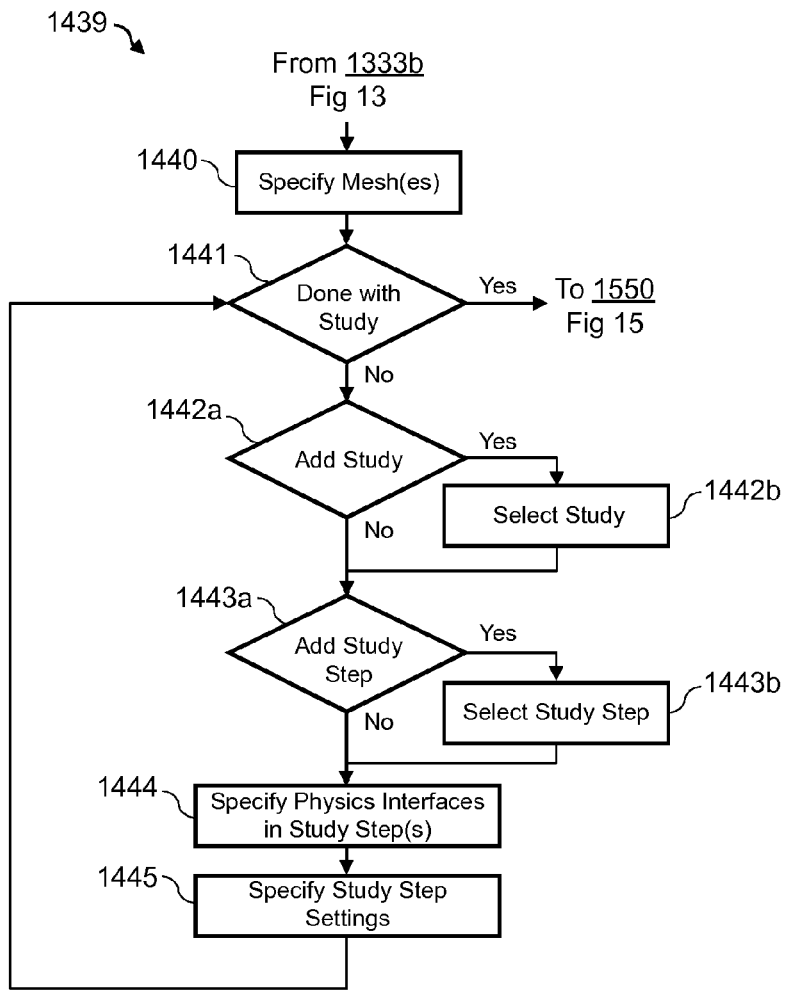
Figure 15:
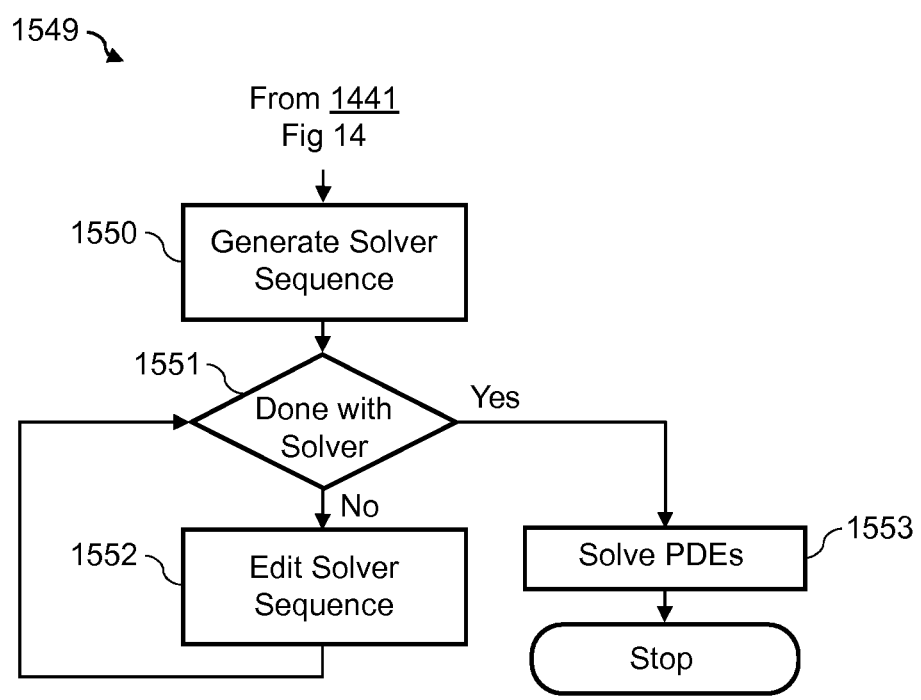

It is contemplated that in certain aspects of a modeling system it may be desirable for the PDEs and boundary conditions for the various selected physics interfaces associated with a coupled system of PDEs to be stored in a model object, which is described in more detail in the descriptions for FIGS. 13-15. A model object may be desirable because if the PDEs and boundary conditions are modified, for example, using the GUI 769 in FIG. 7, the corresponding model object may be updated accordingly. For example, through the use of the settings windows for domains and boundaries, respectively, the physical properties for the domains and boundaries along with possible modifications specified in "Equation view", the Modeling and Simulation Module 222 (see, e.g., FIG. 2) in one exemplary aspect may create, initialize, and modify a model object that includes data associated with a multiphysics model. It is furthermore contemplated that the coupled system of PDEs and associated boundary condition fields may be updated, as well.

Figure 11:
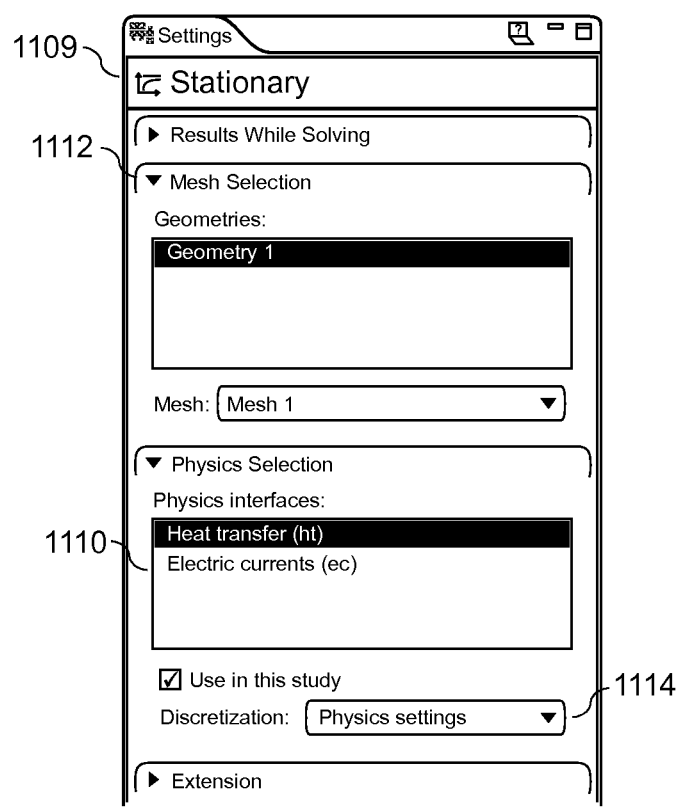
FIG. 11 illustrates an exemplary aspect of a graphical user interface for a setting window associated with a study step used to solve a study including partial differential equations.

Referring now to FIG. 11, an exemplary aspect of another type of settings window 1109 is illustrated for a study step (e.g., stationary, time dependent, frequency) that may be used in connection with solving for a study having one or more study steps. The settings window 1109 may be associated with solving PDEs for any subset of physical quantities from any one or more physics interfaces, or from a coupled PDE system. The GUI for the settings window 1109 includes a physics interfaces display area 1110 that lists the one or more physics interfaces selected for a multiphysics model. The settings window 1109 may also be configured to allow a selection of different meshes 1112 along with different discretization 1114 and tolerances for different study step. It is contemplated that the particular physics interfaces for a model may be selected along with corresponding study step settings. Then, the corresponding PDEs may be solved one at the time in different study steps or the corresponding PDEs may be solved for several physics interfaces as a coupled system of PDEs in each study step.

Figure 12:
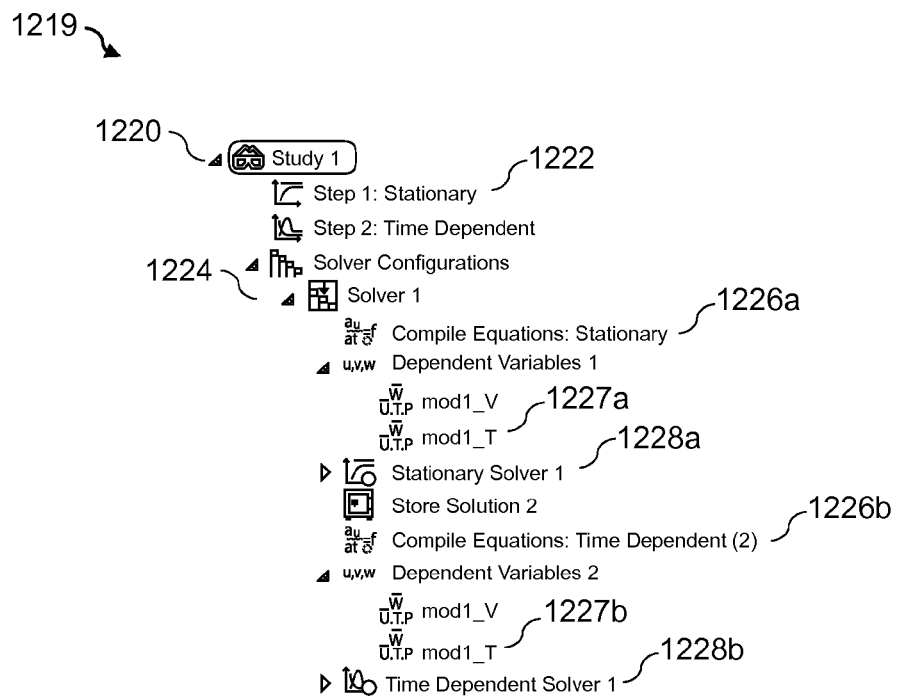
FIG. 12 illustrates an exemplary model tree including a primary node with secondary nodes.

Referring now to FIG. 12, an exemplary aspect of a model tree 1219 is illustrated that includes a study node (e.g., "Study 1" 1220) along with several child nodes (e.g., "Step 1: Stationary" 1222, "Solver Configurations"). The child nodes in this exemplary aspect include study steps (e.g., "Step 1: Stationary" 1222, "Step 2: Time Dependent") and solver node(s) (e.g., "Solver 1" 1224). A parent node (e.g., primary node) and its child nodes (e.g., secondary nodes, subnodes) may be referred to as branches in the model tree (e.g., the study branch 1219). The study branch may include, for example, PDE formulations (e.g., "Compile Equations: Stationary" 1226*a*, "Compile Equations: Time Dependent 2" 1226*b*) and solver settings (e.g., "Stationary Solver 1" 1228*a*, "Time-Dependent Solver 1" 1228*b*) for the different studies (e.g, a stationary and a time-dependent analysis, respectively). It is contemplated that a user may select a subset of the models physics interfaces to be solved in each of the study steps or select to solve for all physics interfaces in every study step. It is further contemplated that a user may also include several model nodes with corresponding physics interfaces, representing models described in different spatial dimensions, and solving a subset of the physics interfaces in each of the study steps or all physics interfaces in every study step. The selection of physics interfaces in each study step and the settings for a study step can also be included in a model object.

The solver branch (e.g., Solver Configurations) of exemplary model tree 1219 is a child node to the study branch (e.g., Study 1) and can also include its own child nodes, such as a solver (e.g., "Solver 1") and/or a dependent variable node (e.g., "Dependent Variables 1"). These child nodes may further have additional or their own child nodes, such as "mod1_V" 1227a and "mod1_T" 1227b. The dependent variable node may be configured to allow a user to make a finer selection of the solution in every study step, so that the solver may be set to solve or not solve for individual variables within a physics interface. It is contemplated that a selection of dependent variables in the solver step and the settings for a solver step are also reflected in the model object.

The exemplary aspects of the modeling system presented in FIGS. 3-12 are merely examples and are understood to apply to broader physics processes and physic phenomena, not just the processes or phenomena described herein or illustrated in the FIGS. For example, it would be understood that many different physics interfaces may be evaluated beyond the selected physics for heat transfer that is illustrated in FIG. 4. As another example, it is also understood that the multiple equation views can be viewed in FIG. 7 or that many different material properties may be selected in FIG. 8. The illustrated aspects are merely examples of the broader operations that may be performed by the multiphysics modeling system. Furthermore, the illustrated interfaces are representative of one type of interface that may be used in a multiphysics modeling system. Other types of graphical, user, or alternative input-type interfaces are contemplated.

Referring now to FIGS. 13-15, non-limiting exemplary flowcharts 1329, 1439, 1549 are illustrated for method(s) including acts for automatically specifying one or more systems of PDEs, representing the system of PDEs in a single coupled form, and solving for the system of PDEs. The various aspects described for the present disclosure can be implemented using object-oriented programming languages (e.g., Java®, C++, C#) where an object is a type of data structure that includes data fields and methods along with their interactions. For example, objects in a model can be created, modified, and accessed by method calls for a model object. A model object may include the algorithms and data structures for the model and may be further used to represent the model. The model object can further include methods for setting up and executing sequences of operations to create geometry, meshes, and solutions for the model.

It is further contemplated that the methods of the model object can be structured in a tree-like manner, such that methods calls can be associated with the operations represented by the nodes in a model tree. By operating with such a tree-like or model-tree type structure, top-level methods (e.g., represented as parent nodes) may return references that support further methods (e.g., represented by child nodes or otherwise). At certain levels within the model object, the method will perform certain acts, such as adding data to the model object, performing computations, or returning data. In the exemplary aspect of a geometry node (see, e.g., FIG. 29), a model object may have different operations associated with the geometry of a model that are represented by secondary nodes (e.g., child nodes) to a geometry node.

Referring now to FIG. 13, at step 1330, a space dimension is selected either directly (e.g., actual selection) or indirectly (e.g., through a step associated with a predefined feature) by a modeling system user. It may be desirable for the selection of a space dimension to occur using the wizard window previously described in FIG. 3 or through another type of interface. Selection of the space dimension can include an automatic update of a model object with a model item having the method call syntax, model.modelNode( ).create( ), and/or a geometry item that specifies the space dimension using the method call syntax, model.geom( ).create( ).

Next, at step 1331, the selection of physics interface(s) may be performed. The selection(s) can occur using, for example, the wizard window described for FIG. 4. Selection of the physics interface(s) can include updating the model object and adding corresponding physics item(s) in the model object, model.physics( ).create( ). Next, at step 1332, the type(s) of stud(ies) may be selected. For example, the selection of a study may be made using the wizard windows previously described in FIG. 5. It is contemplated that the selected stud(ies) can be later used to automatically generate equation formulations and solver settings. It is further contemplated that the model object can be updated with a corresponding study item, model.study( ).create( ). In certain aspects, some or all of the created model object items may be equipped with child items that may be represented by nodes in the model tree. The nodes may describe the operations specified in the model wizard and/or in the settings windows described above.

At step 1333a, a determination is made if the settings for the physics interfaces have been selected. If the logical determination is true, the method then proceeds to step 1333b, where another determination is made if a model is to be added. If another model is to be added (i.e., true) to the component(s) and/or process(es) already received by the modeling system, the method then returns to step 1330 to receive input associated with the additional model. A new model item, model.modelNode( ).create( ), may then be added including a model item with different or the same space dimensions than the already available model. This allows for the simulation of multiple processes in a multiphysics model. If no additional models are to be added (i.e., false), the method can proceed to step 1440. If the logical determination in step 1333a is false, the method then proceeds to step 1334, where for each physics interface a geometry is specified, except for zero-dimensional physics interfaces where the assigned geometry is a point. It is contemplated that geometric representation(s) may be created or otherwise imported from a geometry file (e.g., a file created using a CAD system). It is further contemplated that the model object for the geometry can be updated to include a geometric representation.

At step 1335, a specification of materials and corresponding material properties is made. It is contemplated that selection of materials and material properties may be performed, for example, using the settings windows previously described in FIG. 8. It is further contemplated that the model object may be updated with a corresponding material item, model.material( ).create( ). Next, at step 136, the specification of physical properties in the different domains and for the different physics interfaces may be performed. It is contemplated that the specification of domain settings may be performed, for example, using the settings windows previously described in FIG. 6. At step 1337, the physical properties and interactions at the boundaries may be specified for the different physics interfaces. It is contemplated that the specification of boundary conditions may be performed, for example, using the settings windows previously described in FIG. 9. It is further contemplated that the model object can be updated for both domain settings and boundary conditions using model object items of the type, model.physics( ).feature( ).

At step 1338a, a determination is made if any of the PDEs for the physics interfaces are to be modified. If the logical determination is true, the method proceeds to step 1338b, where predefined PDEs for some or all of the physics interface(s) can be changed, including domain equations and/or boundary conditions. It is contemplated that specification of the predefined physics interface equations in the PDEs modification step may be performed, for example, using the settings windows previously described in FIGS. 7 and/or 10. Step 1338b may also include updating the model object. If the logical determination is false, or after the PDE modification step is performed, the method may then proceed back to step 1333a.

Upon completion of the specification of all physics interfaces and upon no more models being added for the component(s) and/or process(es) being modeled, the method then proceeds to FIG. 14 and step 1440 where the mesh(es) may be specified (see, e.g., FIG. 11). It is contemplated that the specification of the mesh can include updating the model object with a mesh item, model.mesh( ).create( ). Next, at step 1441, a determination is made if all the desired study parameters have been included for the model. If the logical determination is true, then the method proceeds to step 1550. If the logical determination is false, the method proceeds to steps for adding a study and/or adding a study step. For example, at step 1442a, a determination is made if a new study is to be added. If the logical determination is true, then the method proceeds to step 1442b, which allows for the selection of the additional study. It is contemplated that the additional study may be added according to study item, model.study( ).create( ). Following the selection of the additional study or if the logical determination in step 1442a is false, the method can proceed to step 1443a, where a determination is made if study step(s) are to be added. If the logical determination is true, the method proceeds to allow study step(s) to be added for the model at step 1443b. Once the study step(s) are selected or if the logical determination at step 1443a is false, the method proceeds to steps 1444 and 1445 where the physics interfaces in the study steps are specified along with the study step settings. It is contemplated that the study settings may be specified, for example, using the settings window described for FIG. 11. It is further contemplated that study settings may update the model object according to one or several items of the type, model.study( ).feature( ).set( ). Following completion of the study settings, the method proceeds to step 1550.

Referring now to FIG. 15, at step 1550, a solver sequence is generated, and at step 1552, the solver sequence can be edited based on a decision at step 1551 depending on whether the solver is determined to be complete. It is contemplated that the solver sequence can update the model object by creating an item, model.sol( ).create( ), based on the stud(ies) associated with the model object. It is further contemplated that the solver sequence can be edited with items being added according to the model object item, model.sol( ).feature( ).create( ). Then, at step 153, the method solves the PDEs and can generate a solution for the model. It is contemplated that the solution step can be updated by the model item, model.sol( ).runAll( ).

What has just been described in FIGS. 13-15 are non-limiting exemplary aspects of method(s) for automatically forming one or more sets of PDEs associated with one or more physics interfaces and one or more geometric representations (e.g., models that represent components or processes) in different space dimensions. It is contemplated that in certain aspects of the method(s), the PDEs may be combined into a single, combined system of PDEs. A numerical solver, such as a finite element solver may be included, for example, in Modeling and Simulation Module (e.g., 222) and may be used to solve a system of PDEs. The finite element solver, for example, may solve a single system of PDE corresponding to a single physics interface or may solve for a coupled system of PDEs corresponding to several physics interfaces and several geometric representations (e.g., represented by model nodes).

Figure 16:
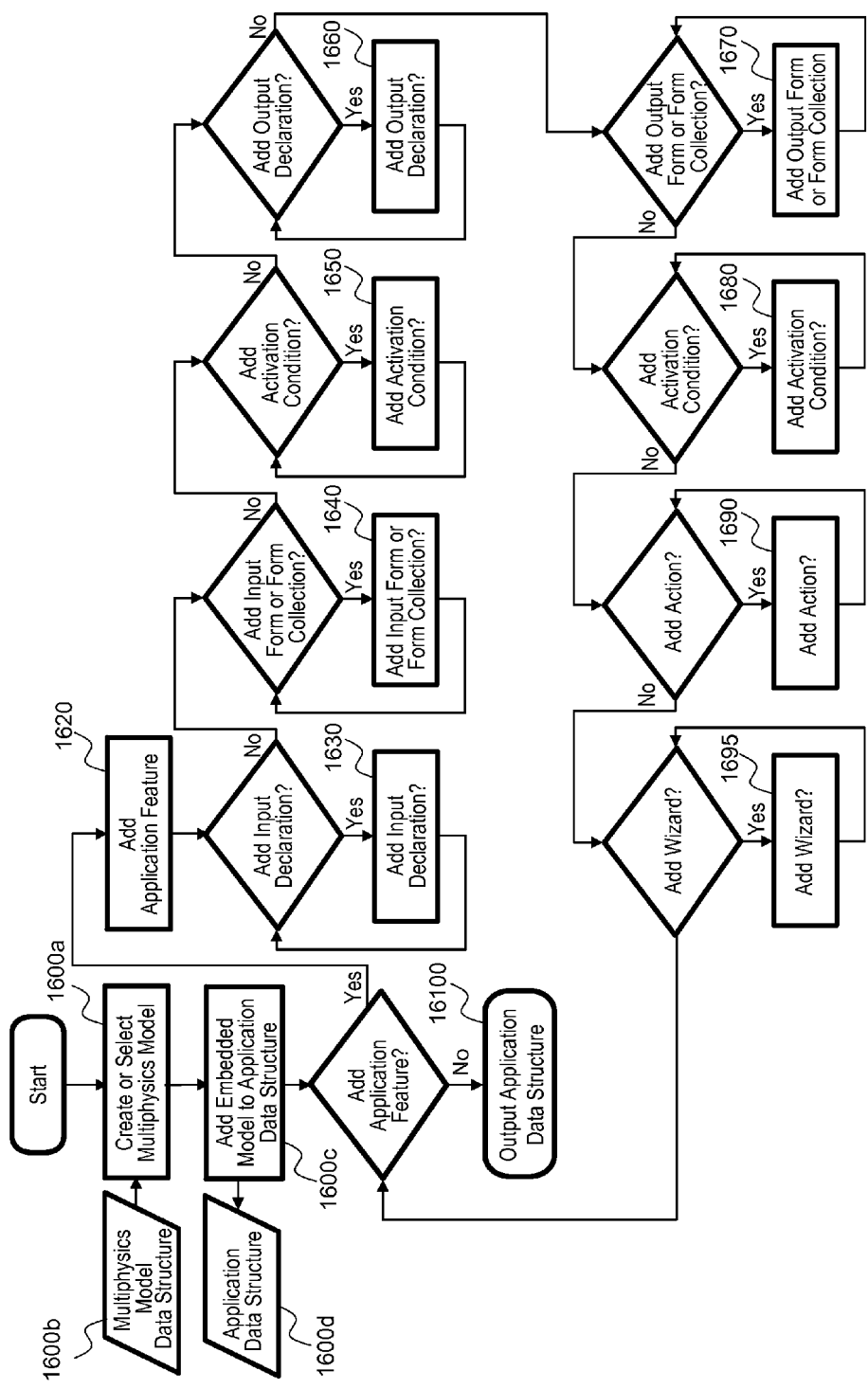
FIG. 16 illustrates a flowchart for one exemplary aspect of a method for creating an application data structure.

Referring now to FIG. 16, a flowchart is illustrated that includes method steps for some aspects of a method for creating or forming an application data structure. The method may be implemented on any one of the systems and apparatus described elsewhere herein. The illustrated method steps can be available to a user through a user interface in an application builder module. In some aspects of the present disclosure, application data structure(s) that are produced or created by the described method(s) can be loaded into multiphysics modeling system(s), such as system(s) described elsewhere herein, to generate customized application model(s), with corresponding application model tree(s), for controlling selected settings in a multiphysics model.

The method step for creating or forming an application data structure can begin by creating or selecting a multiphysics model 1610a and retrieving or loading onto the system associated with the method a corresponding multiphysics model data structure 1610b. In some aspects, it is contemplated that the multiphysics model data structure can be embedded 1610c, as an embedded model, in an initial application data structure 1610d. It is further contemplated that in some aspects, the saving or storing of a multiphysics model as an application file onto a memory device can also create an initial application data structure with a corresponding embedded model.

Next, at step 1620, an application feature can be added to the application data structure. The application feature can be represented by an application node in the application tree. The application feature can be used to add an application model node in an application model tree that is created from a resulting application data structure. An application model node in an application model tree can be specified to refer to a setting in a model, such as a multiphysics model.

An application feature is applied to an initial application data structure and used to create a customized application model data structure. An application feature can be identified by a type, a description, and an icon. The type identifier is a unique identifier that may be used to refer to the application feature in the application data structure and can also be displayed next to the feature in the application tree in an application builder module, as may be displayed on a GUI associated with the system on which the application builder module is operating. The description identifier can be displayed in a graphical user interface in a resulting application model tree and may also be descriptive of an operation that the node in the application model tree represents. The icon identifier, which may refer to an image file containing the icon's graphics, may also display the icon graphics in the application model tree shown when the application associated with an application data structure is executed on a computer system.

In some aspects, application feature(s) can be defined with restrictions and preferences, which then can be apply to a corresponding application model node in an application model tree. A restriction may be defined such that an application model node can only be presented after another node, for example when such a node depends on an operation represented by a previous node. In some aspects, the preferences can be defined such that an application model node is shown by default in the application model tree or that an application model node may be present as a singleton node in an application model tree. In aspects, such a singleton node may only be added once to the application model tree, for example to define a setting such as an initial value or condition.

Next, at step 1630, an input declaration may be added to an application feature being added to an application data structure. An input declaration is used to declare a new data field where each data field may have a unique identifier, name, an optional description, or combinations thereof. Several types of input declarations are contemplated. For example, a string data field can be applied to declare a string value, a string array data field can be applied to declare an array of strings of arbitrary length, or a double string array data field can be applied to declare a double-array of strings (e.g., an array where the array elements also are arrays) with arbitrary length(s) for the outer and inner level. As another example, a binary data field can be applied to declare a field that can store any type of data more efficiently using a binary form (e.g., serialization). A data field that stores a large number of floating-point numbers is an example of a field for which it may be desirable to store as a binary field, although it is possible to represent such a field otherwise, such as with an array of strings. It is also contemplated that any of the data fields in an embedded model (e.g., the model embedded in the application data structure, can also be used as input declarations. Such data fields may be parameters in the embedded model that once declared may be accessed by a user of an application based on a created or formed application data structure.

Next, in step 1640, input forms and form collections can be added to an application data structure. It is contemplated that in some aspects an input form represents a widget or a collection of widgets that listens to or monitors different user actions when the application is executed. A widget may include element(s) of a graphical user interface that display information or provide specific way(s) for a user to interact with the application or a widget can also be a short process for describing what a particular element of a GUI looks like, how it behaves, and how it interacts in response to user actions. An input form can be added to a window or menu associated with an application feature. It is contemplated that an application builder module may include predefined template forms, form collections, and widget collections that can be applied, for example, for creating settings windows.

A few exemplary aspects of input forms are now described.

Figure 25:
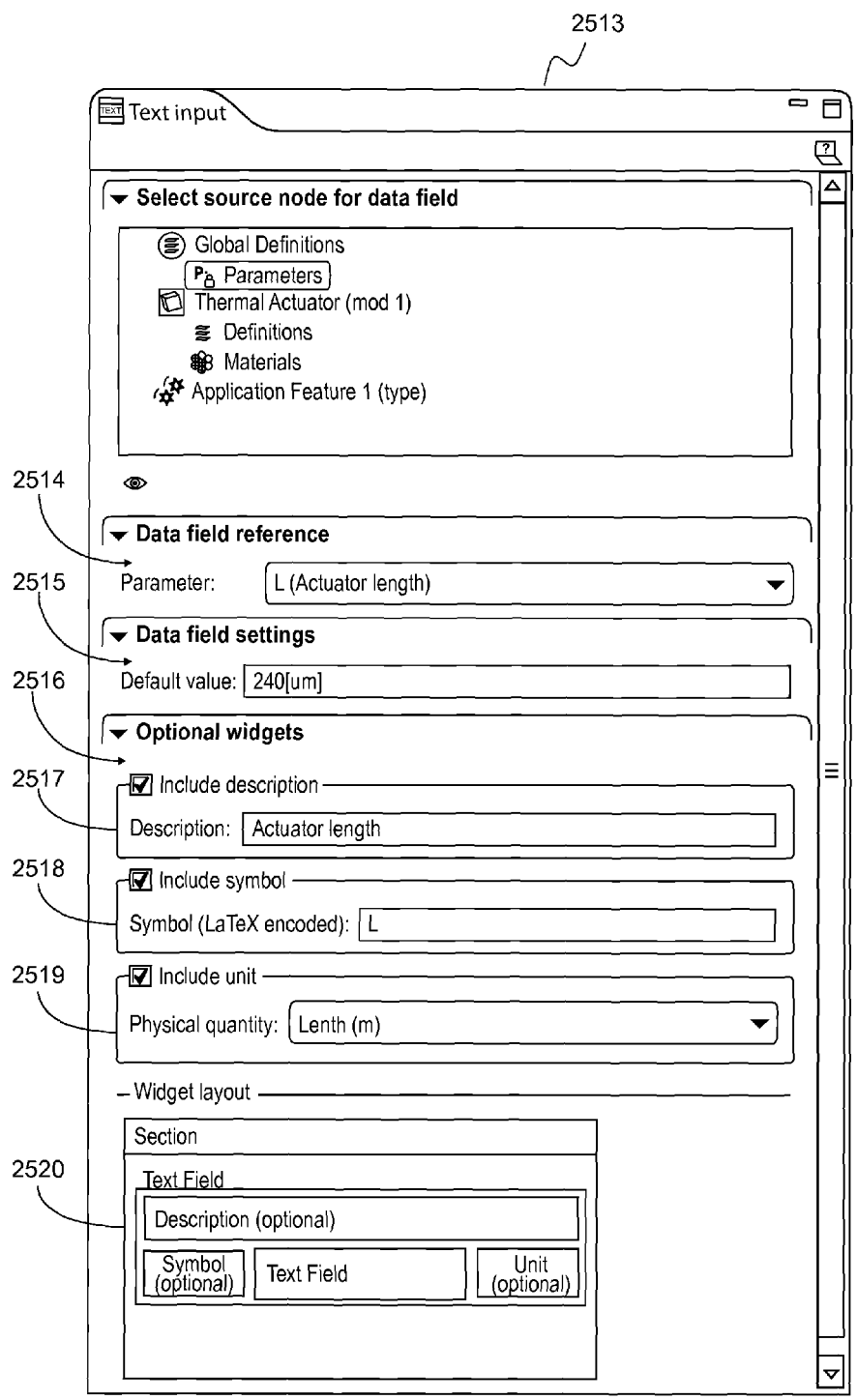
FIG. 25 illustrates an exemplary aspect of a settings window for a text input form.
Figure 34:
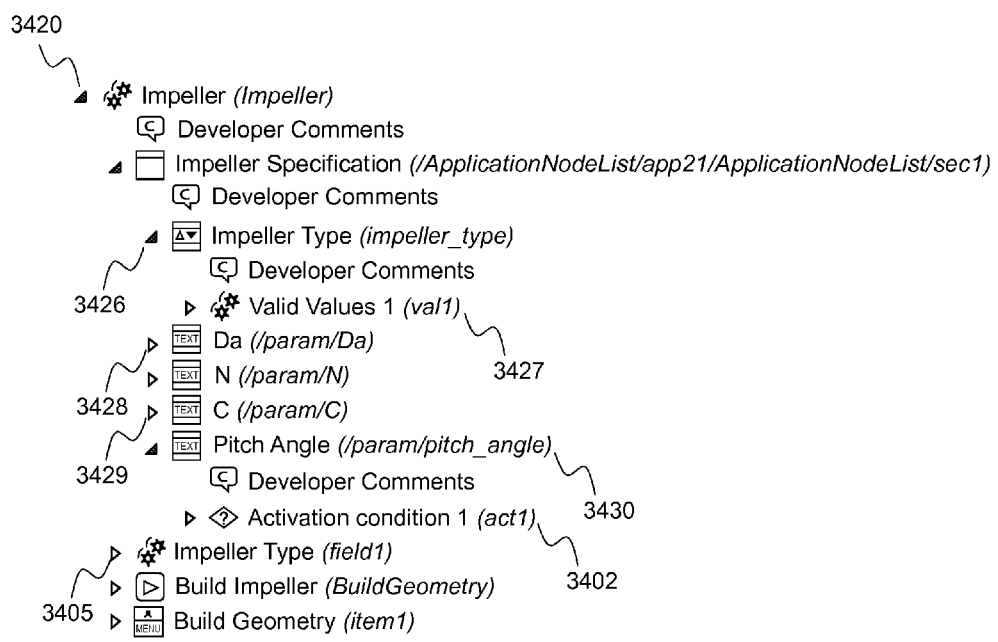
FIG. 34 illustrates an exemplary aspect of an application feature tree for am impeller application feature.

A text input form can include a text field that links to the value of some string data, which is typically though not always in a text box. In some aspects, linking can include assigning to the text field the value of the string data which may be based on some received input, such as received text input or input received from a combobox. FIG. 25 also exemplifies an aspect of linking where input received in a text input form can be associated with an internal data field in an embedded model (e.g., exemplary parameter, L, for actuator length). FIG. 34 exemplifies another aspect of linking where a combobox (e.g., exemplary impeller type 3426) sets a value of a data field (e.g., exemplary impeller type field 3405) Settings for combobox input forms are contemplated in some aspects to be similar to the setting for text input forms (e.g., FIG. 25).

Apart from selecting any of the string data field objects in an application feature, a string data value in the embedded model can also be selected. An example of such a string data value includes a model parameter. A combo box form can be used to display a list of choices that can include values of some string data, for example a string data field. The settings may be similar to those of the text input. A check box form can be applied to allow a user to select between two alternatives, for example on or off, when an application is executed. A button form can be used in a widget collection to perform an action when clicked or otherwise selected in an application. A menu item form may define a menu item for the menu it is a child to. The parent can be a menu or an application feature. A menu item form that has an application feature as parent may be included in a context menu for that application feature when the application is executed. A table input form can provide for edits to values of string array data field declarations, usually one field reference per column of the table.

A form collection can be applied to group a collection of member forms to achieve a desired layout for an application's user interface. A member form may be an input form or an output form (see below) and may also include widgets as members. Members in a form collection may be added by reference to input and output forms or by directly adding input and output forms as children (e.g., child nodes in a model tree aspect) to the form collection.

It is contemplated that several types of form collections may be available in an application builder module. A section panel can be shown inside a form window associated with an application feature when an application based on a created application data structure is executed. Such a section panel can include a heading bar presenting for example a description and the member forms placed beneath the bar. A form window can include at least one section panel and it is further contemplated that an application feature may automatically obtain one section panel child.

Another type of form collection available in an application builder module can include a menu. Menu(s) can be accessed in a toolbar or as a context menu for an application node when the application based on a created application data structure is executed. A menu can include at least one menu item as a child feature or at least another menu as a child feature. A menu may include one or more settings for its description in an application builder module.

A form group can be yet another type of form collection available in an application builder module. A form group can be applied to arrange several other forms into one new form. One such an example includes a situation where several forms are to be shown above each other in a settings window when an application based on a created application data structure is executed.

A card stack may be yet another type of form collection. Such a form collection can include a number of predefined forms that are shown depending on choices made by a system user during the execution of an application based on the created application data structure. In some aspects, it is contemplated that only a single member of the forms that is also a member in a card stack is allowed to be active at a given time when an application containing such a form collection is executed. Controlling which of the forms in a card stack that is shown can be implemented by applying activation conditions, which are described in more detail below. Other aspects of form collection can include a desktop window. A desktop window form collection can define a frame in a computer desktop where other forms may be displayed when an application based on a created application data structure is executed. Form windows can be specific and predefined type(s) of desktop window(s). A form window can define a frame where other forms may be shown and positioned in rows and columns. A form window can further be a default window for an application settings window associated with every application feature during the execution of an application based on a created application data structure. A canvas window is yet another type of a specific and predefined desktop window, and thus is also a form collection. A canvas window can be used to display graphics, such as geometries, meshes, and plots when an application is executed.

Next, in step 1650, an activation condition can be added to an input form or form collection added in step 1640. An activation condition can be applied to specify a logical condition that checks the value of an input declaration. For example, for an input form, an activation condition can be applied to determine if the form will be enabled or disabled in the form window during the execution of the application. A disabled form can either be hidden from a window or grayed-out into an inactive state.

Next, in step 1660, an output declaration can be added to an application feature. Output declarations can be applied to declare data fields that cannot be changed by a user when the application is executed. Instead the declared data fields can be used for reading values from an application or an embedded model in the application data structure. For example, an output declaration can be used for declaring a result from an evaluation in the embedded model when an application based on the application data structure is executed.

Next, in step 1670, output forms or form collections can be added to an application feature. An output form may represent any widget that displays data from an output declaration or an object in the embedded model that presents data. A plot group in the embedded model is an example of an output form that can be used directly in a canvas window. It is contemplated that in some aspects output forms are updated by an action step (see below) in order to update and display the result of the action during the execution of an application based on the application data structure.

It is contemplated that a plurality of output forms may be desirable to define in an application builder module used to generate an application data structure. A data display output form can be applied to specify a display for output declarations. A data display output form can also include a reference to a global evaluation in the embedded model that is added to the application data structure. The value of such a global evaluation can be updated when the form is executed by an action during the execution of the application. A table data display output form can be a desirable way of presenting a large number of output data from output declarations. For example, it may be possible to use one output reference per column of the table. An export output form can also be used to open an export dialog to save a result to a file during the execution of an application. An export output form may refer to export objects in the embedded model added to the application data structure, and may, for example, include animations, images, and data.

Next, in step 1680, an activation condition may be added to an output form. Such an activation condition can be applied to determine if an output form should or should not be displayed. For example, an activation condition can determine if the output form will be enabled or disabled in the form window during the execution of an application. A disabled form can either be hidden from the window or just grayed-out during the execution of an application.

Next, in step 1690, an action may be added to an application feature. An action can include definitions for a sequence of operations and can be executed from an input form during the execution of an application based on a created application data structure. For example, the action or sequence definitions can be executed from an input form in response to or following the receipt of a selection of a button or icon. An action can also include an update of an output form. For example, an action can include an update of a plot in the embedded model, which then generates a new plot in a graphics window in an application, using, for example, a canvas window.

Next, in some aspects, step 1695 is contemplated. In step 1695, a wizard can be added to an application data structure. A wizard can be applied to specify a sequence of windows that may be displayed on a GUI one at a time or in various combinations. A wizard can be placed directly under an application root node and can start when a new application model is created during the execution or implementation of an application based on a created application data structure. In some aspects, a wizard can be set up as a child to an application feature and can be started when a new instance of the application feature is created during the execution of the application. It is contemplated that in some aspects that a wizard includes at least one wizard step that is a child node. Such a child node wizard step can include a specification of the window for each step in the wizard. For example, in some aspect each wizard step can include a different window that may be defined in a settings window form.

Next, the method proceeds to determine if additional application features are to be determined or added. If not, the method proceeds to step 16100, where an application data structure is generated as output from the above described method steps.

It is contemplated in some aspects that the application data structure includes the multiphysics model data structure as an embedded model, from the model that the application is based upon, together with a hierarchy that represent the nodes generated by the method steps above.

It is further contemplated that the deployment step of an updated or modified application data structure can include placing the application data structure in a new or in an existing library. A library may represent a real folder structure on a file system, or in a network. Any of the existing libraries can be accessed by a system configured or adapted to create multiphysics model data structure(s) based on an application data structure.

It is contemplated that the above described method for adding application features and generating an application data structure is are associated with a model of a physical system. The application feature(s), including the input declaration(s), form feature(s), activation condition(s), and action feature(s), are contemplated as being represented as data that is added, acquired, received, or transmitted as part of forming or generating a modified or updated application data structure that includes the application features.

Figure 17:
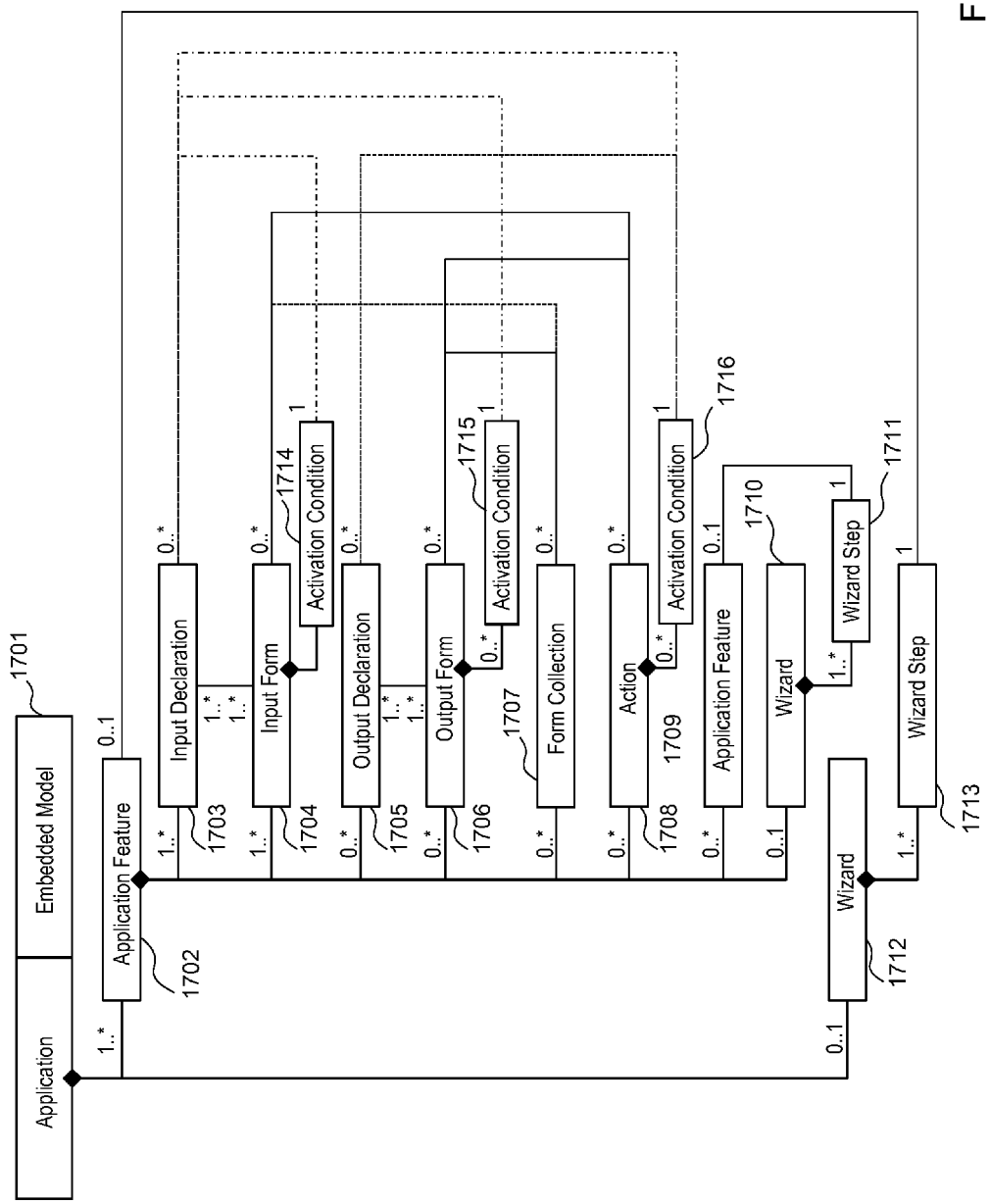
FIG. 17 illustrates an exemplary unified modeling language (UML) object diagram of instance level relationships between features in an application data structure.

Referring to FIG. 17, an example of a unified modeling language (UML) object diagram of instance level relationships is illustrated between features in some aspects of an application data structure created by the actions for the process described in FIG. 16.

An application data structure can include at least one embedded model 1701 and at least one application feature 1702. A plurality or one or more embedded models and application features are also contemplated. An application feature can include one or more (e.g., 1 . . . *) of input declarations 1703 and one or more input forms 1704, which can further be defined with a corresponding activation condition 1714. An application feature can also include anywhere from zero to one to a plurality (e.g., 0 . . . *) of output declarations 1705 and output forms 1706 that may also include a corresponding activation condition 1715. One or more (e.g., 0 . . . *) form collections can also be included in an application feature 1702. Such collections can comprise inputs forms and/or output forms. Zero to one or more (e.g., 0 . . . *) actions 1708 can be included in an application feature that may further be defined with zero to one or more (e.g., 0 . . . *) corresponding activation conditions 1716. In some aspects, an application feature's settings can also be linked to a wizard step 1713 that is includes in a wizard feature 1712. In addition, an application feature can also include child application features 1709 that may also have their own corresponding child features. An application feature can also include a wizard feature 1710 with corresponding wizard steps 1711 that may link to child application features 1709 of the application feature 1702. In some aspects, a link can be understood to include that the settings made in the wizard may set through setting forms certain activation conditions, values in text inputs, execution of actions, etc. In some aspects, linking can be done by setting values of string data. For example, in FIG. 34, an exemplary settings window for impeller type may be included in a wizard step where an exemplary selection of impeller would then be linked to the impeller type and decide whether or not to show the impeller pitch edit field.

Figure 18:
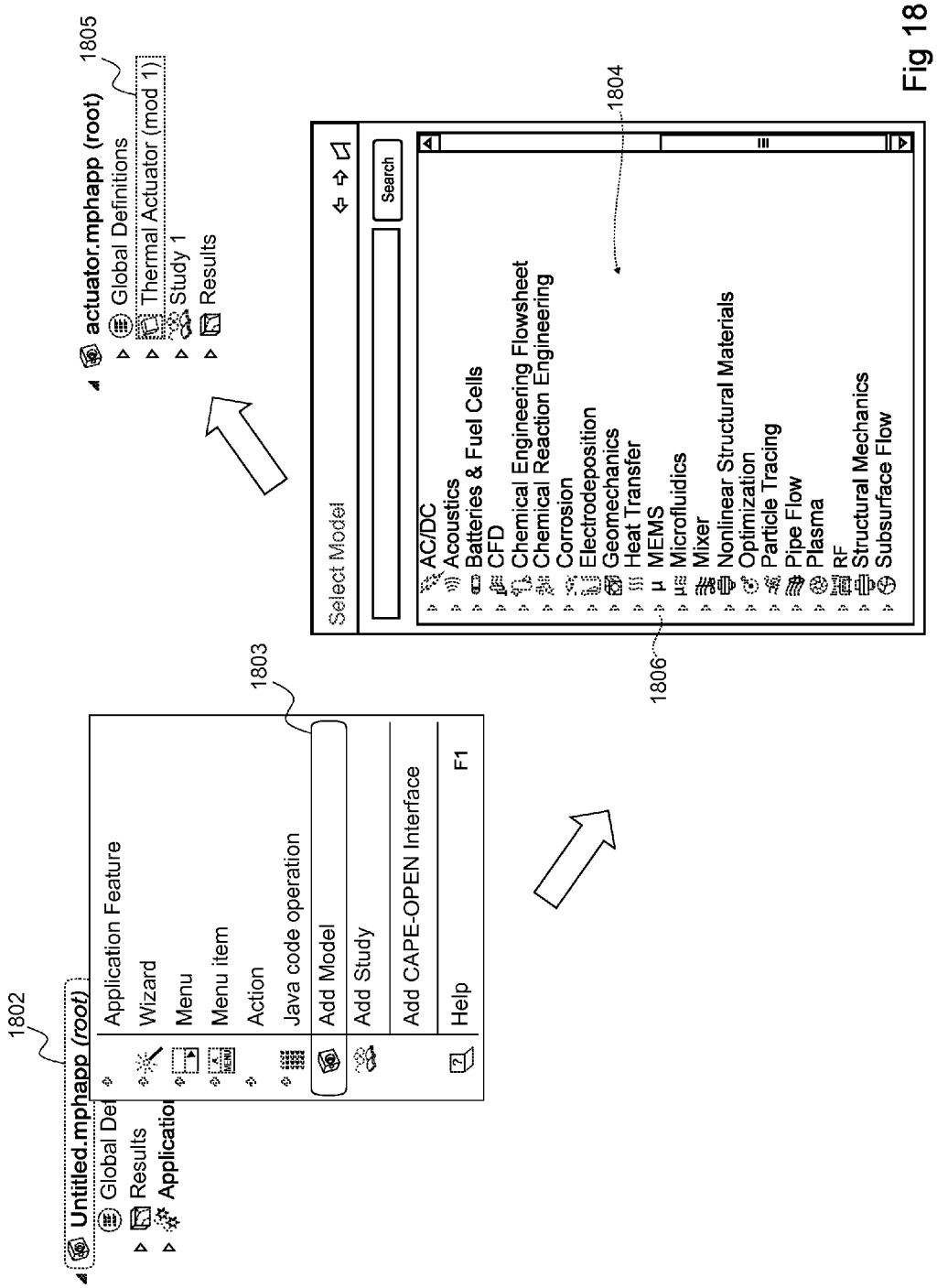
FIG. 18 shows an exemplary aspect of an application tree for adding a multiphysics model to an application data structure.

Referring now to FIG. 18, an exemplary application tree is illustrated that can be included in some aspects of features 1600a-d in FIG. 16 for adding a multiphysics model data structure to an initial application data structure. Right-clicking or selecting a root node 1802 in the application tree can open or display a context menu where a multiphysics model data structure may be added 1803 to the initial application data structure.

The multiphysics model data structure can be selected from a dialog box listing a library of multiphysics models 1804 that may be available from a multiphysics modeling system or that may be or that may have been previously created and stored by a user of a multiphysics modeling system. Any such multiphysics model with its corresponding multiphysics model data structure can describe devices and processes accounting for static and quasi-static electromagnetic fields, time harmonic and dynamic electric fields, acoustics, fluid flow and chemical reactions, heat transfer, structural mechanics, electromechanics, plasma chemistry and physics, fluid-structure interactions, thermal stresses and thermal expansion, electrochemistry, and other coupled physics phenomena and processes. It is contemplated that in some aspects of the systems and methods described in herein that exemplary application features may set the frequency for a time harmonic electromagnetic field (input), run a simulation (action), and display the S-parameters (output) by running a model defined in an embedded model. Another example is an exemplary application feature for receiving an input for updating a reference pressure, running a simulation, and displaying the resulting wave propagation by running an embedded model of an acoustics simulation. Yet another example may be an exemplary application feature that receives an inlet flow rate, runs a fluid flow simulation, and displays the average flow rate at a pipe outlet from a fluid flow model for a tank defined in an embedded model. Yet another example may be an exemplary application feature that determines the size of a heat sink (activation condition, output) required to keep temperature below a given input value (input), for a given input load (input), by running a simulation (action) of a model of an electronic device defined in an embedded model. Yet another example is an exemplary application feature that receives the values of a parameterized plasma reactor, updates the geometry accordingly (action, activation condition), and runs a simulation in order to calculate the deposit thickness of semiconductor materials on the surface of a wafer, by running a plasma reactor model defined in an embedded model.

As a further example it is contemplated that an exemplary model of a microactuator in a micro-electromechanical systems (MEMS) module 1806 of a multiphysics modeling system may be selected. Once selected, the multiphysics model data structure can be represented as a model node 1805 in the application tree and, now referring back to FIG. 16, added to the application data structure according to steps 1610c and 1600d.

Figure 19:
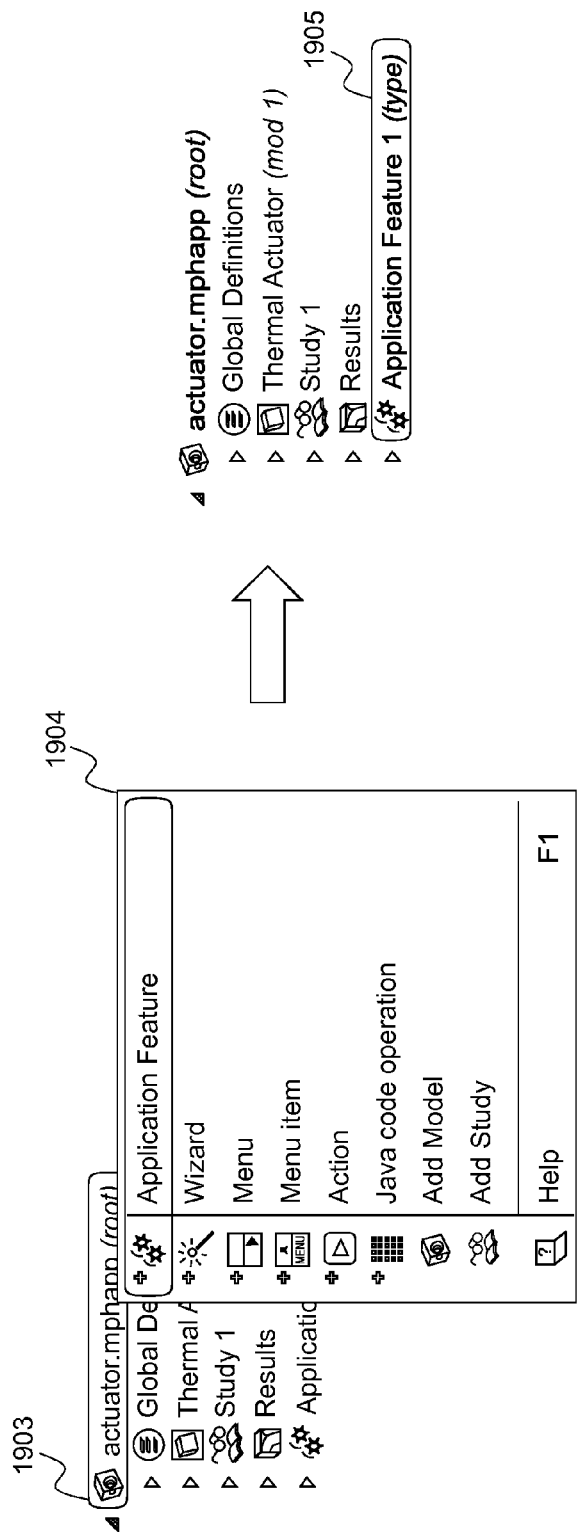
FIG. 19 illustrates an exemplary aspect of an application tree for adding an application feature to an application data structure.

Referring now to FIG. 19, an exemplary aspect of an application tree is illustrated according to some aspects of step 1620 from FIG. 16 for adding an application feature to an application data structure. Right-clicking or otherwise selecting a root node 1903 in the application tree can open a context menu 1904 where an application feature may be added to the application data structure. Furthermore, in some aspects, an application can also include an application feature node that is present by default when a new application is created. The application feature can be represented as an application feature node 1905 in the application tree. The application feature can be applied to represent settings in an exemplary model of a device, for example a thermal microactuator, which is further described by the multiphysics model data structure.

Figure 20:
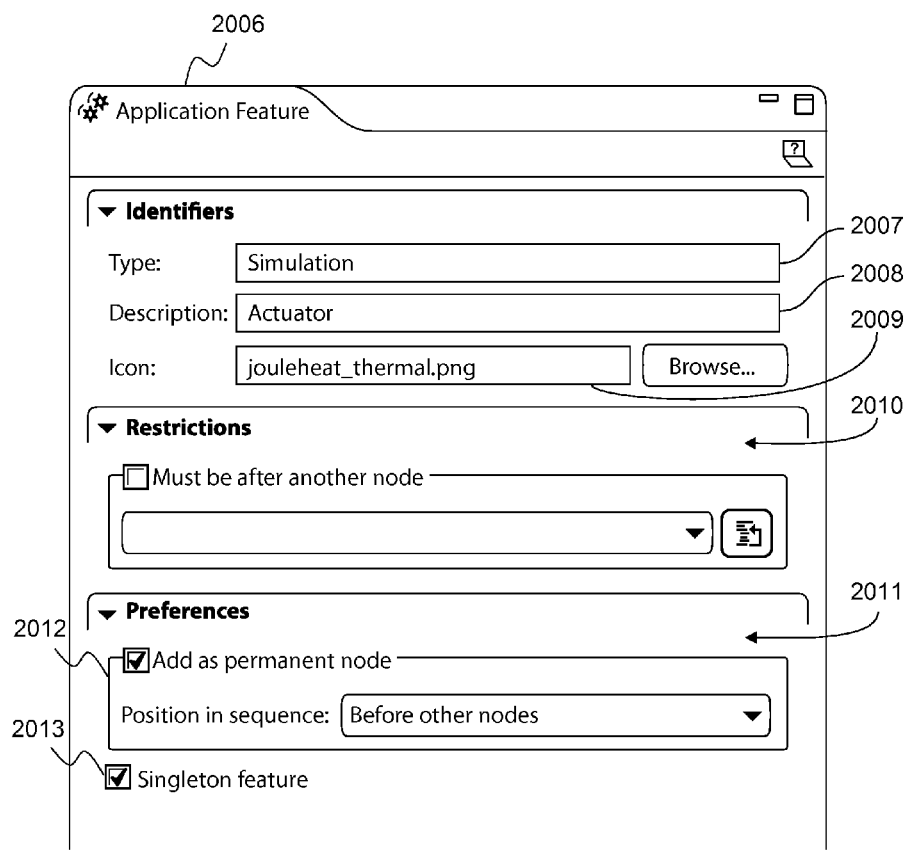
FIG. 20 illustrates an exemplary aspect of a settings window for an application feature.

Referring now to FIG. 20, an exemplary settings window 2006 is illustrated for one exemplary application feature representing settings for the thermal microactuator in the multiphysics model according to some aspects of a method for creating an application data structure. The settings window for the application feature can include a type 2007, a description 2008, and an icon edit field 2009. It can also include setting window sections for restrictions 2010 and preferences 2011. In the preferences section, the "add as permanent node" check box 2012 can be selected, which when selected implies that this node will always be shown in the application model tree when the application is used. A singleton checkbox 2013 can also be used to specify that an application feature can only be present alone in the application model tree when the application is executed.

Figure 21:
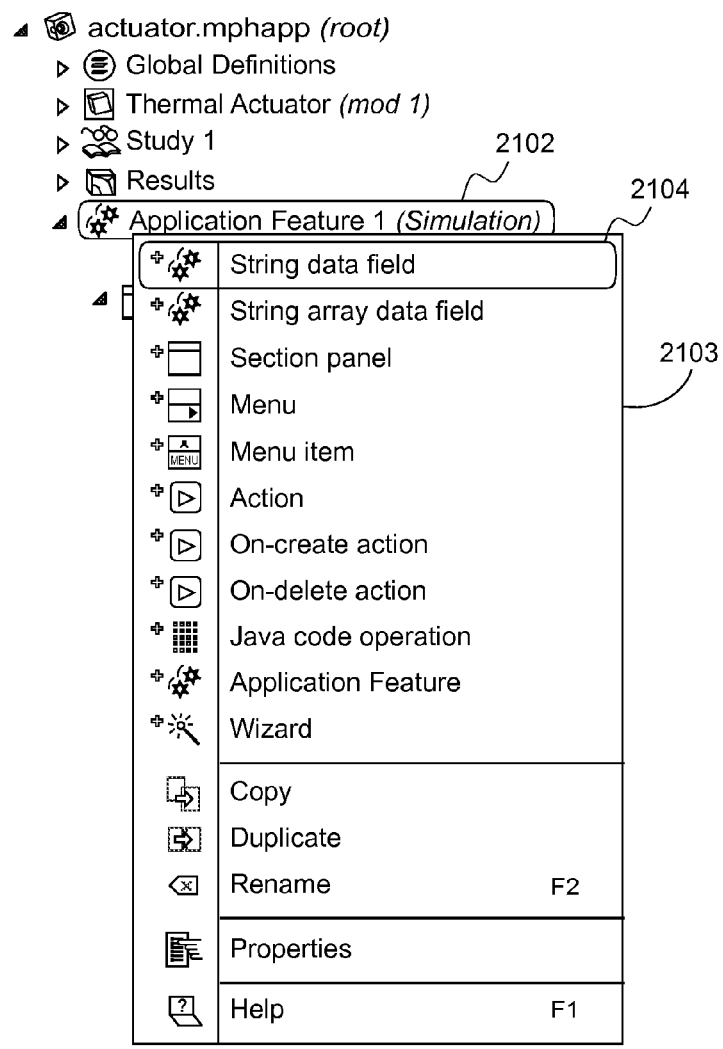
FIG. 21 illustrates an exemplary application tree for adding an input declaration to an application data structure.

Referring now to FIG. 21, an exemplary application tree is illustrated according to some aspects of step 1630 from FIG. 16 for adding an input declaration to an application data structure. Right-clicking or otherwise selecting a feature node 2102 in the application tree can open a context menu 2103 where an input declaration can be added to the application data structure, for example a string data field 2104 or any other input declaration type that is available or listed. It is contemplated that such an input declaration can be used to receive inputs for parameters used to control settings in an embedded model when the application is executed.

Figure 22:
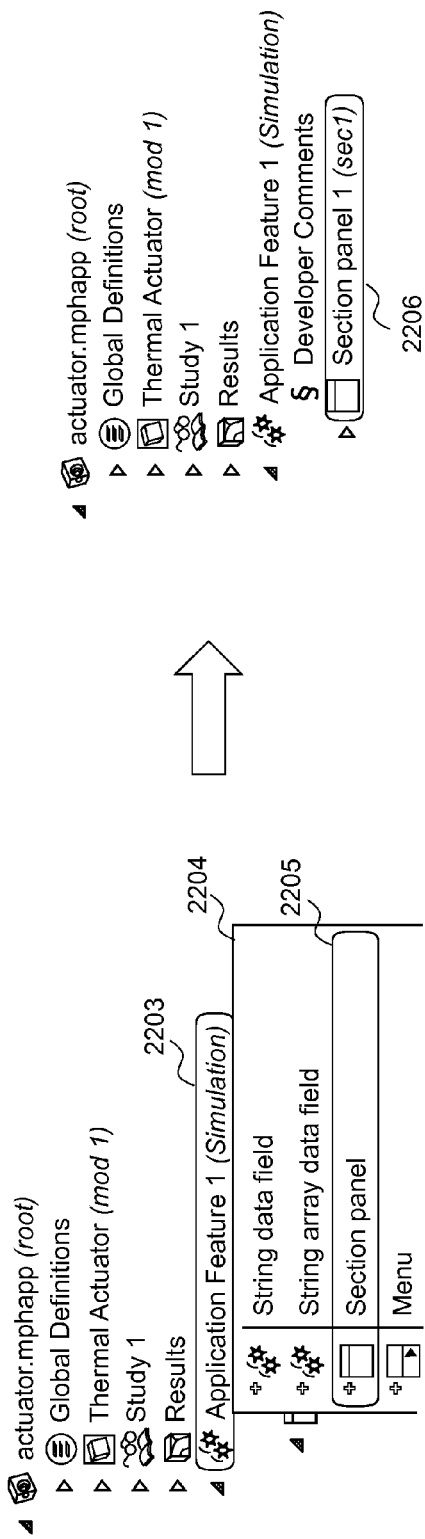
FIG. 22 illustrates an exemplary application tree for adding a panel input form to an application data structure.

Referring now to FIG. 22, an exemplary application tree is illustrated according to some aspects of step 1640 from FIG. 16 for adding a form collection to an application data structure. Right-clicking or otherwise selecting (e.g., touchscreen, scrolling through list, hovering over) a feature node 2203 in the application tree can open a context menu 2204 where an input form or a form collection can be added to the application data structure, for example a section panel 2205. Other input forms and form collections may be available in such a context menu, for example menus. A section panel can also be available by default when an application is created. A section panel, or any other input form or form collection, can be represented as a node in the application tree 2206.

Figure 23:
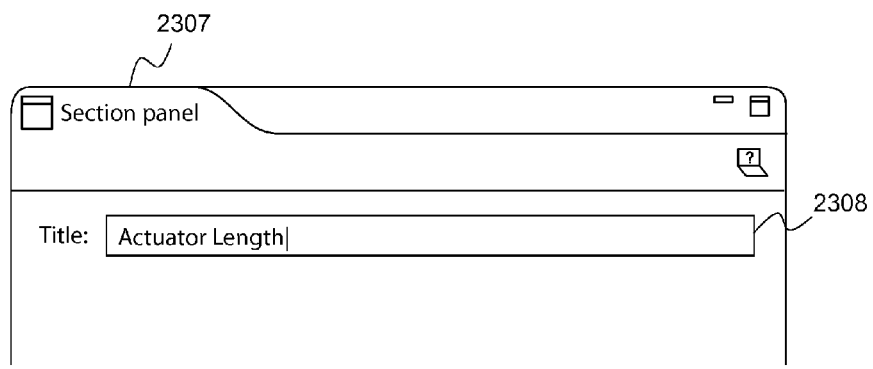
FIG. 23 illustrates an exemplary aspect of a settings window for a section panel form collection.

Referring now to FIG. 23, an exemplary settings window 2307 is illustrated for a section panel form collection according to some aspects of a method for creating an application data structure. The section panel form settings window in this exemplary aspect may only require a title for the section panel 2308; though it is contemplated that additional child features can be applied to define the contents of the section panel form collection. For example, a section panel can be designed to receive an input for the length of a MEMS actuator defined in the embedded model. The section panel title can therefore be set to actuator length 2308.

Figure 24:
FIG. 24 illustrates an exemplary aspect of an application tree for adding a text input form to an application data structure.

Referring now to FIG. 24, an exemplary application tree is illustrated according to some aspects of another exemplary alternative of step 1640 from FIG. 16 for adding a text input form to an application data structure. Right-clicking or otherwise selecting a section panel node 2409 in the application tree, or any other form collection node, can open a context menu 2410 where a child input form can be added to section panel form collection in the application data structure. For example, the section panel can include a text input form 2411 for receiving a text input for an actuator length in the embedded model when the application is executed. The text input form can be represented as a node 2412 in the application tree.

Referring now to FIG. 25, an exemplary settings window 2513 is illustrated for a text input form according to some aspects of a method for creating an application data structure. It is contemplated that such a settings window can include a data field reference 2514 that points to data declared in an input declaration or to data previously declared in the embedded model. For example, the text input can refer to a parameter defined in the embedded model that controls the length of the MEMS actuator. The settings window can also include a data field settings section 2515 that may allow settings such as default values to be defined. Such a default value can be shown in an input edit field when the application is executed. In some aspects, an optional widget section 2516 offers a ready-made widget collection for the design of the text field. These optional widgets can include description 2517, symbol 2518, and unit 2519. A widget layout preview 2520 can show how the text field is displayed when the application is executed.

Figure 26:
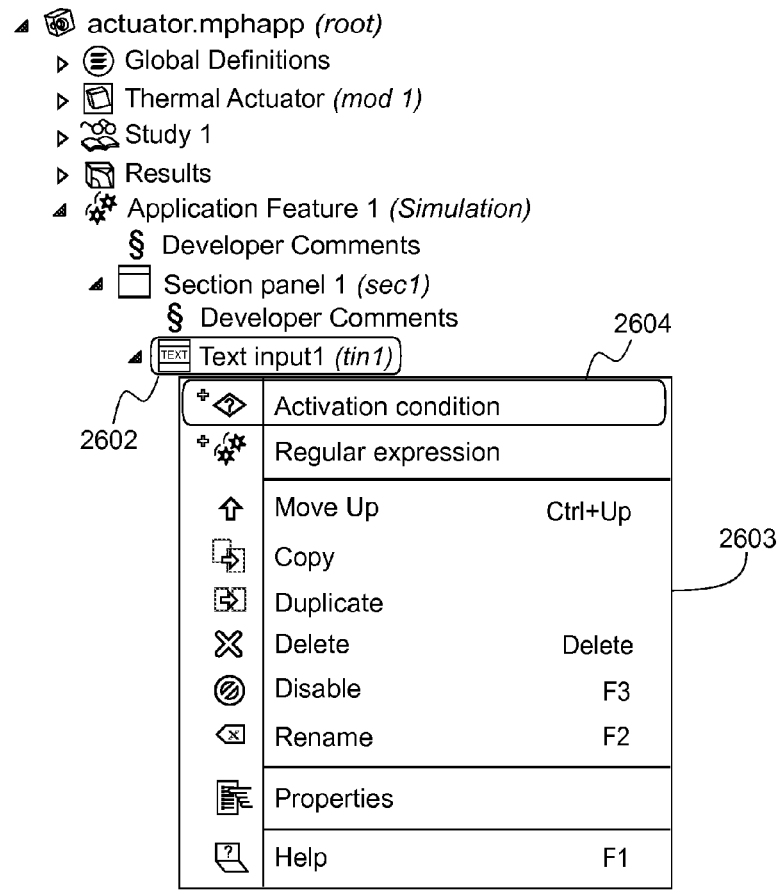
FIG. 26 illustrates an exemplary aspect of an application tree for adding an activation condition to an application data structure.

Referring now to FIG. 26, an exemplary application tree is illustrated according to some aspects of step 1650 from FIG. 16 for adding an activation condition to an application data structure. Right-clicking or otherwise selecting a text input node 2602 in the application tree, or any other input form node, opens a context menu 2603 for adding an activation condition 2604. In this example, such a condition can activate a text input form depending of the value of an input parameter when the application is executed. Such an input parameter can be obtained from another input declaration and input form or by reference to a parameter in the embedded model. An activation condition can be represented as a child node to an input form in the application tree.

Figure 27:
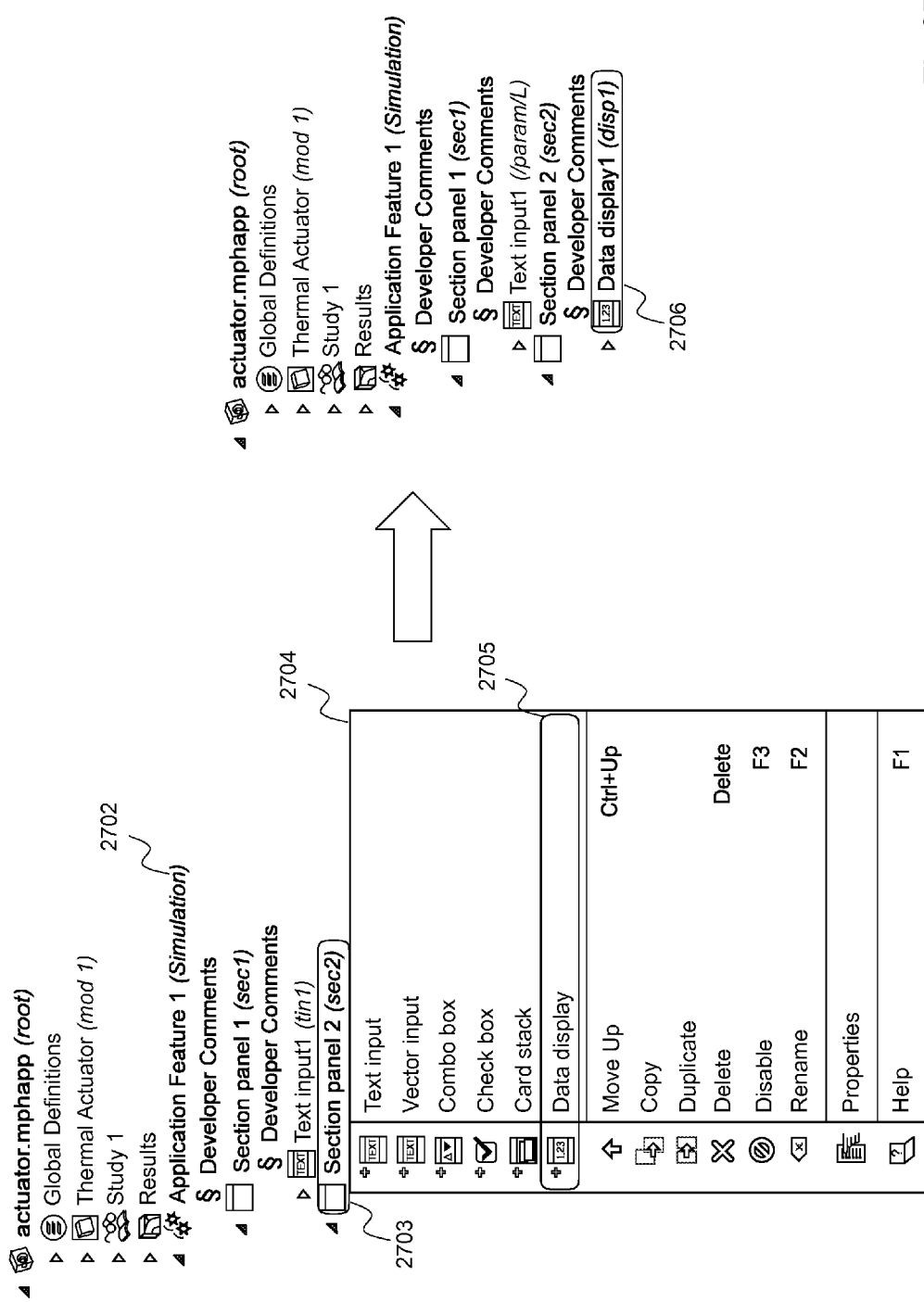
FIG. 27 illustrates an exemplary aspect of an application tree for adding a panel collection form and a data display output form to an application data structure.

Referring now to FIG. 27, an exemplary application tree is illustrated according to some aspects of steps 1660 and 1670 from FIG. 16 for adding a section panel and a data display output form to an application data structure. It is contemplated that an output declaration can be included in the embedded model and linked to an output form by reference, as described below. Right-clicking or otherwise selecting an application feature node 2702 in the application tree can open a context menu for adding form collections, such as a section panel that can include an output form. It is contemplated that such a section panel can be represented as a node in the application tree 2703. Right-clicking or otherwise selecting the section panel node 2703 can open a context menu 2704 where an output form, such as a data display form 2705 can be added to the section panel form collection. A data display form can be used to display the value of a derived value in the embedded model or to display any other data declared in an output declaration when the application is executed. The data display output form can be represented as a child node to a section panel form collection node 2706 in the application tree. It is further contemplated that in some aspects an activation condition can be added to an output form, such as the activation condition described earlier for step 1680 from FIG. 16. The activation condition can be added to the output form similar to how an activation condition is added to an input for, as described for activation condition 2604 from FIG. 26.

Figure 28:
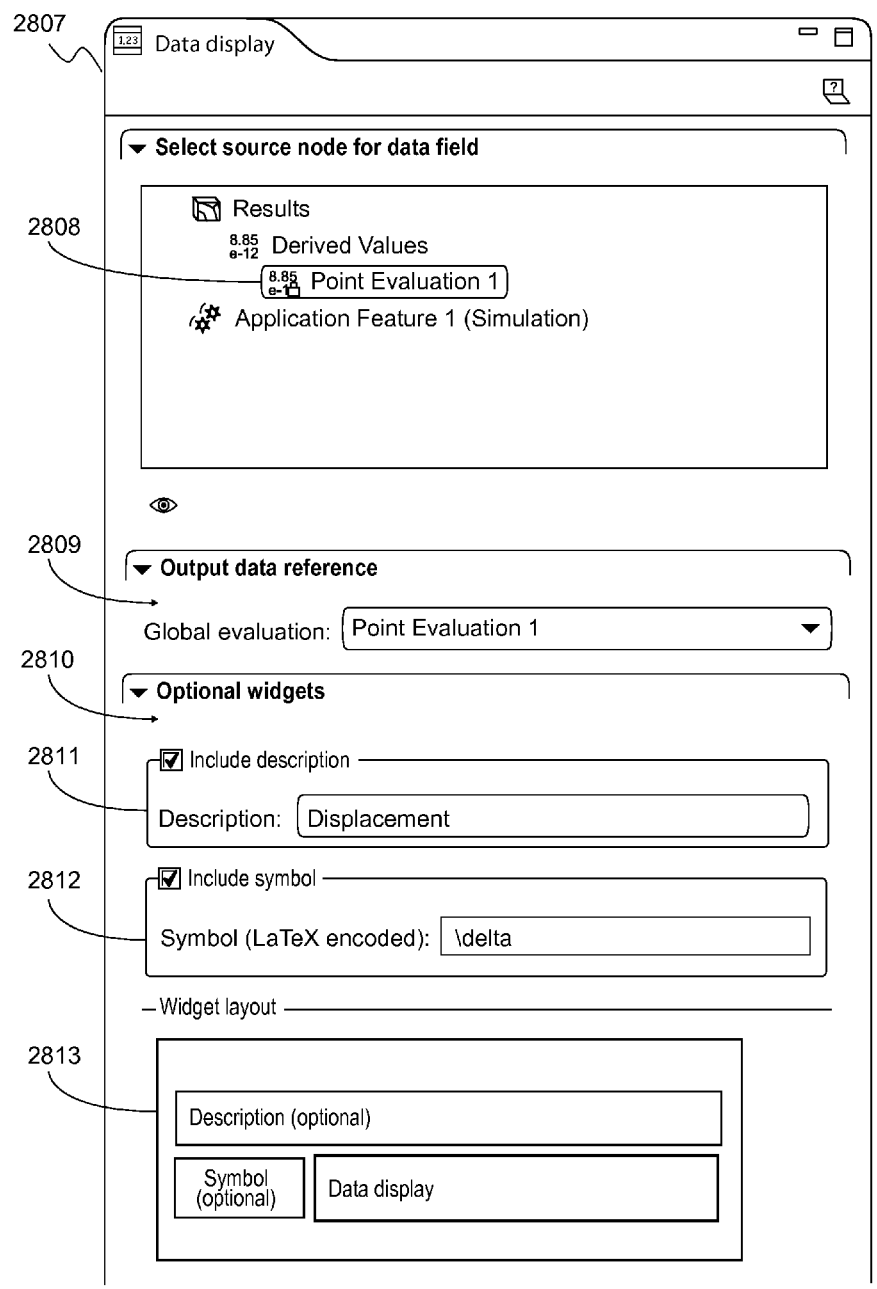
FIG. 28 illustrates an exemplary aspect of a settings window for a data display output form.

Referring now to FIG. 28, an exemplary settings window 2807 is illustrated for a data display form according to some aspects of a method for creating an application data structure. Such a settings window can include an output data field reference 2809 that points to data declared in an output declaration or data already defined in the embedded model at step 1650 from FIG. 16. For example, the data display form can refer to a point evaluation 2808 defined in the embedded model that displays the total displacement of a MEMS actuator. An optional widget section 2810 can offer a ready-made widget collection for the design of the data display form. Optional widgets can include description 2811 and symbol 2812. A widget layout preview 2813 can hint how the data display form may be displayed during execution of the application.

Figure 29:
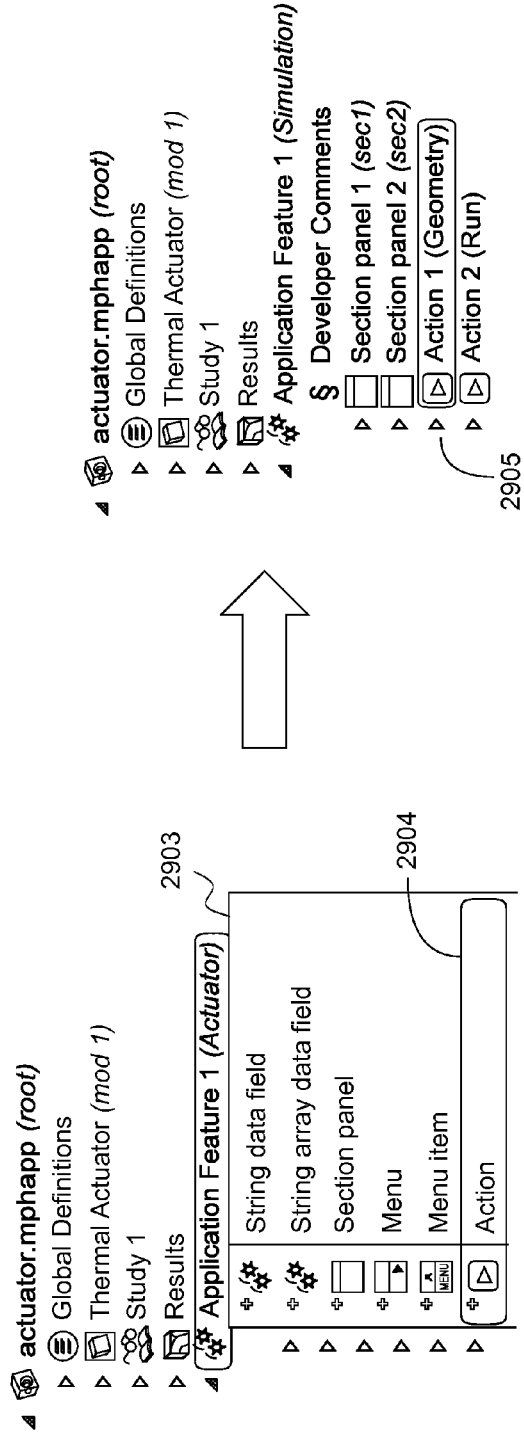
FIG. 29 illustrates an exemplary aspect of an application tree for adding an action feature to an application data structure.

Referring now to FIG. 29, an exemplary application tree according to some aspects is illustrated based on step 1690 from FIG. 16 for adding an action to an application data structure. Right-clicking or otherwise selecting an application feature node in the application tree can open a context menu 2903 for adding an action 2904. It is contemplated that such an action can be represented as a node in the application tree 2905. In some aspects, an action can refer to the execution of a sequence of operations in the embedded model.

Figure 30:
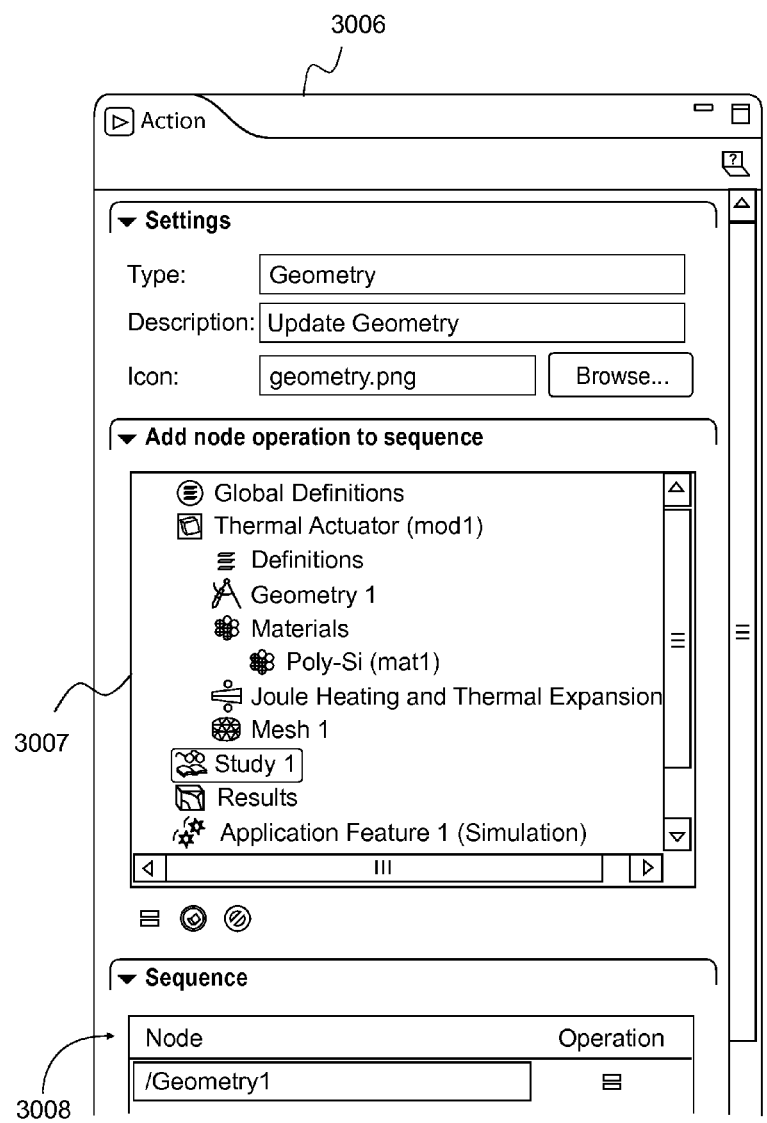
FIG. 30 illustrates an exemplary aspect of a settings window for an action feature.

Referring now to FIG. 30, an exemplary settings window 3006 for an action feature is illustrated according to some aspects of a method for creating an application data structure. It is contemplated that such a settings window can include a replica 3007 of an exemplary model tree in the embedded model where an action can be linked or associated with an operation in the embedded model. For example, the action feature can be linked or associated with the sequence of operations 3008 that generates the geometry for an actuator and the operation that executes the simulation in the embedded model for the total displacement of a MEMS actuator.

Referring now to FIG. 31, an exemplary application tree is illustrated according to some aspects of an exemplary alternative to 1640 from FIG. 16 for adding a menu form to an application data structure. Right-clicking or otherwise selecting an application feature node 3121 in the application tree can open a context menu for adding a menu form 3122 to an application feature. The menu form can be included as a menu item in the context menu that is displayed when selecting the application feature during execution of the application. The menu form can be linked to an action that may be executed when selecting the context menu item during execution of the application. An action can refer to the execution of a sequence of operations in the embedded model, for example an action linking to the exemplary geometry sequence 3008 from FIG. 30. It is contemplated that such a link to an action can be created by selecting an action in menu forms settings window.

It is contemplated that in some aspects of the present disclosure the terms link and associate may be used interchangeably and can generally refer to an association relationship between two elements or features as would be understood in computer modeling. In some aspects, link may further be understood to be an instantiation of an association relationship, such as when an application is executed on a modeling system.

Figure 32:
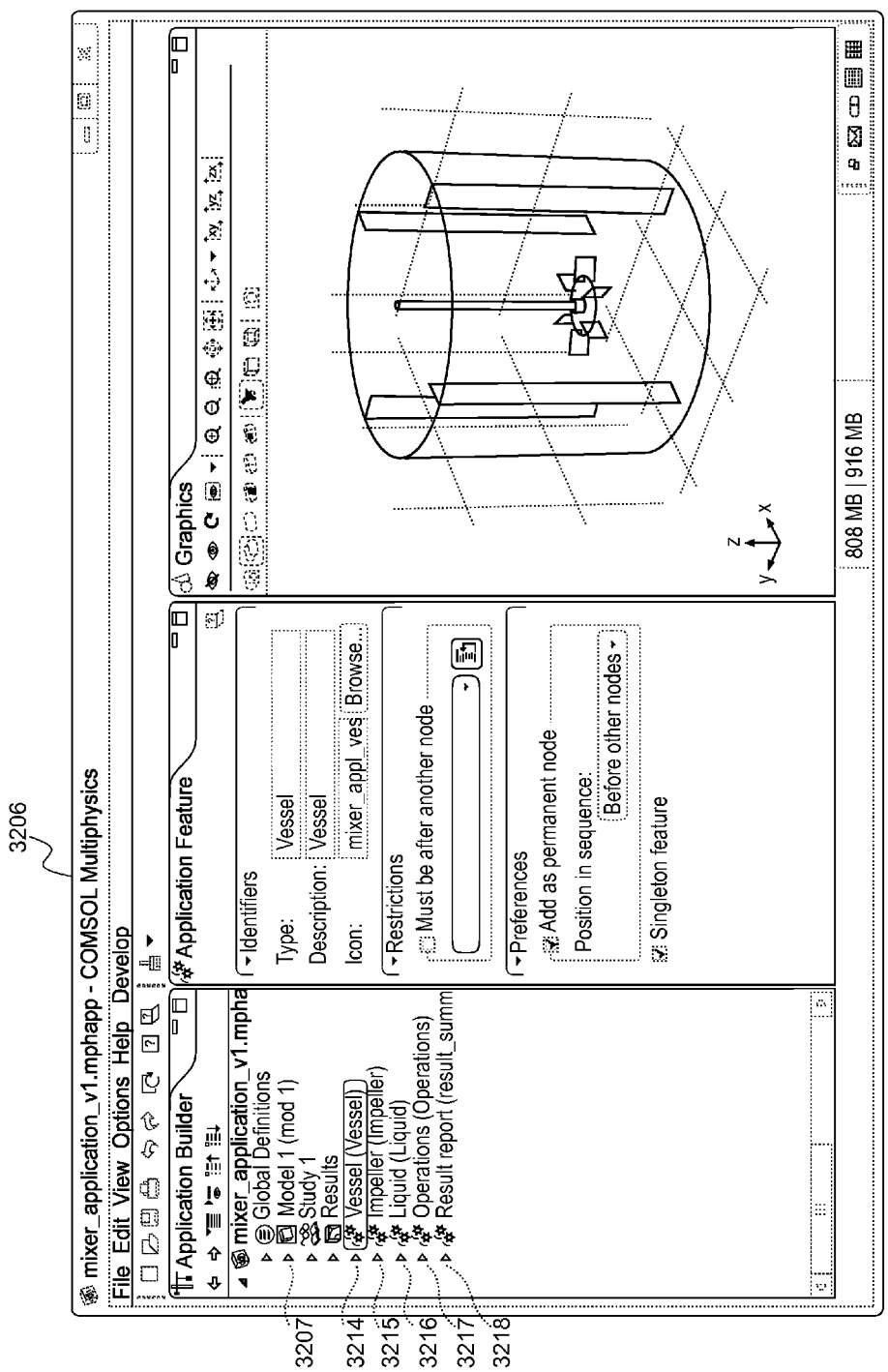
FIG. 32 illustrates an exemplary aspect of a graphical user interface in an application builder module for building a mixer application data structure.

Referring now to FIG. 32, an exemplary graphical user interface 3206 is illustrated according to some aspects of an application builder system or module for creating or forming a mixer application data structure. An exemplary application builder tree includes a representation of an embedded multiphysics model 3207 of a mixer and five exemplary application features that define the user interface of the resulting mixer application. A mixer application may contain an application feature for defining the vessel 3214 of a mixer, the impeller 3215, the type of liquid 3216, the operation of the mixer 3217, and the results from the simulation 3218.

The embedded multiphysics model can include definitions of the geometry, material properties, physics, mesh, solver, and results for a mixer model. The embedded mixer model can be applied to solve a fluid flow problem, using the laws for conservation of momentum and mass defined by physics interfaces in a multiphysics modeling system, for the modeled mixer including a rotating impeller. In addition, the multiphysics model can also define and be applied to solve the concentration field for one or several chemical species in the solution contained in the mixer.

Figure 33:
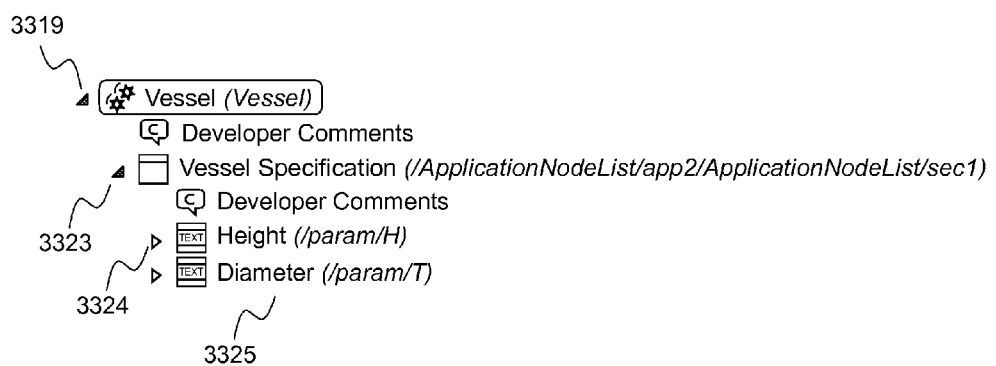
FIG. 33 illustrates an exemplary aspect of an application feature tree for a vessel application feature.

Referring now to FIG. 33, an exemplary application feature tree is illustrated according to some aspects for a vessel application feature 3319 that can be used to receive inputs for creating the vessel geometry in a mixer in a method for creating an application data structure. The application tree can represent the contribution of the vessel application feature to the application data structure for the mixer application. The vessel feature can define a node in the model tree with a corresponding settings window that is displayed during execution of the application. This settings window can include a vessel specification section panel 3323 including two text input forms; one for the height 3324 and one for the diameter 3325 of the vessel. These input forms can refer to parameters in the embedded multiphysics model that can be used in the embedded multiphysics model to parameterize the vessel geometry and change the height and diameter of the vessel depending on the inputs entered by a user during execution of the application.

Referring now to FIG. 34, an exemplary application feature tree is illustrated for the impeller application feature 3420 according to some aspects of creating an application data structure. It is contemplated that the impeller can be of different types, for example a six-blade Rushton, a three-blade pitched, or a four-blade pitched impeller. The impeller feature can therefore include an impeller type parameter or string declared by the impeller type input declaration feature 3405. The impeller type parameter can obtain its value from the impeller type combo box input form 3426. A valid value feature 3427, which can be a child feature to the combo box input form, may show the values that are selected from the combo box input form during the execution of the application.

It is contemplated that in some aspects, the value of the impeller type can be used as input to an if-statement feature in the geometry sequence in the embedded model. Such an if-statement can be applied to determine which of the impeller types provides a better design option, and thus, which of the impeller types should be built or prototyped. Each impeller type can in addition also receive parameter inputs, such as impeller diameter 3428 and clearance of the impeller from the bottom of the vessel 3429, from the impeller and vessel input forms. Some of these input forms can also include activation conditions 3402. For example, selecting a pitched impeller can display an edit field for entering a pitch angle for the impeller 3430. This text input form can then be displayed if the activation condition is activated by a user selecting a pitched impeller during the execution of the application.

Figure 35:
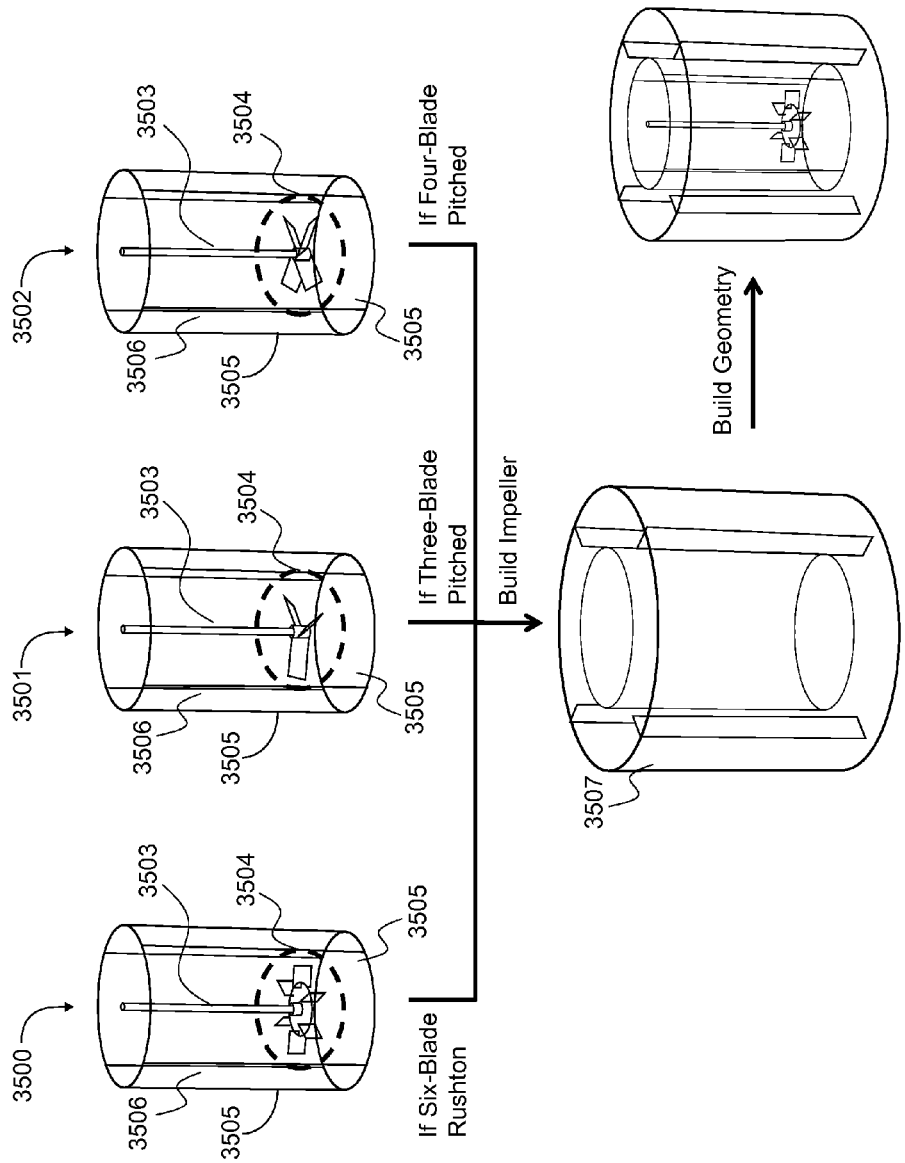
FIG. 35 illustrates an exemplary schematic description of the geometry and selection operations that may be implemented by a geometry subroutine.

Referring now to FIG. 35, an exemplary diagram with a schematic description of the geometry operations and selections that can be executed by a geometry subroutine based on the inputs from an impeller application feature are illustrated according to some aspects for creating an application data structure and executing the application. By applying an action feature in an application feature, a geometry subroutine can be called from a geometry sequence and such call can be represented as a node in the model tree, such as in a geometry branch, in the embedded model. A geometry subroutine can run a parameterized geometry sequence for the corresponding impeller type determined by the if-statement, including, for example, the previously described a six-blade Rushton 3500, a three-blade pitched 3501, or a four-blade pitched impeller 3502.

The output of the geometry subroutine can be the geometry of the impeller and a set of selections corresponding to the shaft surface 3503, impeller surface 3504, and also the surface 3505 between a domain corresponding to the impeller 3506 and the vessel domains 3507 as defined in the embedded model. Each set of these selections can be used to set the boundary conditions for the physics in the embedded model during execution of the application. For example, an impeller surface may be better implemented where a specific boundary condition for the flow equation is attributed to the rotation of the impeller. In addition, the interface of the cylinder surrounding the impeller can in one example be required to include a sliding mesh setting using for example an arbitrary Langrangian-Eulerian (ALE) method to simulate the rotation of the impeller.

Figure 36:
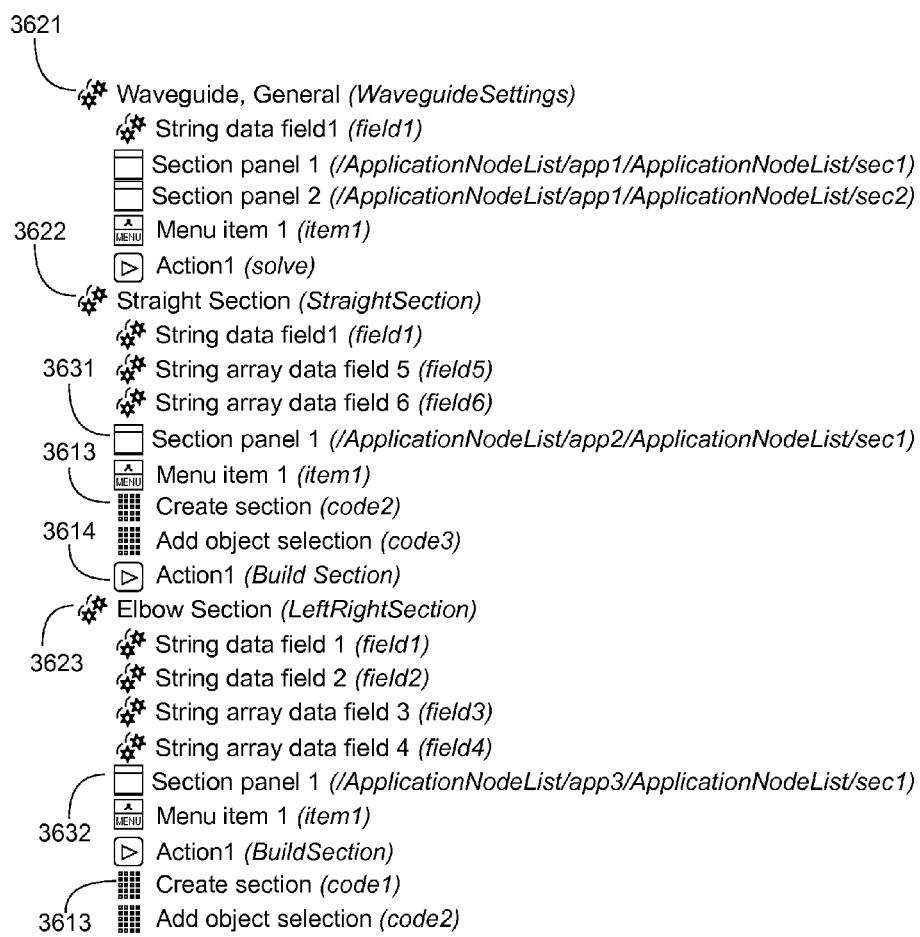

Referring now to FIG. 36, an exemplary application tree for a waveguide application is illustrated according to some aspects for creating an application data structure. The exemplary waveguide can include straight and elbow-shaped sections. A first application feature, the waveguide general feature 3621, can include form collections and actions for specification of the cross section of the waveguide; the operating conditions such as frequency; and the output specifications, such as real or imaginary (if complex) value, db (decibel), and S-parameter (Scattering parameter) in corresponding output forms are displayed during the execution of the application. A straight section application feature 3622 can include form collections and actions for specifying the length 3631 of the sections and an action to build such section 3614. The corresponding elbow section feature 3623 can include form collections and actions for specifying the direction of the bend and its radius 3632.

The straight section and the elbow section features for the exemplary waveguide application can also create the corresponding geometry features in the embedded model's multiphysics model data structure during the execution of the application with the action feature being applied, such as a create section feature 3613. Correspondingly, a geometry feature can also be removed from the embedded model's geometry sequence if a user chooses to remove during execution of the application. In addition, a second action, such as an add object selection feature 3615, can add the selection created by the added waveguide section as a contribution to a set of already defined cumulative selections in the embedded model, as described further below.

Figure 37:
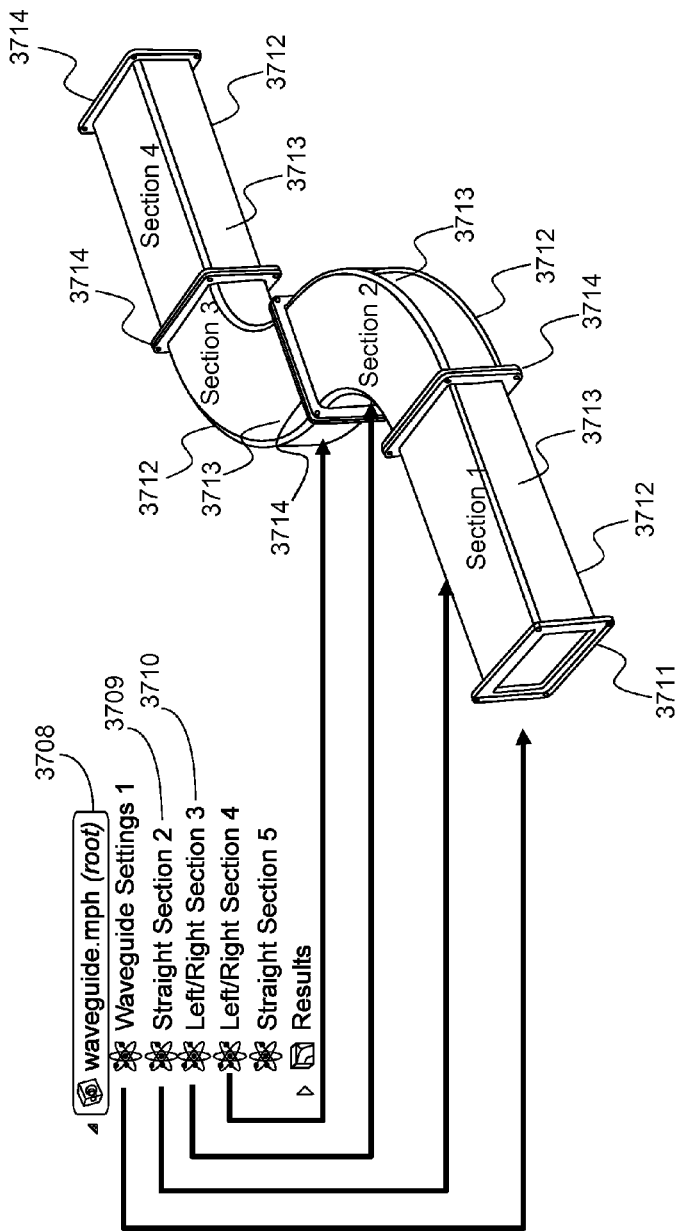
FIG. 37 illustrates an exemplary aspect of a model tree and a waveguide geometry created upon execution of a waveguide application.

Referring now to FIG. 37, an exemplary model tree and waveguide geometry are illustrated. The exemplary model tree and geometry were created by a waveguide application including geometry subroutines executed in a multiphysics modeling system according to some aspects of interpreting an application data structure. Adding a waveguide section can add a geometry feature to the embedded model, and the models corresponding multiphysics model data structure, during execution of the application. Geometry subroutines for each section can be called from the geometry sequence in the embedded model. It is contemplated that such geometry subroutines can receive parameters for the cross-section of the waveguide 3711 from the waveguide settings 3708. A straight section subroutine can receive the inputs for the length of the waveguide from a straight section feature 3709 while an elbow can receive the cross section direction, and radius of the section from a Left/Right section feature 3710. In addition, any of the straight or elbow section subroutines can also receive an index that reveals if there is a previous geometry subroutine call in the geometry sequence. The geometry subroutine can also receive a starting position for the respective waveguide section and, if there are previous sections, the end position for the previous section can be used as starting point for the next one.

The output from each geometry subroutine can be the geometry of the corresponding section and a set of selections for the walls 3712 and domain of the waveguide 3713. The output can also include an index that reveals the number of the current section in the waveguide (1 if it is the first section, 2 if it is the second section, etc) and the end position of a waveguide section 3714 to be used as the starting position of the next section. If there are several sections, each geometry subroutine can add its contribution to the domain and wall selections and by this create cumulative selections with contributions from each waveguide section.

Figure 38:
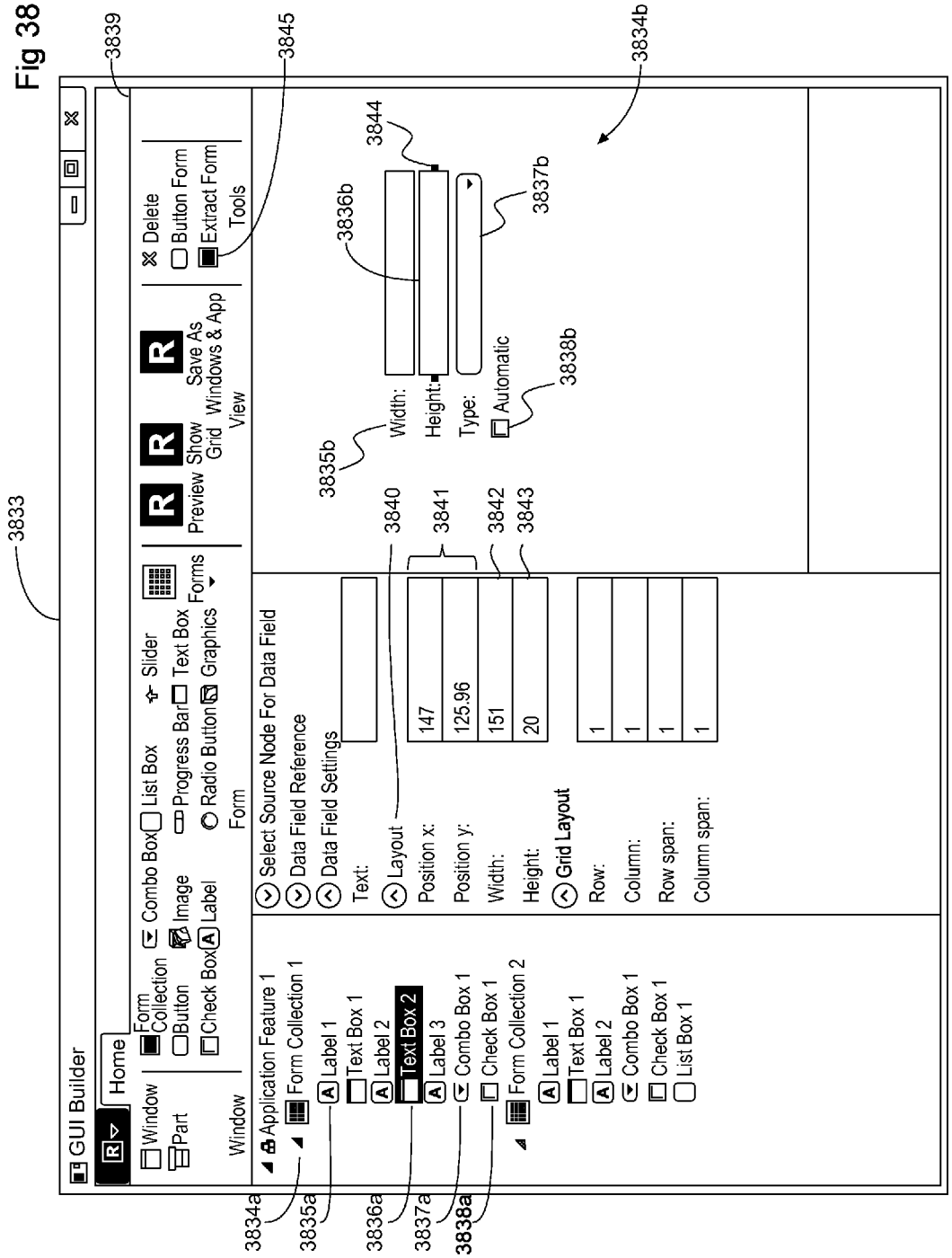
FIG. 38 illustrates an exemplary aspect of an application tree for a waveguide application.

Referring now to FIG. 38, an exemplary aspect of a graphical user interface 3833 in an application builder system or module for designing input forms, output forms, and form collections is illustrated according to some aspects for creating an application data structure. The exemplary graphical user interface 3833 can allow for interactive drawing and positioning of input forms, output forms, and for interactive design of form collections 3834a, 3834b and widget collections including labels 3835a, 3835b, text boxes 3836a, 3836b, combo boxes 3837a, 3837b, check boxes 3838a, 3838b, and other forms and widgets. Snapping may also assist the user of the tool in positioning the forms and widgets. A toolbar 3839 is also contemplated and can include buttons and controls for showing and adding nodes to the tree as an alternative to a context menu.

When a form or widget node is selected in the application tree, for example a text box 3836a, its layout may be shown in a graphics builder window allowing for positioning in the corresponding form or widget collection interactively. An additional layout section 3840 can also be displayed in the settings window for widget and form features. In this layout section, the values for the layout information can be set; for example, position 3841, width 3842, and height 3843 of a form or widget. These values can be updated automatically with interactive changes in the graphics builder window.

It is contemplated that relative positioning can be used for forms in creating an application data structure. For example, a first form or widget can be placed freely on a form collection while other forms and widgets are then typically placed relative to this for or widget with the aid of horizontal and vertical snapping. Furthermore, in some aspects vertical snapping and horizontal snapping can be mutually independent, and each form or widget can contribute with several vertical and horizontal snapping lines. All forms or widgets can contribute with a horizontal snapping line along their left edge. In addition, forms or widgets with a fixed width, such as buttons, combo boxes, and text boxes, can contribute with a horizontal snapping line also along their right edge.

It is contemplated that there may also be a row spacing that can be specified as a preference for the graphics builder window and the row spacing may typically have a default value. In some aspects, the default spacing is about 5 pixels. The row spacing can specify how much empty space there should be from the bottom of one form or widget to the top of the next. It can also be used to decide where to position the form or widget on the row immediately below an existing form or widget. This row spacing can contribute with vertical snapping lines above and below a form or widget, making it easy to start a new row of forms or widgets above or below existing widgets.

When a user of the application builder system moves and resizes widgets (e.g., resize handler 3844), the snapping may try to align the left edge of the widget with the left edge of other widgets or the right edge of the widget with the right edge of other widgets and similarly in the vertical direction. While moving or resizing a widget, vertical and/or horizontal snapping lines may be drawn in the graphics builder window when snapping occurs. The snapping hot zone may be about 6-7 pixels in each direction of the snapping line so even though snapping is on it is possible to place the form or widget freely by positioning it outside the hot zone of any snapping line.

It is contemplated that there can be a two-way synchronization between the selection in the application tree and in the graphics builder window. If a form or widget node is selected in the application tree 3836a, the corresponding form or widget may be selected in the graphics builder window 3836b and vice versa. Since multiple forms and widgets can be selected in the graphics builder window but only one set of settings for one form or widget are displayed in the settings window at a time, controls for changing width and height may also be available on the toolbar. When multiple forms or widgets are selected there may also be toolbar buttons for the following operations: aligning the left, right, top, bottom, or center of the selected forms or widgets; distributing the widgets with equal spacing horizontally or vertically; and giving the widgets equal width or height. It is also contemplated to change the text displayed on labels, check boxes, buttons, and so on by double-clicking on the form or widget in the graphics builder window and then just entering the new text inline within the form or widget. Copy and paste may also be available to be able to easily reuse form and widget configurations in another form collection.

The graphics builder window can also have automatic row and column creation. For example, at each unique left border of a form or widget a new column may start and at each unique top border a new row may start. Because of the snapping used when drawing the forms and widgets, rather few rows and columns need to be created. Based on the width and height of a form or widget it may also be allowed to span several rows and columns. If several forms or widgets in a column have the same width as the form or widget with the maximum width in the column, these forms and widgets may be set to fill the column. This may be useful for getting several text boxes and combo boxes in a column with a straight right edge. The automatically created rows and columns may also be individual elements in the graphics builder window that can be selected by entering a certain selection mode. A selected row may then be moved interactively up and down the other rows. For a selected column, a user of the application builder may then specify a fixed width or that the width should adapt to the width of the top level form if this is resized. There may also be tools such as insert row and delete row to easily make room for a new row or delete all forms or widgets in a row and compact the layout accordingly.

A form collection can include many forms and widgets and the grid layout may become fairly complex as new forms and widgets are added to the form collection. In such cases, it may be desirable to divide the form collection into several form collections with individual layout management and then place these as child form collections in the original form. In such cases, it may be possible to enclose a couple of forms and widgets in a form collection using a rectangle and then use an extract toolbar button 3845 to specify that those forms and widgets should be extracted to their own form collection.

Figure 39:
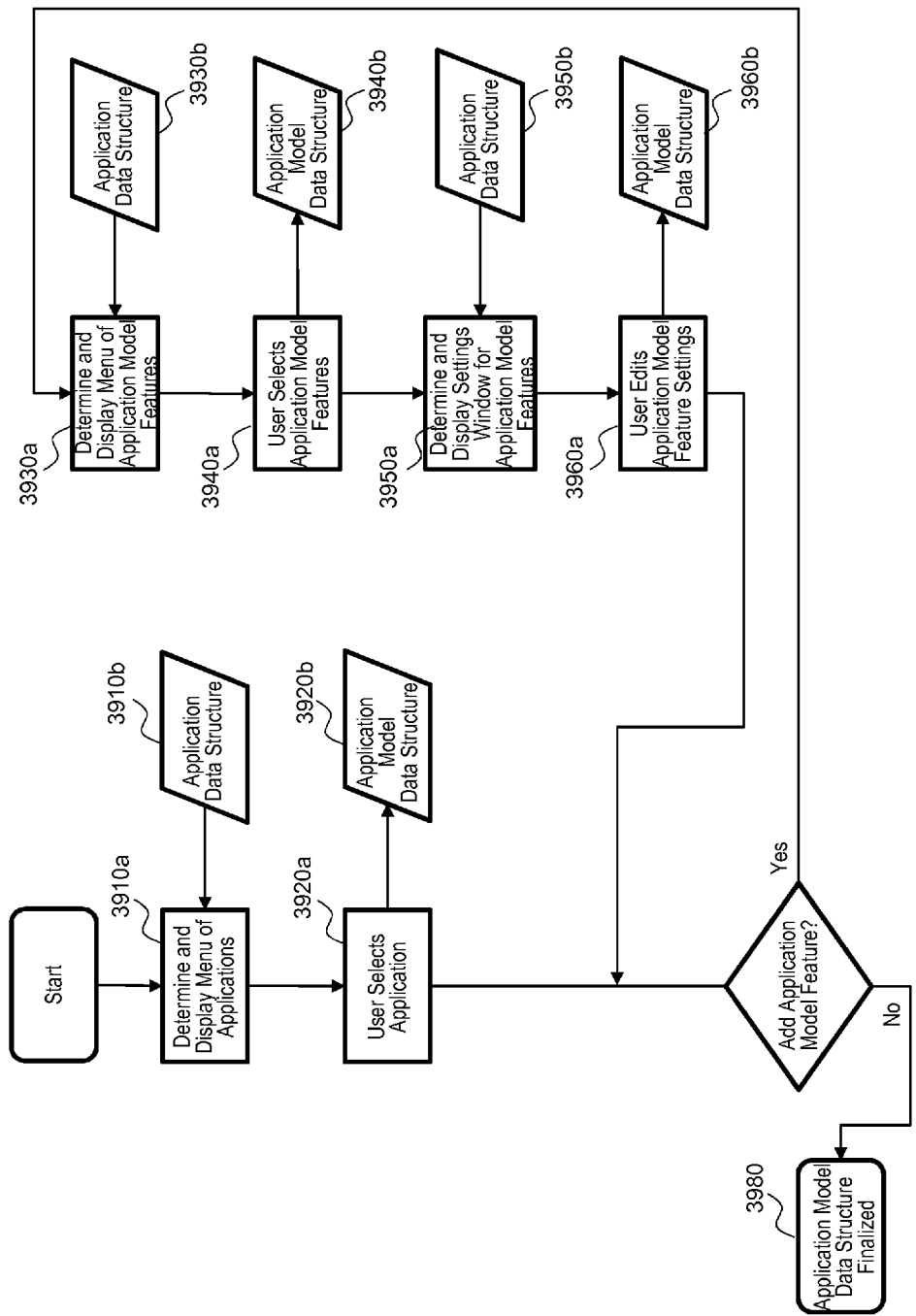
FIG. 39 illustrates an exemplary flowchart of method steps for interpreting an application data structure.

Referring now to FIG. 39, an exemplary flowchart is illustrated of a method according to some aspects of interpreting an application data structure for generating and maintaining an application model tree, context menu, and settings window in a multiphysics modeling system. The interpretation method can further be applied to generate an application model data structure based on settings specified by a user of a multiphysics modeling system. At step 3910*a*, a list of applications are determined and displayed from a set of available application data structures 3910*b*. Next, at step 3920*a*, a user can select an application from the displayed menu list, which then adds the application model to an application model data structure 3920*b*.

After a decision is made to add an application model feature, the process in FIG. 39 then proceeds to step 3930*a*, where an application model tree with a corresponding context menu that includes application model features can be determined and displayed (1500*a*) based on the definition of application features available in the application data structure 3930*b*. Next, at step 3940*a*, an application model feature can be selected by a user. This selection determines an application model feature to be used in later method steps and adds the application model feature to the application model data structure 3940*b*. Next, at step 3950*a*, a settings window for an application model feature can be determined and displayed using the definition of user inputs for the application features available in the application data structure 3950*b*. Then, at step 3960*a*, a user can edit the settings in the settings window for an application model feature. The default settings and the changed settings are then stored in the application model data structure 3960*b*. Then, if no more application model features are to be added, the application model data structure is finalized in step 3980.

Figure 40:
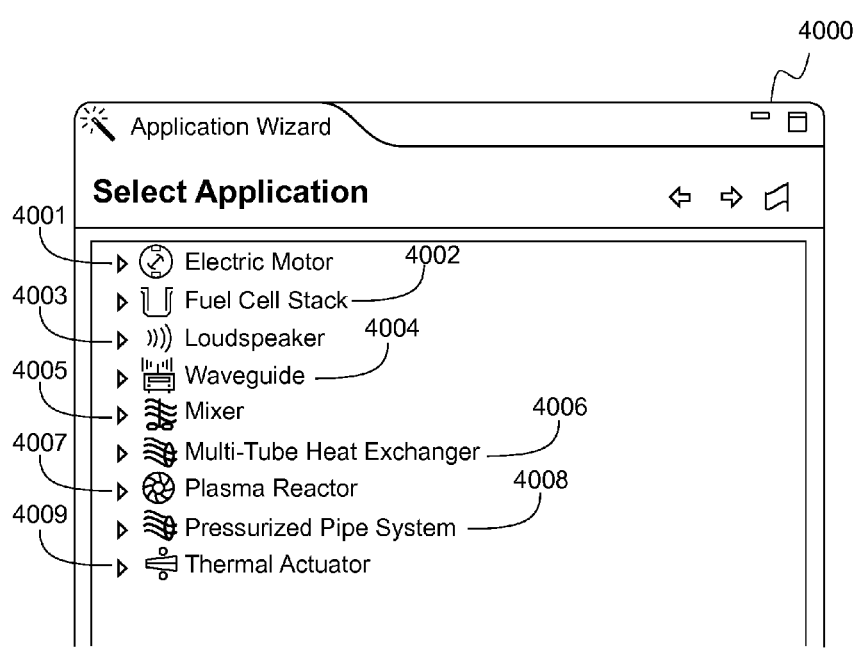
FIG. 40 illustrates an exemplary aspect of a selection window.

Referring now to FIG. 40, an exemplary selection window 4000 for displaying a menu of applications is illustrating according to some aspects for interpreting an application data structure. Selecting an application, such as a thermal actuator application 4009, creates a first version of an application model data structure. The application model data structure can be edited by a user of an application through the application user interface.

Different applications can cover modeling and simulations over a wide range of fields. An application can cover the modeling and simulation of a specific type of electric motor 4001, fuel cell stack 4002, loudspeaker 4003, waveguide 4004, mixer 4005 for fine chemicals and food industries, multi-tube heat exchanger 4006, plasma reactor 4007, and pressurized pipe systems 4008, which just names a few of many examples for which an application data structure and application model structure can be formed or created by applying the processes and using the systems disclosed herein.

Figure 41:
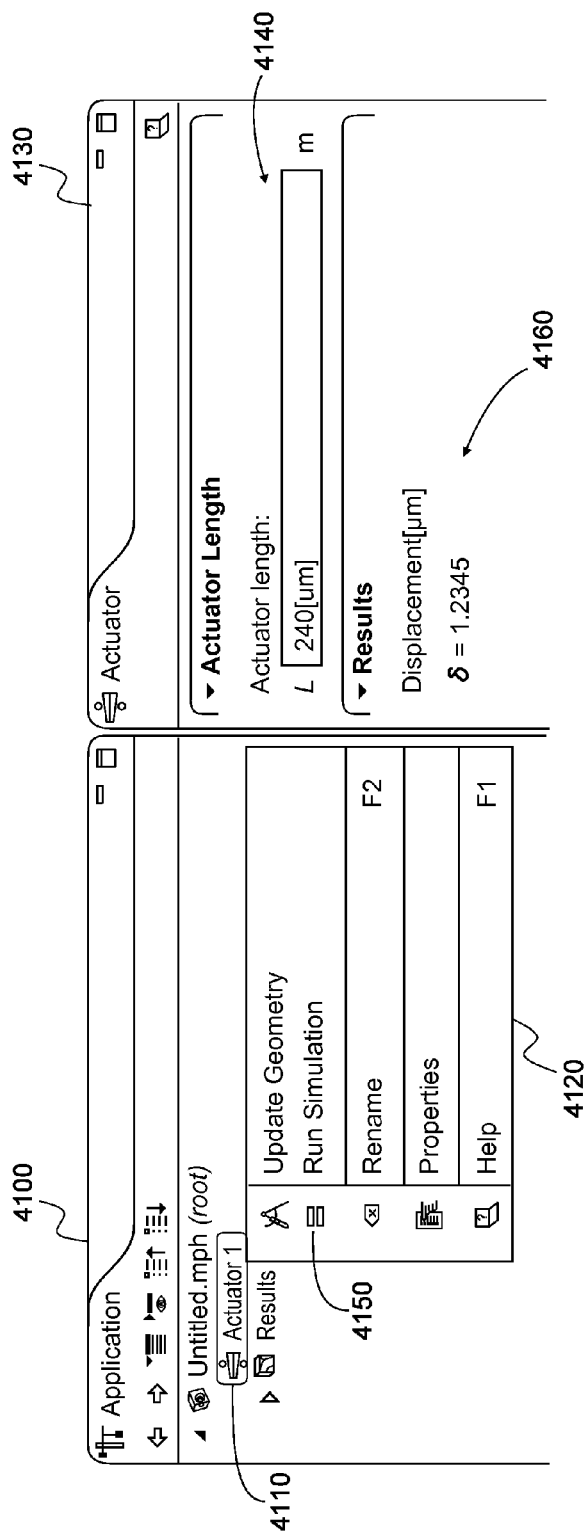
FIG. 41 illustrates an exemplary aspect of an application model tree window.

Referring now to FIG. 41, an exemplary application model tree window 4100 is illustrated including display menus of application model features, such as a thermal actuator feature 4110 in a thermal actuator application, with a corresponding context menu 4120 according to some aspects of interpreting an application data structure. Selecting the thermal actuator feature 4110 can display a settings window 4130 where a user of the application can edit the settings for the thermal actuator, such as its length 4140. Selecting a Run Simulation option 4150 in the context menu 4120 for the thermal actuator feature can create a final application model data structure, interpret the final model data structure in a multiphysics modeling system, and execute the simulation. It is contemplated that the application model data structure can be interpreted in a multiphysics modeling system to generate the simulation results. The simulation results can be displayed in an output form. For example, a result 4160 of the displacement of the thermal actuator can be displayed in the settings window 4130.

Figure 42:
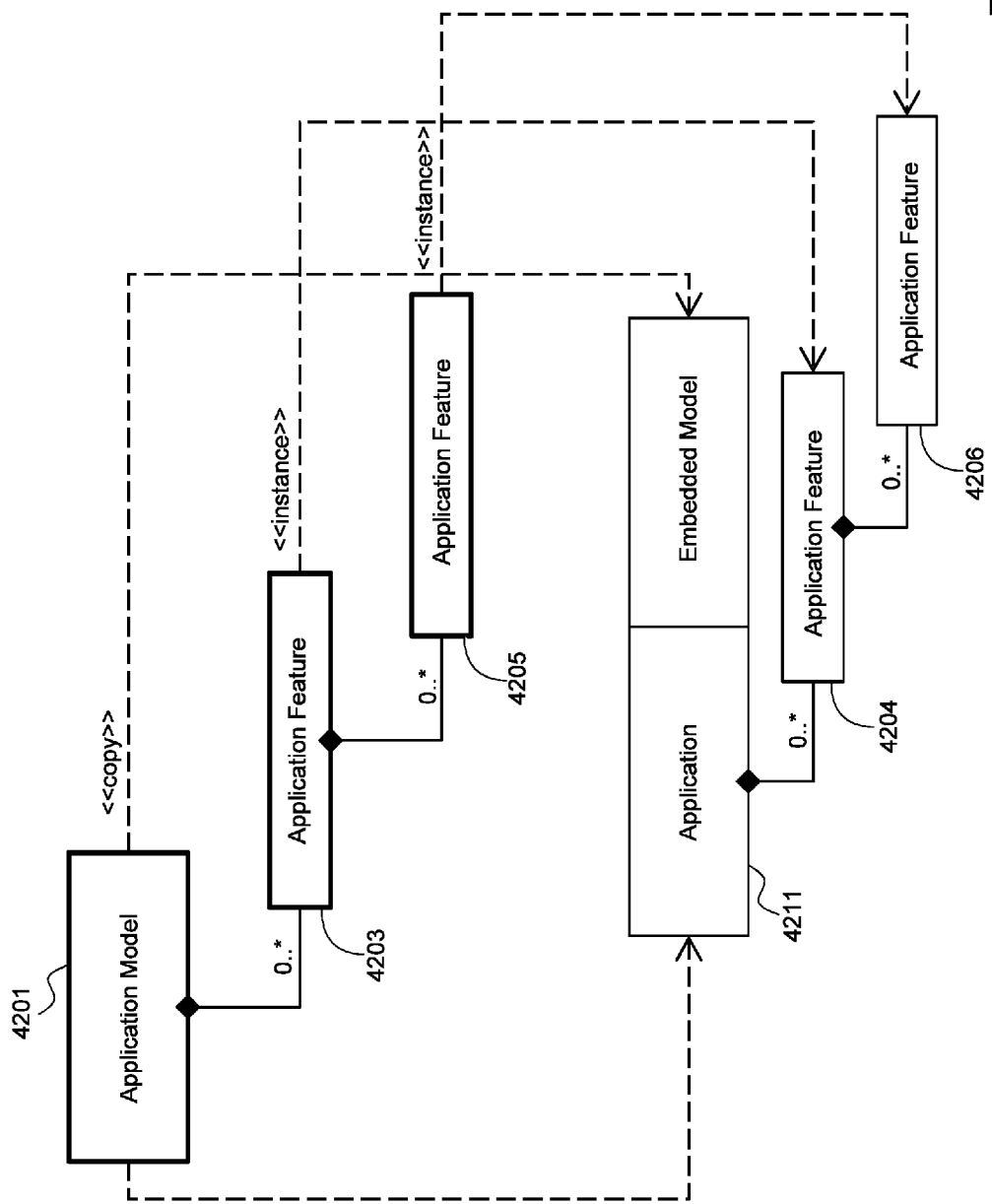
FIG. 42 illustrates an exemplary unified modeling language object diagram of instance level relationships between features of an application model data structure.

Referring now to FIG. 42, an exemplary unified modeling language (UML) object diagram is illustrated of instance level relationships between features according to some aspects of an application model data structure created by the method steps in FIG. 39. The application model data structure 4201 can include an entire multiphysics model data structure, on which the application is based, together with a reference to the application data structure 4211. In addition, the application model data structure can also include a hierarchy to represent the application model features added by the user 4203. Each node can include a reference to the application feature in the application data structure 4204. An application model feature can include other application model features as children 4205 if this is allowed by the application data structure 4206.

Referring now to FIG. 43, an exemplary flowchart of a method is illustrated according to some aspects for interpreting an application model data structure and generating a multiphysics model data structure that includes a model object. The method illustrated is for the steps prior to discretizing and solving the equations in a multiphysics modeling system. At step 4310*a*, an application model can be determined from an application model data structure 4310*b*. Next, at step 4320*b*, the application model data structure 4320*b* is loaded to the interpreter. Then, at step 4330, execution sequences from the application model data structure are processed. At steps 4301 and 4302, an execution sequence can be processed and executed. In addition, child execution sequences can also be processed at step 4303. When all execution sequences have been processed, a multiphysics model data structure may be generated at step 4340.

In some aspects, an apparatus for generating an application data structure includes a physical computing system comprising one or more processors, one or more user input devices, a display device, and one or more memory devices. At least one of the one or more memory devices includes executable instructions for generating an application data structure. The executable instructions cause at least one of the one or more processors to perform, upon execution, the acts of embedding a multiphysics model data structure for a physical system in an application data structure. The embedded multiphysics model data structure includes at least one modeling operation for the physical system. One or more application features are determined, via at least one of said one or more processors, to add to the application data structure. The one or more application features are associated with a model of the physical system. First data is added, via at least one of the one or more input devices, representing at least one form feature for at least one of the one or more application features for the model of the physical system. Second data is added, via at least one of the one or more input devices, representing at least one action feature for at least one of the one or more application features for the model of the physical system. The second data representing the at least one action feature is associated with the least one modeling operation for the physical system to define a sequence of operations for modeling the physical system. The application data structure is updated. The updated application data structure includes the added first data, the added second data, and the associating defining the sequence of operations. The updated application data structure is stored on at least one of the one or more memory devices.

In some aspects, a method executed in a computer system with one or more physical computing devices is configured to generate a modified application data structure to model a physical system. The method comprises the acts of embedding, via one or more physical computing devices, a multiphysics model data structure in an application data structure stored in one or more memory devices. The embedded multiphysics model data structure includes at least one multiphysics modeling operation for the physical system being modeled. One or more application features are determined, via at least one of the one or more physical computing devices, to add to the application data structure. The one or more application features are associated with the physical system. Application data is acquired, via at least one of the one or more physical computing devices, representing the one or more determined application features. The application data include form data representing at least one form feature and action data representing at least one action feature for modeling the physical system. A modified application data structure is formed including the acquired application data. The modified application data structure is stored on at least one of the one or more memory devices. The action data representing the at least one action feature is associated with the least one modeling operation for the physical system defined in the embedded multiphysics model data structure. The association between the action data and the at least one modeling operation defines a sequence of operations for modeling said physical system.

It is contemplated that the apparatus for generating an application data structure and the method for generating a modified application data structure to model a physical system that are described above can further include in some aspects one or more of the following features. Determining one or more application features can include one or more application feature selections received via one or more input devices associated with a graphical user interface displaying the application features. Acquiring of application data can include application data received via one or more input devices associated with a graphical user interface displaying options for the application features where the options include form features and action features. A defined sequence of operations can be configured to generate a geometry for the physical system. The forming of the modified or updated application data structure can further include the embedded multiphysics model data structure. The apparatus and method can further include outputting the modified or updated application structure as an input data structure configured to be received and executed in a multiphysics modeling system. The application data representing the one or more application features can further include declaration data defining input declarations for the physical system being modeled where the declaration data includes inputs of parameters to control settings for a physical component of the physical system of the model embedded in the multiphysics data structure.

It is further contemplated that the apparatus for generating an application data structure and the method for generating a modified application data structure to model a physical system that are described above can also include in some aspects one or more of the following additional features. The form data representing at least one form feature can include data defining an input form for collecting inputs of the parameters for the input declaration. The form data representing at least one form feature can further include additional data defining an activation condition for collecting the inputs of the parameters. The application data representing the one or more application features can include data defining an output declaration for declaring results to be displayed following implementation of a simulation of a model embedded in the multiphysics data structure. The form data representing the at least one form feature can include data defining an output form for displaying results declared in the output declaration. The form data representing the at least one form feature can further include additional data defining an activation condition for outputting the output form. The apparatus and method can also include the act of representing the modified or updated application data structure in an application tree.

In some aspects, a system generates a modified application data structure. The system comprises one or more physical memory devices, one or more display devices, one or more user input devices, and one or more processors configured to execute instructions stored on at least one of the one or more physical memory devices. The instructions cause at least one of the one or more processors to perform the acts comprising embedding, via one or more physical computing devices, a multiphysics model data structure in an application data structure stored in one or more memory devices. The embedded multiphysics model data structure includes at least one multiphysics modeling operation for the physical system being modeled. One or more application features are determined, via at least one of the one or more physical computing devices, to add to the application data structure. The one or more application features are associated with the physical system. Application data representing the one or more determined application features is acquired, via at least one of the one or more physical computing devices. The application data includes form data representing at least one form feature and action data representing at least one action feature for modeling the physical system. A modified application data structure is formed including the acquired application data. The modified application data structure is stored on at least one of the one or more memory devices. The action data representing the at least one action feature is associated with the least one modeling operation for the physical system defined in the embedded multiphysics model data structure. The association between the action data and the at least one modeling operation defines a sequence of operations for modeling the physical system.

It is contemplated that the system for generating a modified application data structure that is described above can further include in some aspects one or more of the following features. The acquiring of application data can include application data received via one or more input devices associated with a graphical user interface displaying options for the application features. The options can include form features and the action features. The defined sequence of operations can be configured to generate a geometry for the physical system. The system can also include performing the act of outputting the modified application structure as an input data structure configured to be received and executed in a multiphysics modeling system. The application data representing the one or more application features can further include declaration data defining input declarations for the physical system being modeled where the declaration data includes inputs of parameters to control settings for a physical component of the physical system of the model embedded in the multiphysics data structure.

In some aspects, a method executed in a computer system includes one or more processors configured to generate an application model data structure to model a physical system.

The method comprises the acts of determining, via one or more processors, a plurality of applications for modeling one or more physical systems. The plurality of applications are defined by application data stored in one or more application data structures. A list of the plurality of applications is displayed in one or more graphical user interfaces. A first input indicative of a selection of at least one of the plurality of applications is received. One or more application features are determined, via at least one of the one or more processors, for the selection of at least one of the plurality of applications. The one or more application features are represented as application data defined in and retrieved from at least one of the one or more application data structures. The determined application feature are displayed in at least one of the one or more graphical user interfaces. A second input indicative of a selection of at least one of the application features is received. One or more settings for the selection of at least one of the application features is determined via at least one of the one or more processors. The one or more settings are associated with parameters for the modeling of the one or more physical systems. Edit fields including at least one of the one or more settings are displayed via at least one of the one or more graphical user interfaces. At least one of the edit fields is selected. Edits to said one or more setting included in the selected at least one edit field are receiving via one or more user input devices. An application model data structure is generated, via at least one of said one or more processors, that includes the received edits to the at least one or more settings to the at least one or more application features retrieved from the one or more application data structures.

It is contemplated that the method for generating an application model data structure to model a physical system that is described above can further include in some aspects one or more of the following features. The method can further include the acts of determining, via at least one of said one or more processors, a sequence of actions defined in the generated application model data structures, and executing, via at least one of said one or more processors, the sequence of actions. The method can also include the act of calling a geometry subroutine as part of an action of executing a geometry sequence.

It is contemplated that the methods for generating an application data structure, a modified application data structure, or an application model data structure, or the systems for modifying an application data structure that are described above can further include one or more of the following exemplary features: (i) application features and application data for setting a frequency for a time harmonic electromagnetic field (input), running a simulation (action), and displaying the S-parameters (output) by executing a model defined in an embedded model; (ii) application features and application data for receiving an input for updating a reference pressure, running a simulation, and displaying the resulting wave propagation by executing an embedded model of an acoustics simulation; (iii) application features and application data for receiving an inlet flow rate, running a fluid flow simulation, and displaying an average flow rate at a pipe outlet from a fluid flow model for a tank defined in an embedded model; (iv) application features and application data for determining the size of a heat sink (activation condition, output) for keeping a temperature below a given input value (input), for a given input load (input), by executing a simulation (action) of a model of an electronic device defined in an embedded model; (v) application features and application data for receiving the values of a parameterized plasma reactor, updating the geometry (action, activation condition), and executing a simulation in order to determine a deposit thickness of semiconductor materials on a surface of a wafer, by executing a plasma reactor model defined in an embedded model.

Certain aspects of the present disclosure contemplate methods, systems, or apparatus based on any and all combinations of any two or more of the steps, acts, or features, individually or collectively, that are disclosed or referred to or otherwise indicated herein.

The exemplary aspects for generating an application data structure, for generating an application model data structure, for interpreting an application model data structure, and for generating a multiphysics model data structure presented in FIGS. 16-43 are merely examples and are understood to apply to broader applications and physic phenomena, not just the application phenomena described in more detail or illustrated in the figures. For example, it would be understood that many different applications data structures can be generated using the present disclosures. The illustrated aspects are merely examples of the broader operations that may be performed by an application builder system or module and a multiphysics modeling system. Furthermore, the illustrated interfaces are representative of a small number of interfaces that may be used in an application builder module and a multiphysics modeling system. Other types of graphical, user, or alternative input-type interfaces are contemplated.

Each of these aspects and obvious variations thereof is contemplated as falling within the spirit and scope of the claimed invention, which is set forth in the following claims. Moreover, the present concepts expressly include any and all combinations and subcombinations of the preceding elements and aspects.

What is claimed is:

1. An apparatus for generating an application data structure, the apparatus comprising:

a physical computing system comprising one or more processors, one or more user input devices, a display device, and one or more memory devices, at least one of the one or more memory devices including executable instructions for generating an application data structure, the executable instructions causing at least one of the one or more processors to perform, upon execution, the acts of:

embedding a multiphysics model data structure for a physical system in an application data structure, said embedded multiphysics model data structure including at least one modeling operation for said physical system;

determining, via at least one of said one or more processors, one or more application features to add to said application data structure, said one or more application features associated with a model of said physical system;

adding first data representing at least one form feature for at least one of said one or more application features for said model of said physical system, said first data based on user inputs received via at least one of said one or more input devices;

adding second data representing at least one action feature for at least one of said one or more application features for said model of said physical system, said second data based on user inputs received via at least one of said one or more input devices;

associating said second data representing said at least one action feature with said least one modeling operation for said physical system to define a sequence of operations for modeling said physical system; and updating said application data structure, said updated application data structure including said added first data, said added second data, and said associating defining said sequence of operations, said updated application data structure being stored on at least one of said one or more memory devices.

2. A method executed in a computer system with one or more physical computing devices configured to generate a modified application data structure to model a physical system, the method comprising the acts of:
embedding, via one or more physical computing devices, a multiphysics model data structure in an application data structure stored in one or more memory devices, said embedded multiphysics model data structure including at least one multiphysics modeling operation for said physical system being modeled;
determining, via at least one of said one or more physical computing devices, one or more application features to add to said application data structure, said one or more application features associated with said physical system;
acquiring, via at least one of said one or more physical computing devices, application data representing said one or more determined application features, said application data including form data representing at least one form feature and action data representing at least one action feature for modeling said physical system, said acquiring of application data including receiving said form data and said action data via user inputs to one or more user input devices associated with said one or more physical computing devices;
forming a modified application data structure including said acquired application data, said modified application data structure being stored on at least one of said one or more memory devices; and
associating said action data representing said at least one action feature with said least one modeling operation for said physical system defined in said embedded multiphysics model data structure, said association between said action data and said at least one modeling operation defining a sequence of operations for modeling said physical system.

3. The method of claim 2, wherein said determining of one or more application features includes one or more application feature selections received via one or more input devices associated with a graphical user interface displaying said application features.

4. The method of claim 2, wherein said one or more input devices are associated with a graphical user interface displaying options for said application features, said options including said form features and said action features.

5. The method of claim 2, wherein said defined sequence of operations is configured to generate geometry for said physical system.

6. The method of claim 2, wherein said forming of said modified application data structure further includes said embedded multiphysics model data structure.

7. The method of claim 2, further comprising the act of outputting said modified application data structure as an input data structure configured to be received and executed in a multiphysics modeling system.

8. The method of claim 2, wherein said application data representing said one or more application features further includes declaration data defining input declarations for said physical system being modeled, said declaration data including inputs of parameters to control settings for a physical component of said physical system of said model embedded in said multiphysics model data structure.

9. The method of claim 8, wherein said form data representing at least one form feature includes data defining an input form for collecting inputs of said parameters for said input declaration.

10. The method of claim 9, wherein said form data representing at least one form feature further includes additional data defining an activation condition for collecting said inputs of said parameters.

11. The method of claim 2, wherein said application data representing said one or more application features includes data defining an output declaration for declaring results to be displayed following implementation of a simulation of a model embedded in said multiphysics data structure.

12. The method of claim 11, wherein said form data representing said at least one form feature includes data defining an output form for displaying results declared in said output declaration.

13. The method of claim 12, wherein said form data representing said at least one form feature further includes additional data defining an activation condition for outputting said output form.

14. The method of claim 2, further comprising the act of representing said modified application data structure in an application tree.

15. The method of claim 2, wherein said application features include an input declaration, an output declaration, and an action feature for setting a frequency for a time harmonic electromagnetic field, executing a simulation, and displaying S-parameters.

16. The method of claim 2, wherein said embedded model data structure is for an acoustic simulation, and wherein said application features include an input declaration, an output declaration, and an action feature for receiving an input for updating a reference pressure, executing a simulation, and displaying a resulting wave propagation for an acoustic simulation.

17. The method of claim 2, wherein said embedded model data structure is for a fluid flow simulation in a tank, and wherein said application features including an input declaration, an output declaration, and an action feature for receiving an inlet flow rate, executing a fluid flow simulation, and displaying an average flow rate at a pipe outlet.

18. The method of claim 2, wherein said embedded model data structure is for an electronic device, and wherein said application features include an input declaration, an output declaration, a form feature, an activation condition, and an action feature for determining a size of a heat sink and for maintaining a temperature below a given input value at a given input load.

19. The method of claim 2, wherein said application features include an input declaration, an output declaration, a form feature, an activation condition, and an action feature for receiving values of a parameterized plasma reactor, updating a geometry, and executing a simulation for determining a deposit thickness of semiconductor materials on a surface of a wafer.

20. A system for generating a modified application data structure to model a physical system, the system comprising:
one or more physical memory devices;
one or more display devices;
one or more user input devices; and
one or more processors configured to execute instructions stored on at least one of said one or more physical memory devices, said instructions causing at least one of said one or more processors to perform acts comprising:
embedding a multiphysics model data structure in an application data structure stored in at least one of said one or more physical memory devices, said embedded multiphysics model data structure including at least one multiphysics modeling operation for said physical system being modeled;

determining one or more application features to add to said application data structure, said one or more application features associated with said physical system;

acquiring application data representing said one or more determined application features, said application data including form data representing at least one form feature and action data representing at least one action feature for modeling said physical system, said acquiring of application data including receiving said form data and said action data via user inputs to at least one of said one or more user input devices;

forming a modified application data structure including said acquired application data, said modified application data structure being stored on at least one of said one or more physical memory devices; and associating said action data representing said at least one action feature with said least one modeling operation for said physical system defined in said embedded multiphysics model data structure, said association between said action data and said at least one modeling operation defining a sequence of operations for modeling said physical system.

21. The system of claim 20, wherein said one or more input devices are associated with a graphical user interface displaying options for said application features, said options including said form features and said action features.

22. The system of claim 20, wherein said defined sequence of operations is configured to generate geometry for said physical system.

23. The system of claim 20, wherein said instructions cause at least one of said one or more processors to further perform the act of outputting said modified application data structure as an input data structure configured to be received and executed in a multiphysics modeling system.

24. The system of claim 20, wherein said application data representing said one or more application features further includes declaration data defining input declarations for said physical system being modeled, said declaration data including inputs of parameters to control settings for a physical component of said physical system of said model embedded in said multiphysics data structure.

25. A method executed in a computer system including one or more processors configured to generate an application model data structure to model a physical system, the method comprising the acts of:

determining, via one or more processors, a plurality of applications for modeling one or more physical systems, said plurality of applications defined by application data stored in one or more application data structures;

displaying in one or more graphical user interfaces a list of said plurality of applications;

receiving, via one or more input devices, a first input indicative of a selection of at least one of said plurality of applications;

determining, via at least one of said one or more processors, one or more application features for said selection of at least one of said plurality of applications, said one or more application features represented as application data defined in and retrieved from at least one of said one or more application data structures;

displaying in at least one of said one or more graphical user interfaces said determined application features;

receiving, via at least one of said one or more input devices, a second input indicative of a selection of at least one of said application features;

determining, via at least one of said one or more processors, one or more settings for said selection of at least one of said application features, said one or more settings including associated parameters for said modeling of said one or more physical systems;

displaying, via at least one of said one or more graphical user interfaces, edit fields including at least one of said one or more settings;

receiving, via at least one of said one or more input devices, user inputs indicative of a selection of at least one of said edit fields;

receiving, via at least one of said one or more user input devices, user inputs indicative of edits to said one or more settings included in said selection of at least one edit field;

generating, via at least one of said one or more processors, an application model data structure that includes said received edits to said at least one or more settings to said at least one or more application features retrieved from said one or more application data structures;

determining, via at least one of said one or more processors, a sequence of actions defined in said generated application model data structure; and executing, via at least one of said one or more processors, said sequence of actions.

26. The method of claim 25, further comprising the act of calling a geometry subroutine as part of an action of executing a geometry sequence.

* * * * *